(12) United States Patent
Rotay

(10) Patent No.: US 8,853,843 B2
(45) Date of Patent: *Oct. 7, 2014

(54) MODULAR LOW STRESS PACKAGE TECHNOLOGY

(75) Inventor: Craig J. Rotay, Audubon, PA (US)

(73) Assignee: STMicroelectronics, Inc., Coppell, TX (US)

(*) Notice: Subject to any disclaimer, the term of this patent is extended or adjusted under 35 U.S.C. 154(b) by 305 days.

This patent is subject to a terminal disclaimer.

(21) Appl. No.: 13/406,681

(22) Filed: Feb. 28, 2012

(65) Prior Publication Data

US 2012/0153391 A1    Jun. 21, 2012

Related U.S. Application Data

(63) Continuation-in-part of application No. 12/903,752, filed on Oct. 13, 2010.

(60) Provisional application No. 61/251,460, filed on Oct. 14, 2009.

(51) Int. Cl.

| H01L 27/00 | (2006.01) |
|---|---|
| H01L 23/32 | (2006.01) |
| H01L 25/11 | (2006.01) |
| H01L 23/00 | (2006.01) |
| H01L 23/66 | (2006.01) |

(52) U.S. Cl.
CPC .......... *H01L 25/115* (2013.01); *H01L 23/32* (2013.01); *H01L 2924/09701* (2013.01); *H01L 2223/6644* (2013.01); *H01L 2924/0002* (2013.01); *H01L 23/66* (2013.01); *H01L 23/562* (2013.01)
USPC ......................................... 257/678; 257/343

(58) Field of Classification Search
USPC .................................................. 257/343, 678
See application file for complete search history.

(56) References Cited

U.S. PATENT DOCUMENTS

| 4,441,119 A | 4/1984 | Link |
|---|---|---|
| 4,823,952 A | 4/1989 | Fletcher et al. |
| 4,866,507 A | 9/1989 | Jacobs et al. |
| 5,307,240 A | 4/1994 | McMahon |
| 5,341,563 A | 8/1994 | Kamakura et al. |
| 5,648,893 A | 7/1997 | Loo et al. |
| 6,136,128 A | 10/2000 | Chung |
| 6,191,480 B1 | 2/2001 | Kastberg et al. |
| 6,569,710 B1 | 5/2003 | Pierson |
| 7,053,299 B2 | 5/2006 | Zimmerman |
| 7,087,465 B2 | 8/2006 | Collins, III |
| 7,160,798 B2 | 1/2007 | Gautham et al. |
| 7,838,987 B2 | 11/2010 | So |
| 7,957,148 B1 | 6/2011 | Gallarelli et al. |
| 8,028,397 B2 | 10/2011 | Bultitude |
| 8,153,474 B2 | 4/2012 | Rotay et al. |
| 8,258,622 B2 | 9/2012 | Lee et al. |
| 2006/0232938 A1 | 10/2006 | Yeh |
| 2006/0255455 A1 | 11/2006 | Rotay |
| 2007/0139893 A1 | 6/2007 | Sun |
| 2011/0084376 A1 | 4/2011 | Rotay et al. |

(Continued)

*Primary Examiner* — Howard Weiss
*Assistant Examiner* — Tifney Skyles
(74) *Attorney, Agent, or Firm* — Gardere Wynne Sewell LLP

(57) ABSTRACT

A semiconductor subassembly, a modular sidewall element having modular dimensions that accommodates placement of the semiconductor subassembly in a modular layout and a semiconductor substrate base element coupled to the modular sidewall element. The semiconductor substrate base element has at least one semiconductor element with a layout sized to be accommodated by modular dimensions of the modular sidewall element and the semiconductor substrate base element configured to form a base of the semiconductor subassembly.

29 Claims, 45 Drawing Sheets

(56) References Cited

U.S. PATENT DOCUMENTS

| | | |
|---|---|---|
| 2011/0086469 A1 | 4/2011 | Rotay et al. |
| 2011/0087353 A1 | 4/2011 | Rotay |
| 2012/0098116 A1 | 4/2012 | Casey et al. |

PARTS IN CLOSED
POSITION ISO VIEW

PLATES AND ASSEMBLY
EXPLODED VIEW

PLATES IN CLOSED POSITION SIDE VIEW

TOP PLATE: HOLDS PACKAGE LID/PROTECTIVE COVER

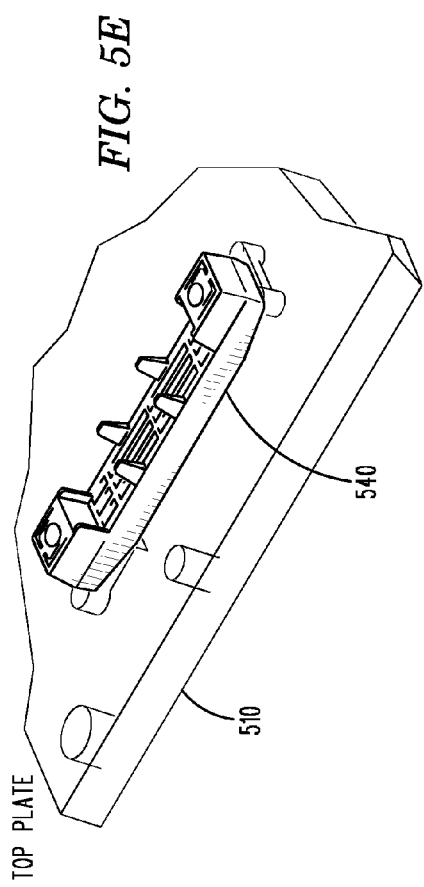
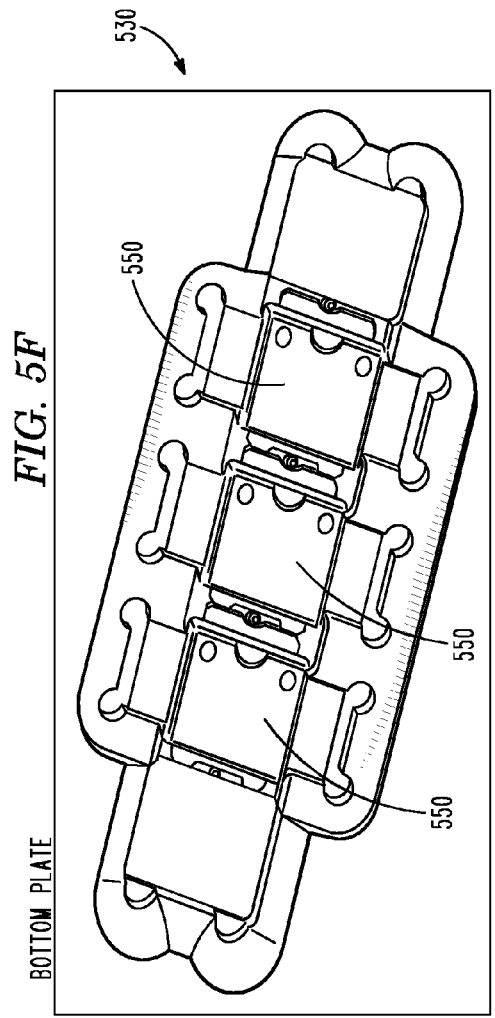

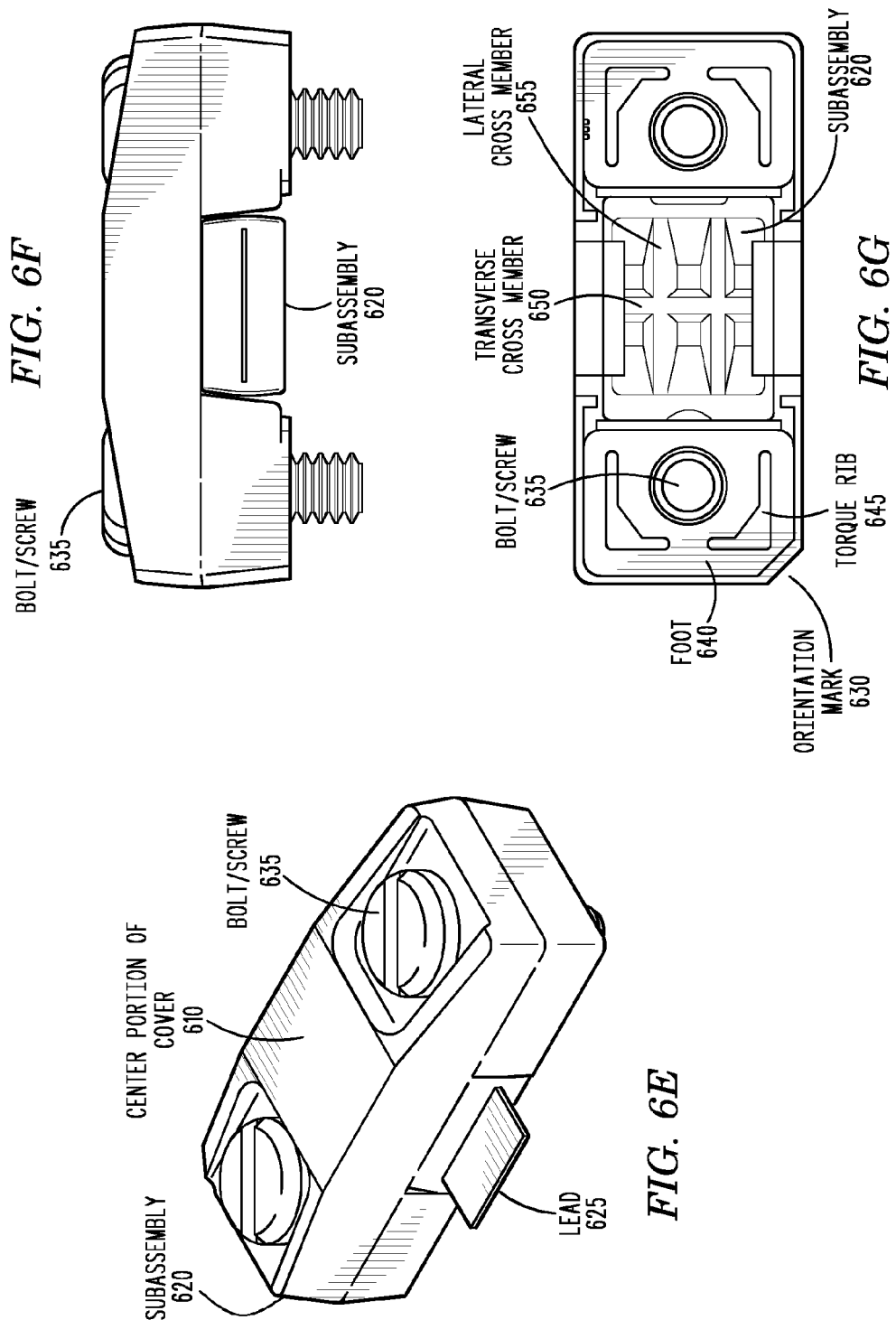

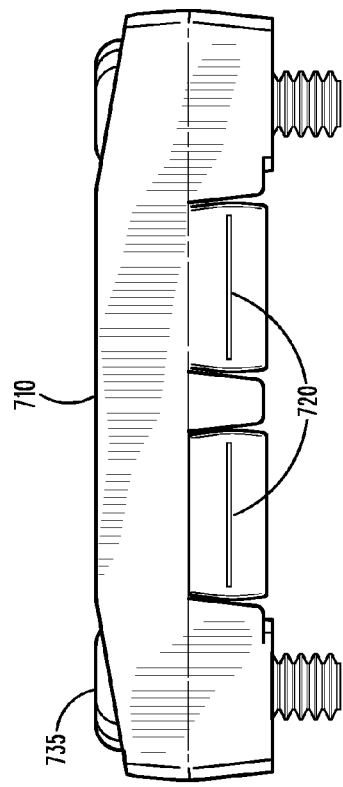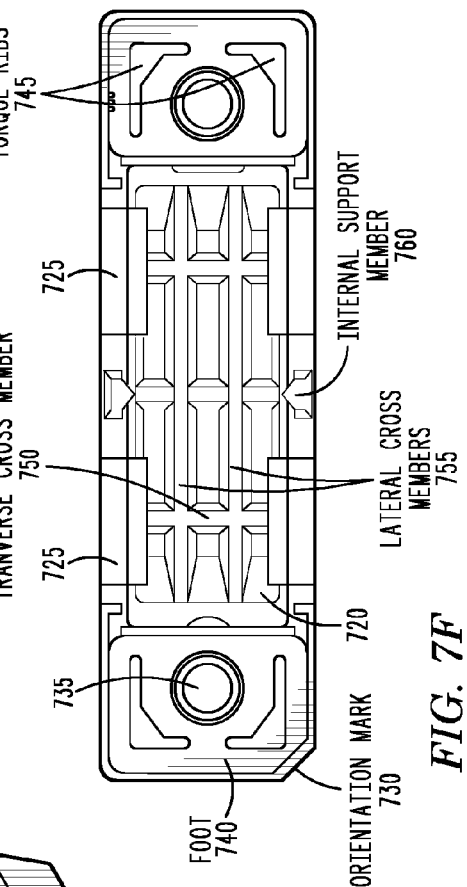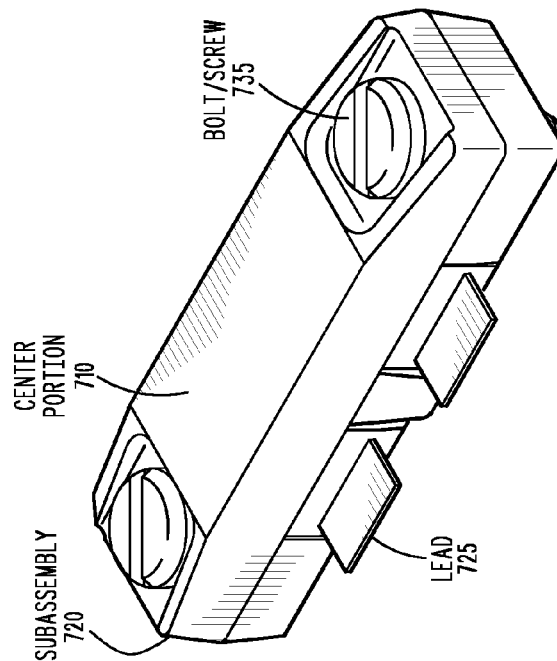

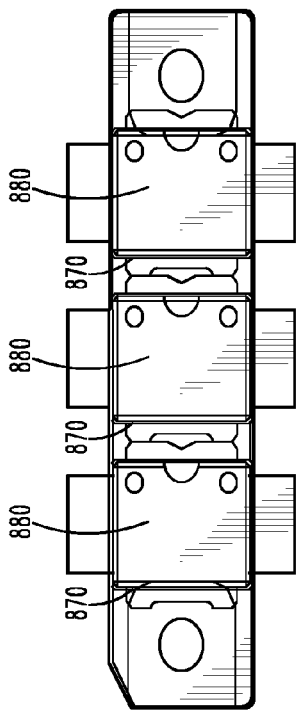
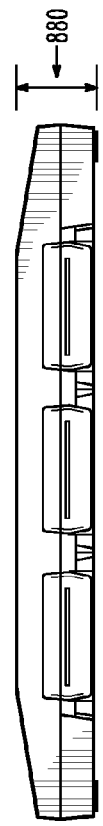
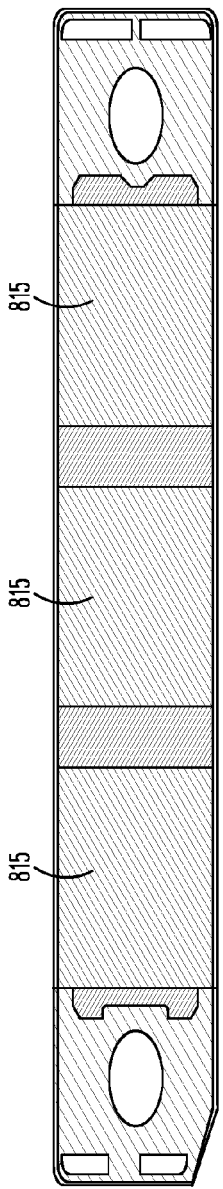
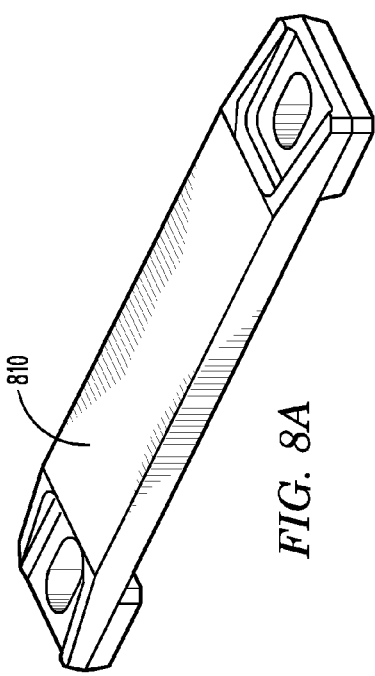
FIG. 8B
FIG. 8C
FIG. 8D
FIG. 8A

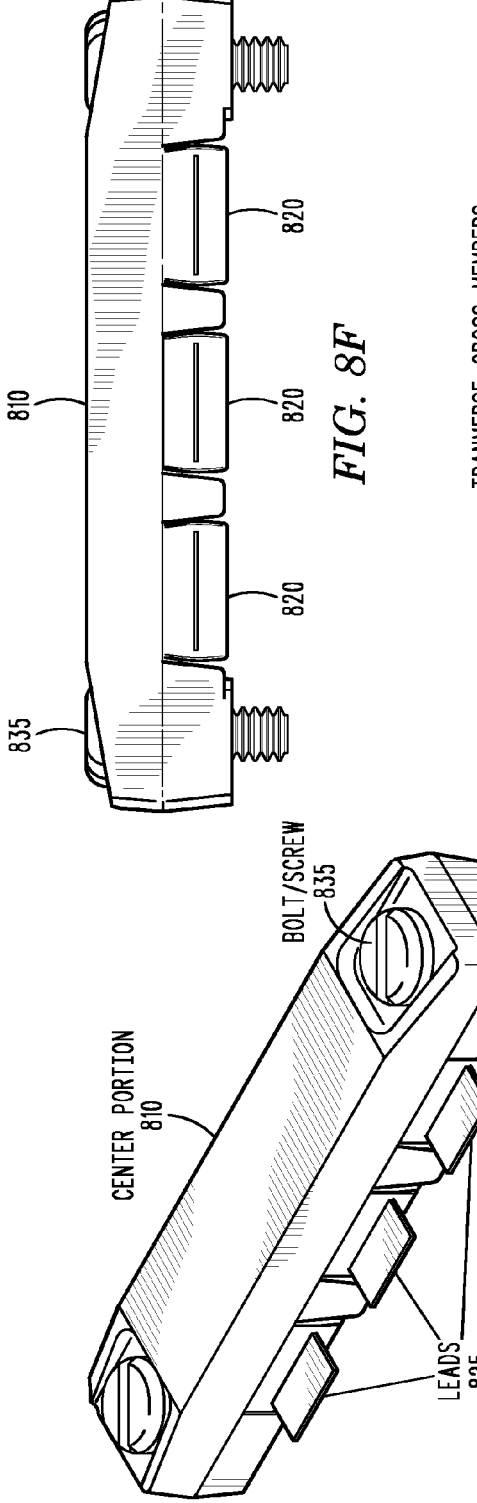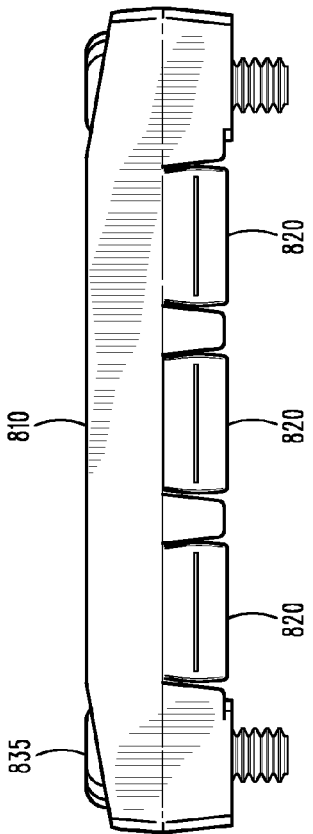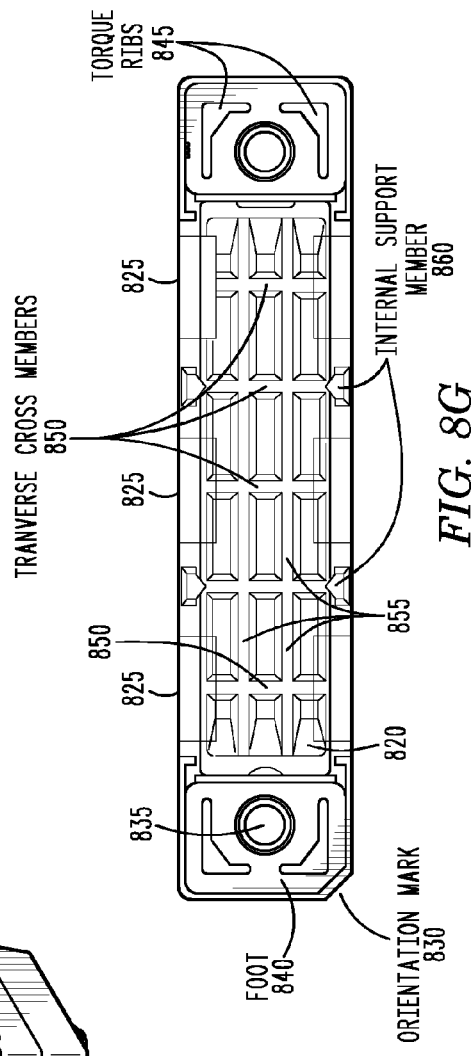

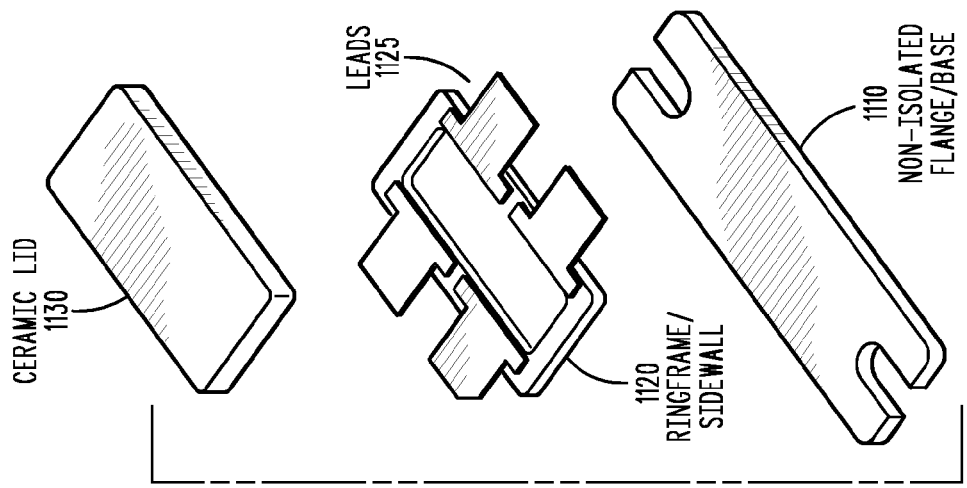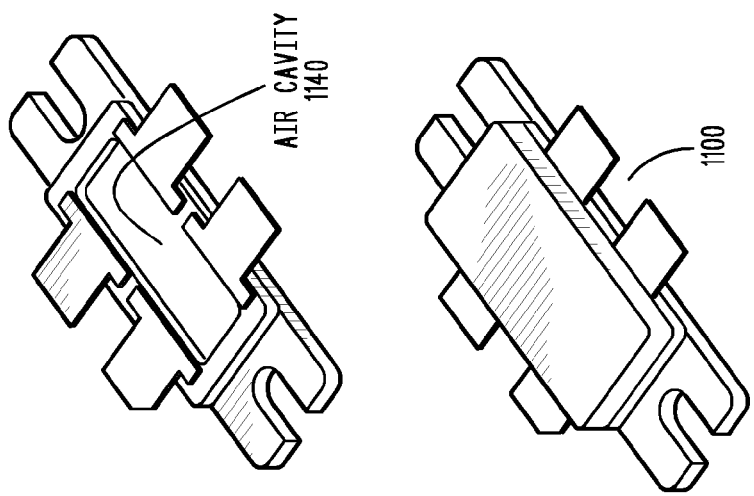
FIG. 11 —PRIOR ART—

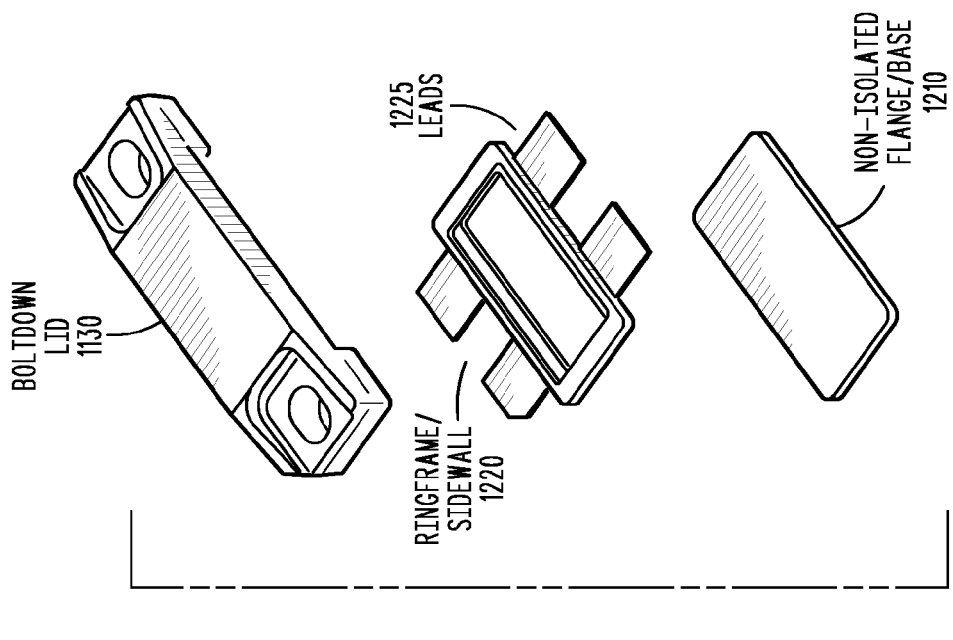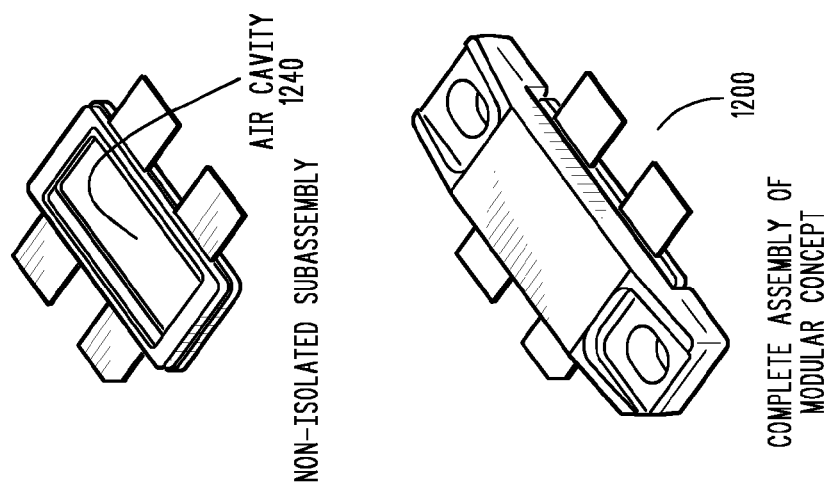
FIG. 12A

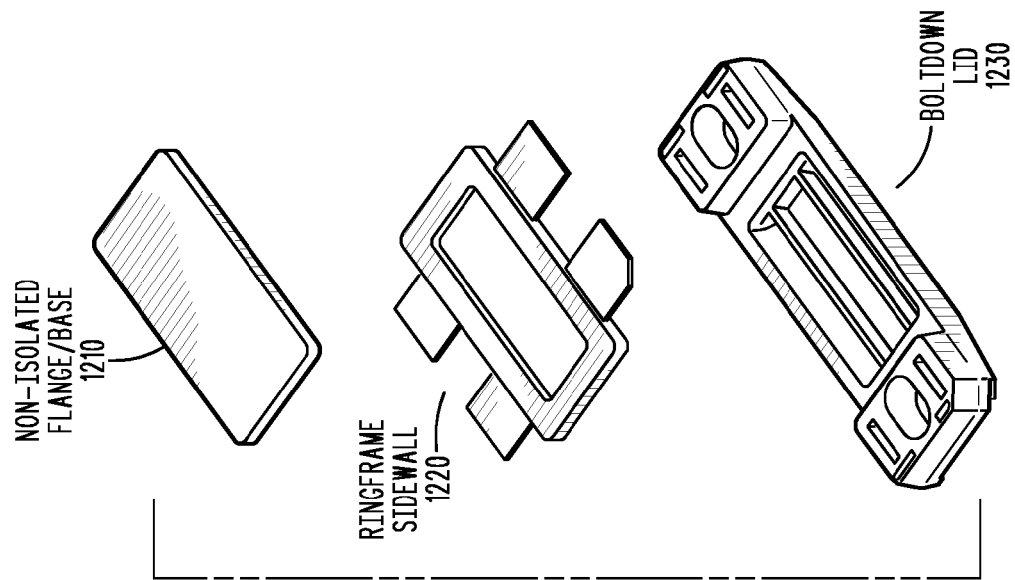
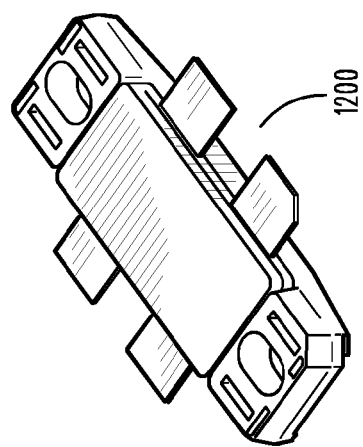
FIG. 12B

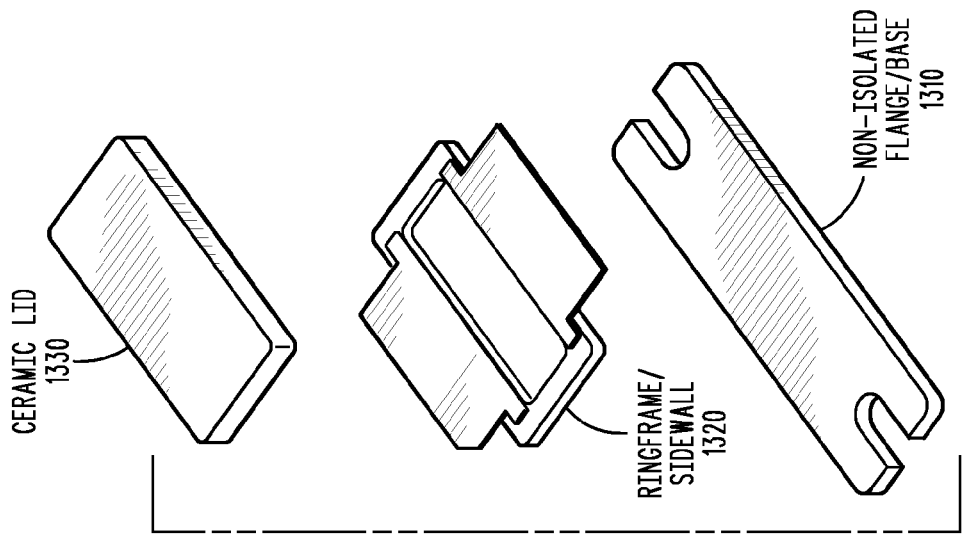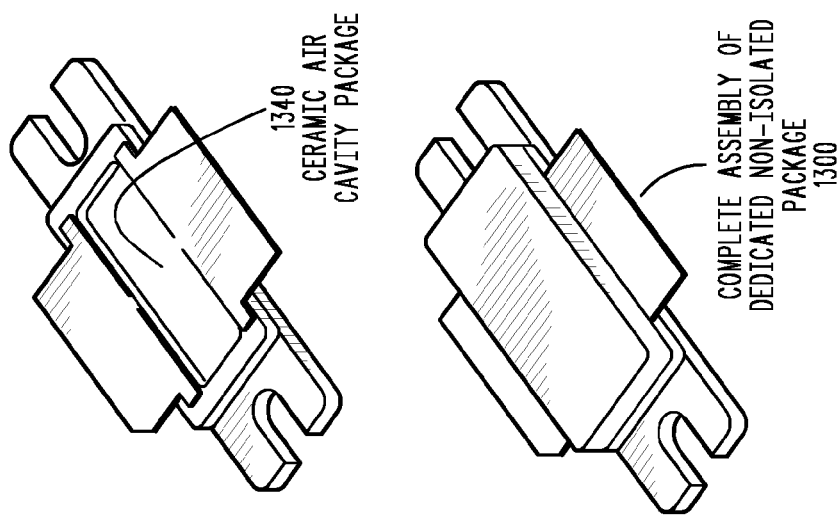
FIG. 13
—PRIOR ART—

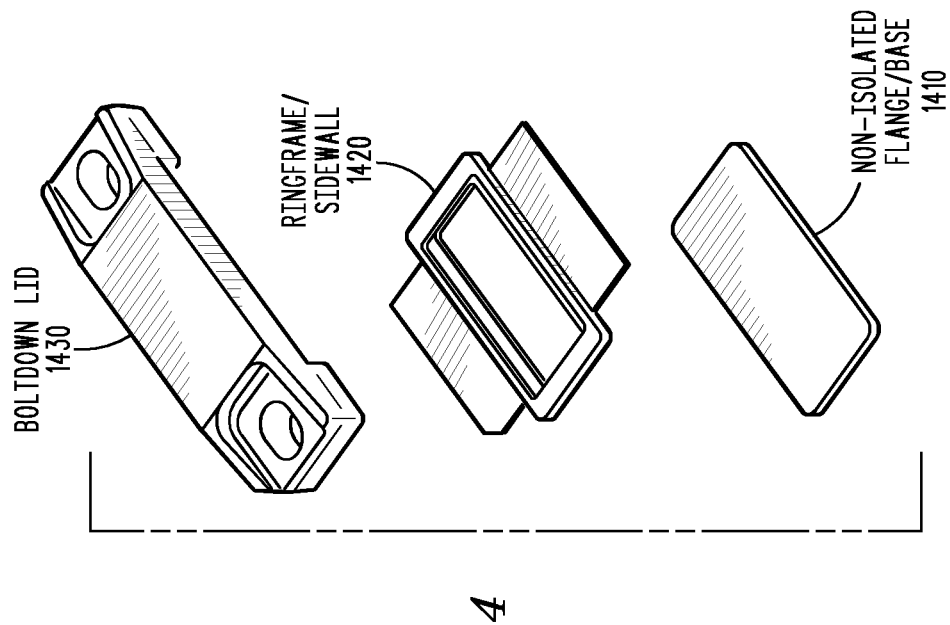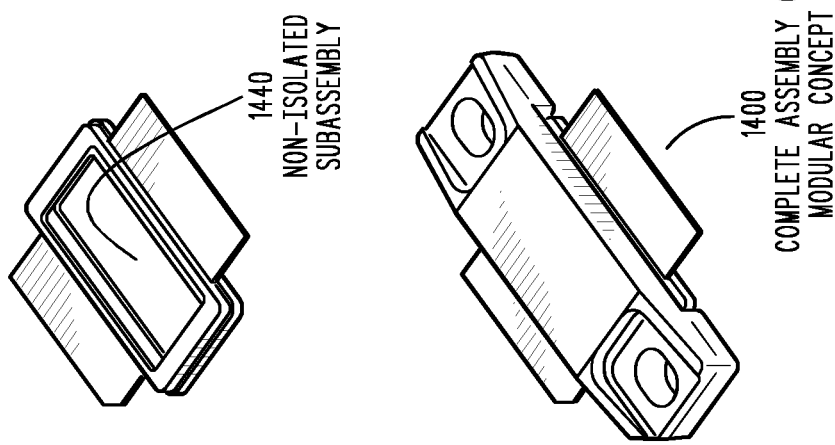
FIG. 14

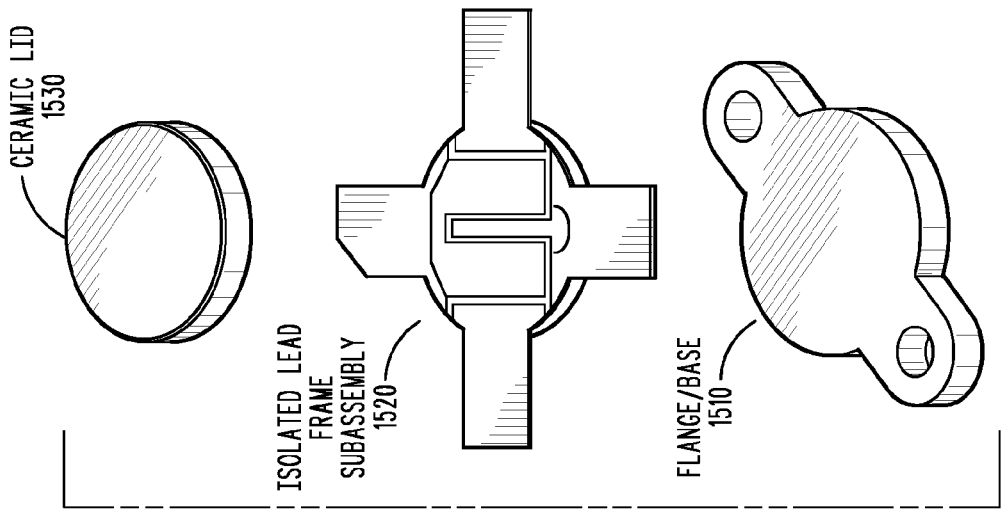
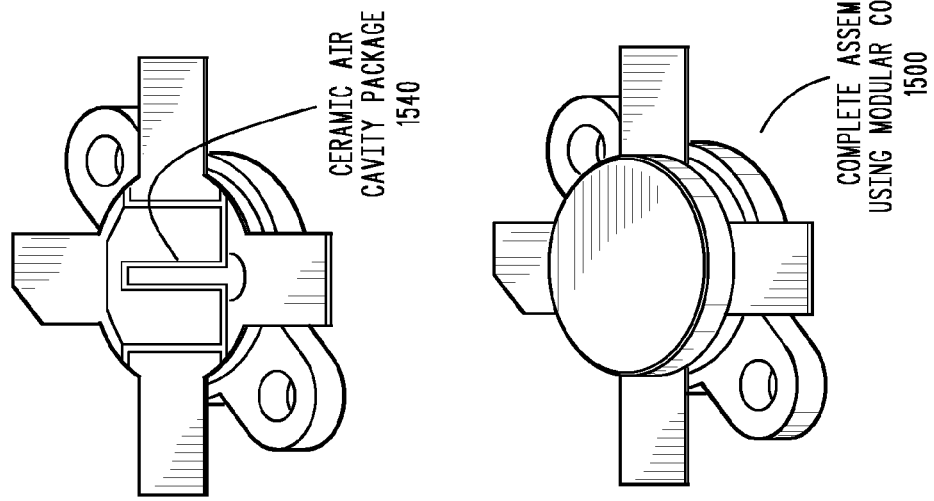
FIG. 15 —PRIOR ART—

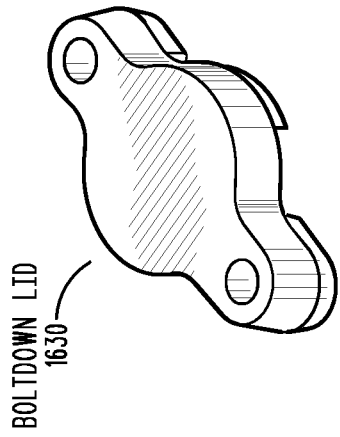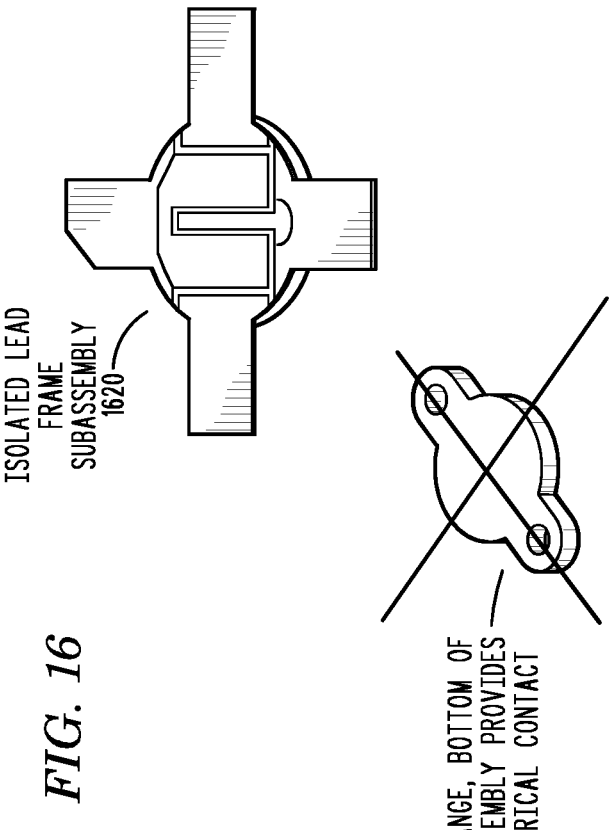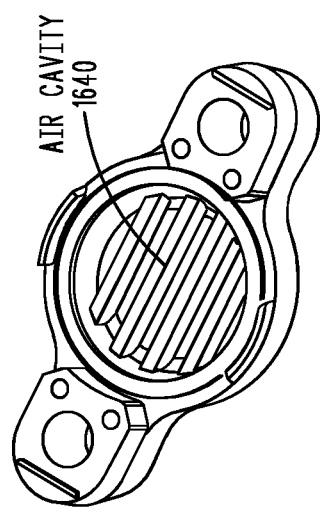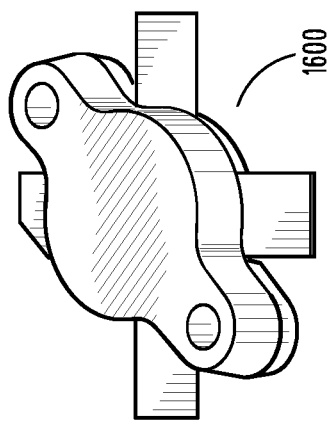
FIG. 16

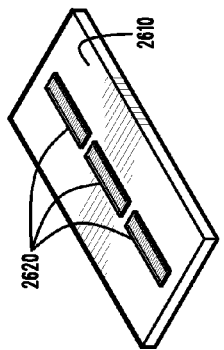
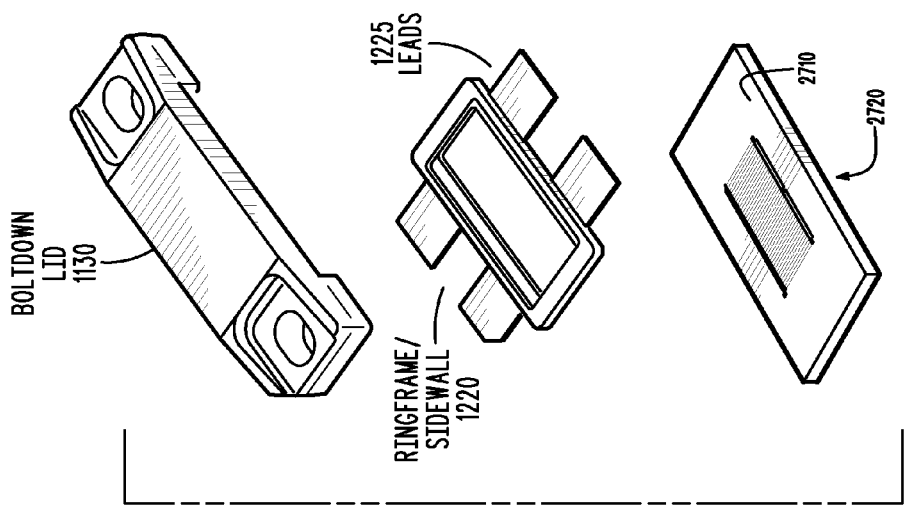
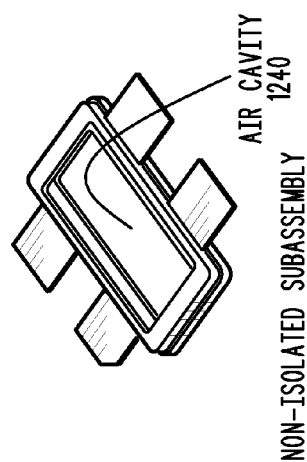
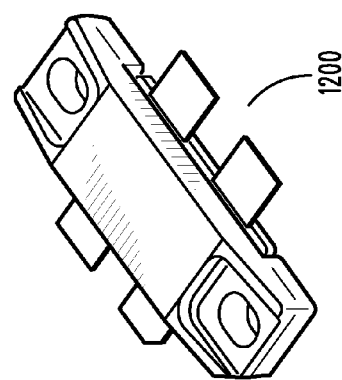
FIG. 26
FIG. 27

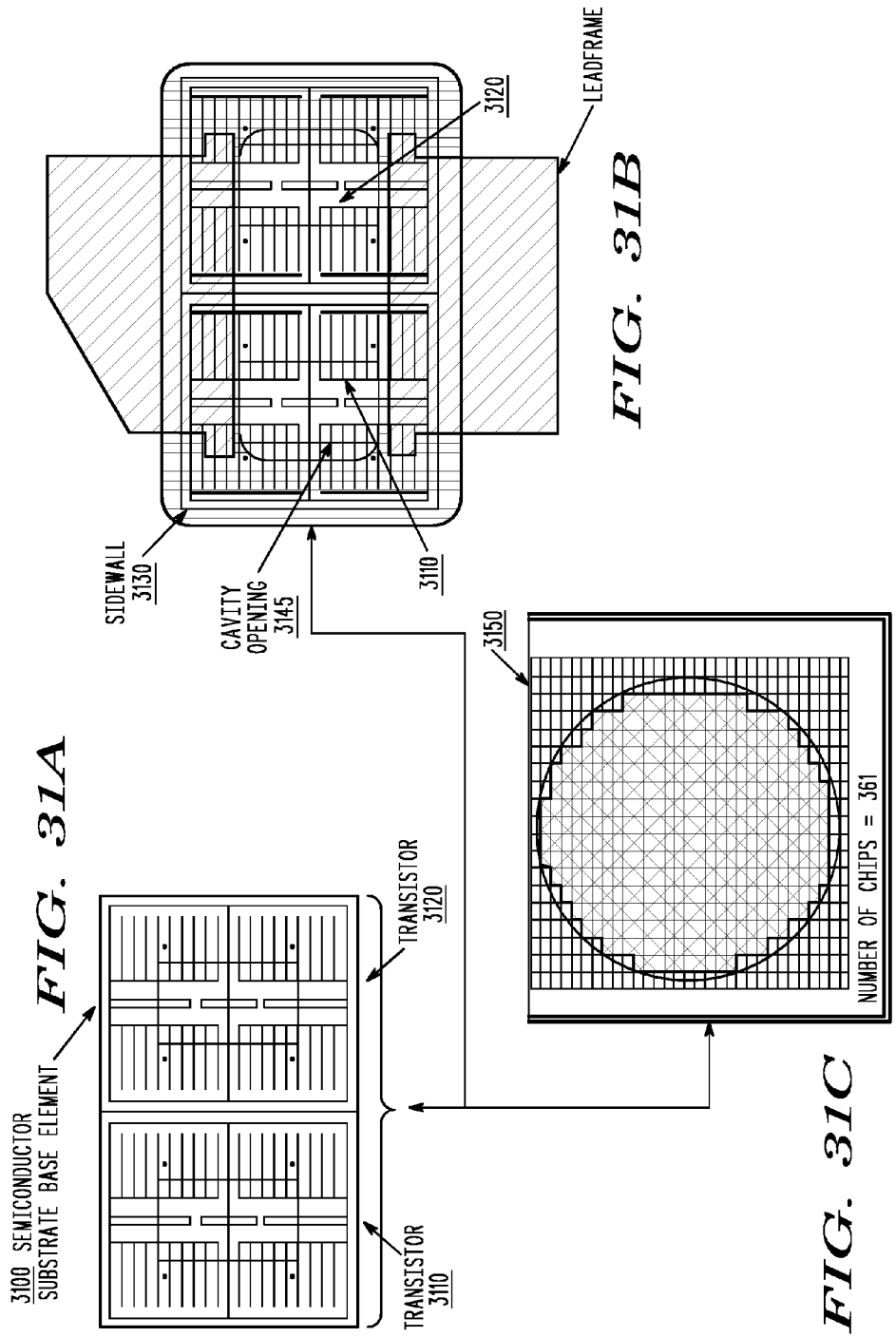

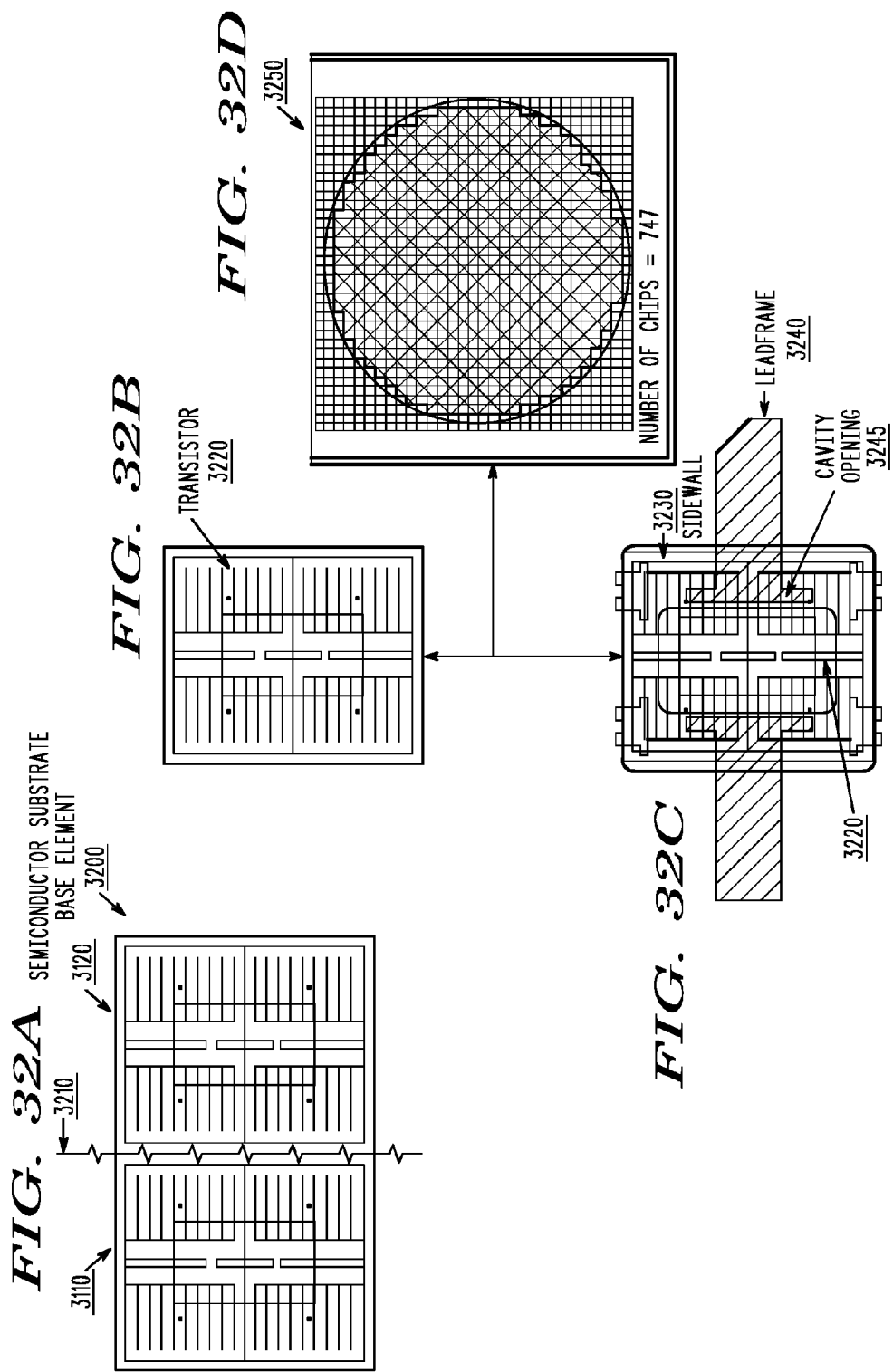

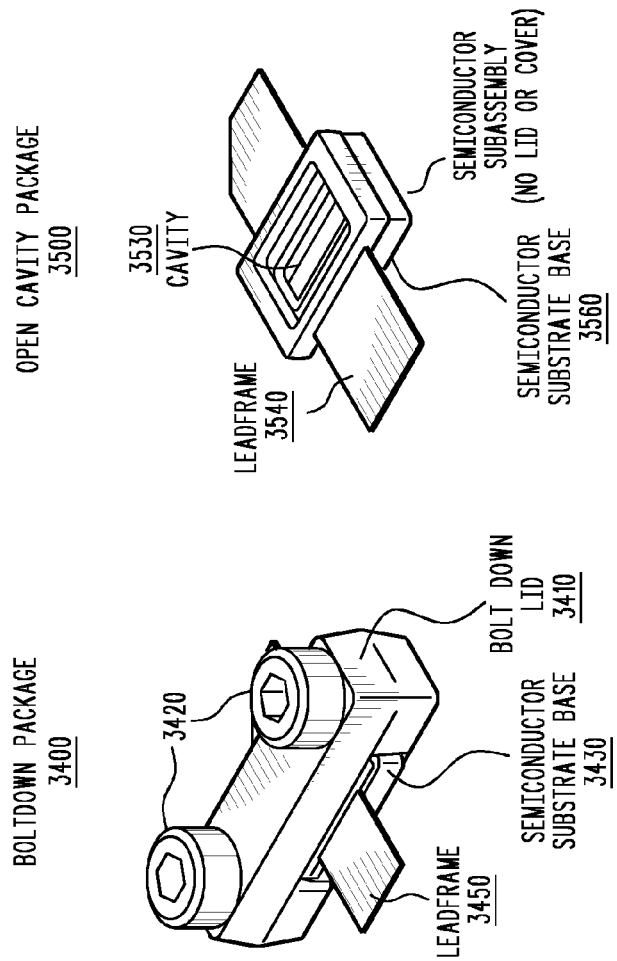
FIG. 35
FIG. 34
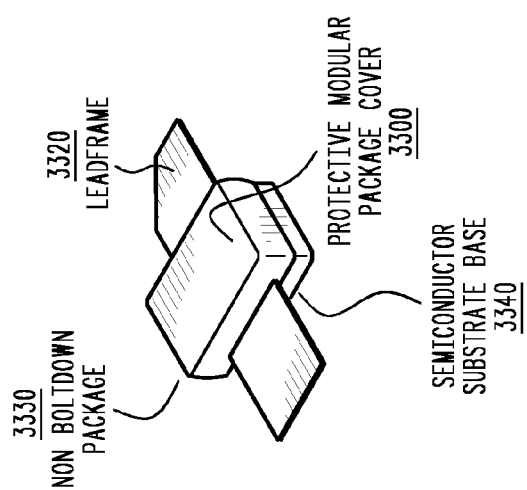
FIG. 33

MODULAR LOW STRESS PACKAGE TECHNOLOGY

PRIORITY CLAIM

This patent application claims priority to pending U.S. patent application Ser. No. 12/903,752, filed Oct. 13, 2010, which itself claims priority to U.S. Provisional Application No. 61/251,460 filed Oct. 14, 2009, which are hereby incorporated by reference.

RELATED APPLICATIONS

This application is related to co-pending U.S. patent applications: application Ser. No. 12/903,734, filed Oct. 13, 2010, application Ser. No. 12/903,752, filed Oct. 13, 2010, application Ser. No. 12/903,761, filed Oct. 13, 2010, application Ser. No. 12/903,772, filed Oct. 13, 2010, application Ser. No. 12/903,779, filed Oct. 13, 2010, application Ser. No. 13/406,697, filed Feb. 28, 2012, application Ser. No. 13/406,722, filed Feb. 28, 2012, which are incorporated herein in their entireties.

BACKGROUND

Package designers for power semiconductor devices are faced with numerous mutually-exclusive goals, necessitating a balance between performance, flexibility, manufacturability, reliability and cost of the final product. One elusive parameter to quantify for a new package development is the total project cost incurred for engineering and transferring a robust, high yielding design to a volume manufacturing environment. A true total cost calculation is further complicated when materials, process development and assembly equipment aspects are factored into the equation. A thorough performance assessment and reliability appraisal are also documented to establish that all design goals have been achieved.

The aforementioned considerations become increasingly difficult to manage in radio frequency, microwave, and optical applications in which high power levels and harsh environments make it difficult to devise a consistent methodology with which to characterize all electrical, mechanical and thermal attributes of package integrity. In such applications, there is a need to maximize design re-use of processes and materials which have previously been qualified for functionality and purpose.

The designer of semiconductor packaging has available a wide array of previously established materials and principles upon which to build. Applications are generally narrow enough in scope that designers are afforded flexibility to mitigate performance, cost and reliability concerns. However, as the product of operating power and operating frequency becomes increasingly large, the options available to the package designer diminish greatly, and as a consequence the number of different packages or packaging technologies required for such applications tends to specialize and proliferate, with a resulting drain on resources and escalating costs.

BRIEF DESCRIPTION OF THE DRAWINGS

The accompanying drawings provide visual representations which will be used to more fully describe various representative embodiments and can be used by those skilled in the art to better understand the representative embodiments disclosed and their inherent advantages. In these drawings, like reference numerals identify corresponding elements.

FIGS. 5A-5F illustrate a plate set design in which a protective modular package assembly, in accordance with various representative embodiments.

FIGS. 6A-6G illustrate a protective modular package assembly having one subassembly, in accordance with various representative embodiments.

FIGS. 7A-7F illustrate a protective modular package assembly having two subassemblies, in accordance with various representative embodiments.

FIGS. 8A-8G illustrate a protective modular package assembly having three subassemblies, in accordance with various representative embodiments.

FIG. 11 illustrates a prior art assembly having one 4-leaded ceramic leadframe inextricably affixed to a dedicated flange, to form a chip-and-wire subassembly.

FIGS. 12A-12B illustrate a modular package assembly in which a chip-and-wire subassembly consisting of a ringframe adhesively joined to base material, itself supporting one or more semiconductor devices, to be encapsulated in an air-cavity, in accordance with various embodiments described herein.

FIG. 13 illustrates a prior art assembly having one 2-leaded, chip-and-wire leaded subassembly.

FIG. 14 illustrates a modular package assembly in which one subassembly semiconductor devices is encapsulated in an air cavity, in accordance with various representative embodiments described herein.

FIG. 15 illustrates a prior art circular assembly.

FIG. 16 illustrates a circular modular package assembly, in accordance with various representative embodiments described herein.

FIG. 26 illustrates a base element onto which semiconductor chips are attached, in accordance with various representative embodiments.

FIG. 27 illustrates a modular package assembly in which a semiconductor substrate base element and modular sidewall form a semiconductor subassembly, in accordance with various embodiments described herein.

FIGS. 31A-31C illustrate a power semiconductor layout using dual transistors, in accordance with various embodiments described herein.

FIGS. 32A-32D illustrate a power semiconductor layout using a single transistor chip, in accordance with various embodiments described herein.

FIG. 33 illustrates a protective modular package cover, in accordance with various embodiments described herein.

FIG. 34 illustrates a protective modular package cover, in accordance with various other embodiments described herein.

FIG. 35 illustrates a semiconductor subassembly with no protective modular package cover, in accordance with various embodiments described herein.

DETAILED DESCRIPTION

Figure 1:
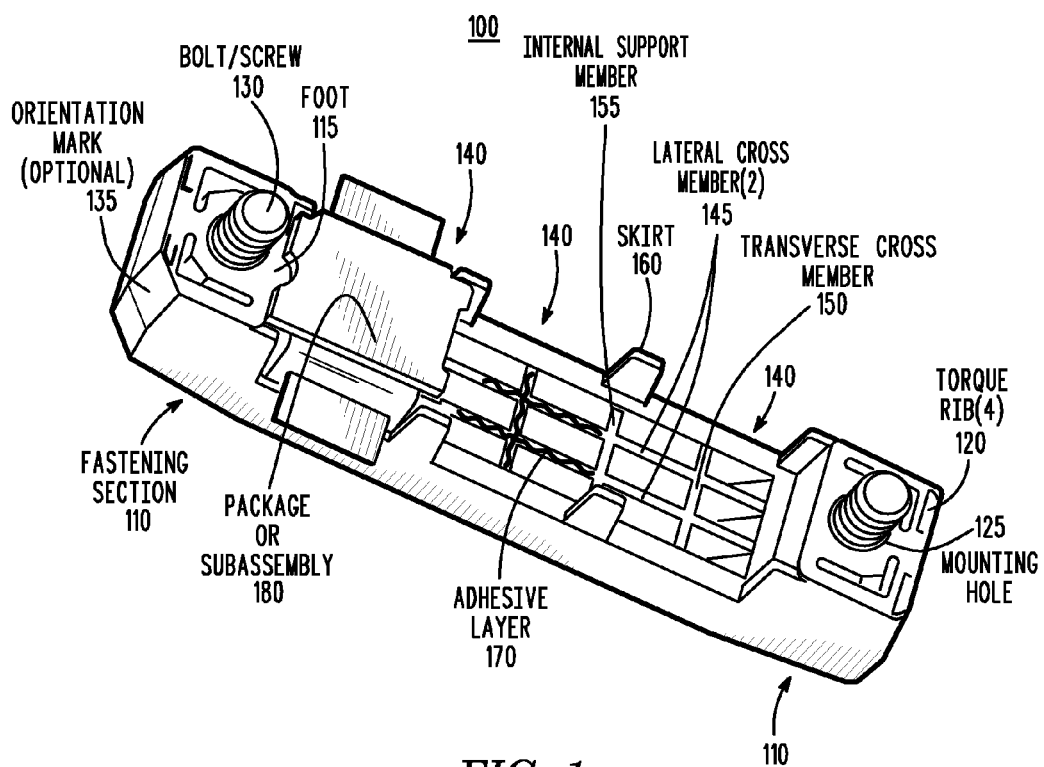
FIG. 1 is an isometric view of the underside of a modular protective package cover, in accordance with various representative embodiments.

Using the drawings, the various embodiments of the present invention, including preferred embodiment(s) will now be explained. In the following detailed description and in the several figures of the drawings, like elements are identified with like reference numerals.

In accordance with various embodiments disclosed herein, various structures, assemblies, and methodologies are disclosed that minimize the cost and time cost and time obstacles of existing packaging strategies, without affecting performance and reliability. A modular design approach capitalizes on the reuse of proven processes and materials. This modular approach comprises a versatile range of pre-qualified functional blocks or modules arranged to minimize mechanical stress, such that reasonably high reliability can be insured with a minimum cost and time-to-market. The disclosed approaches are particularly well-suited to semiconductor packages for high power radio frequency, microwave, and optical devices, which are used in applications with severe operating environments for which low mechanical stress is a desirable property. With a modular approach to the package system, a new level of flexibility is offered to package designers since, by combining proven materials with accepted design principles and assembly methodologies, cost-effective semiconductor package innovations can be released with shortened design and qualification cycles, minimized material inventories, and minimized equipment investment. At the same time, designs with this approach may be open-ended, which allows generational improvements to be implemented as new materials are qualified and released. In contrast, existing package solutions are generally frozen upon completion, allowing little margin for continuous improvements, due to cost prohibitive re-qualification efforts.

Furthermore, by the continued re-use of qualified engineering materials within the modular system, package designers can incrementally improve upon existing semiconductor package outlines such that application specialization can accomplished at a drastically reduced cost. Finally, the same concept allows for usage of a wide range of materials, including those engineered with novel thermal and electrical properties, without the requisite impact of a full re-development effort each time a new package is required.

Figure 2:
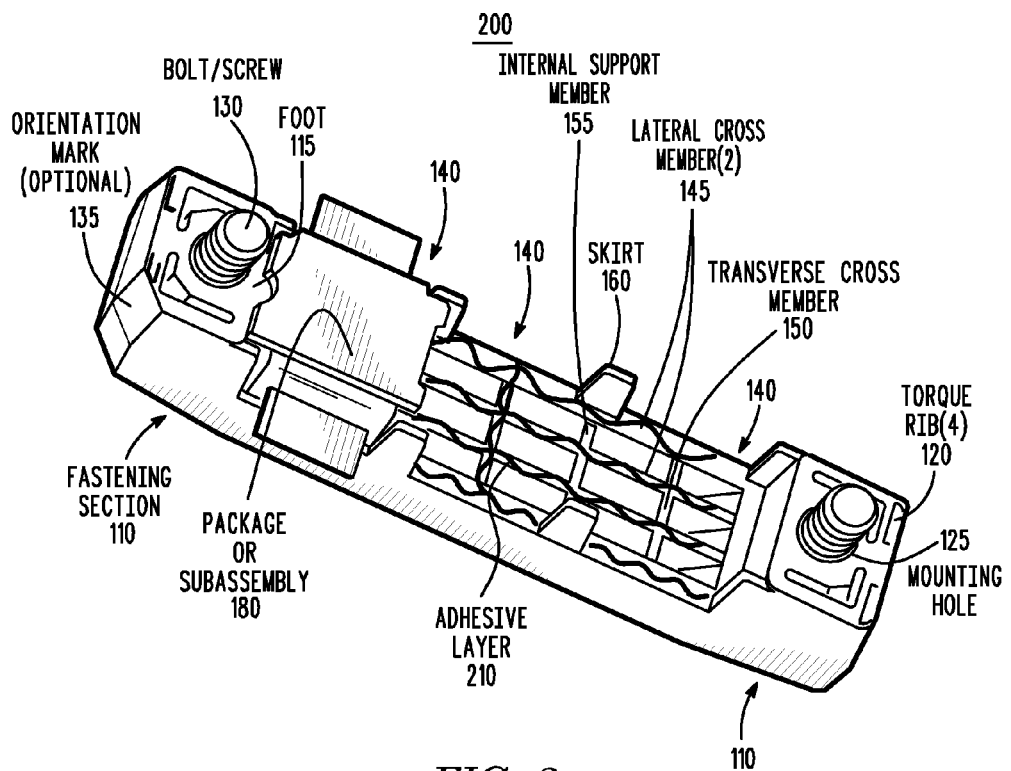
FIG. 2 is another isometric view of the underside of a modular protective package cover, in accordance with various representative embodiments.

In accordance with certain embodiments a protective modular package cover with first and second fastening sections located at opposing first and second ends of the protective modular package cover and one or more subassembly receiving sections disposed between the first and second fastening sections is configured to fasten the protective modular package cover to a core. Referring now to FIG. 1, protective modular package cover 100, also referred to as a lid, a cover, or a clamp, in accordance with certain embodiments is shown. There are two fastening sections 110 shown, a first fastening section at a first end of the protective modular package cover 100 and a second fastening section at a second end of the protective modular package cover 100. Each fastening section 110 has a first foot surface 115 located on a bottom surface of the fastening section at an end of the protective modular package cover 100 and is configured to make contact with a core layer; one or more torque elements 120, shown here as four torque ribs, are disposed on the foot surface 115 adjacent the outer edge of the respective end of the protective modular package cover 100; and a mounting hole 125 that extends through the fastening section from a top surface of the fastening section to the bottom surface of the fastening section, is coupled to the torque element 120, and is configured to receive a fastener, such as a bolt or screw 130 therein. Skirt 160 may be a decorative or cosmetic feature, or as illustrated in FIG. 2, may be used to provide a better seal by buttressing the bond line between the cross members and encapsulated subassemblies. Optionally, the protective modular package cover 100 may have an orientation mark 135 as a feature.

Disposed between the first and second fastening sections are one or more subassembly receiving sections 140 that are configured to receive one or more subassemblies 180 that may be encapsulated therein. The one or more subassemblies may be semiconductor packages or subassemblies, such as a chip-and-wire package or an over-molded subassembly, including packages or subassemblies suitable for radio frequency, microwave, optical, or other high power level applications. Each subassembly receiving section has a cross member, such as lateral cross member 145 and transverse cross member 150, formed along the underside of the protective modular package cover. As will be described in more detail, an adhesive layer 170, such as epoxy polymer, is deposited on the cross member of each subassembly receiving section 140 to affix a subassembly 180 that will be mounted in the subassembly receiving section.

In this particular embodiment, the subassembly receiving sections are illustrated as precision-locating pockets each having two lateral cross members 145 and a transverse cross member 150 formed along the underside of the protective modular package cover 100. It is not necessary that the cross member of a subassembly receiving section comprise both lateral and transverse cross members; this is illustrated by bolt down lid 1630 of FIG. 16, in which only lateral cross members are shown. Additionally, an internal support member 155 that separates the respective subassembly receiving sections 140 may be employed.

As will be shown in other drawings, the modular design of the protective modular package cover 100 allows for any number of subassemblies to be received and encapsulated in the subassembly receiving sections 140. The one or more subassembly receiving sections 140 may be precision-locating pockets suitable for receiving and encapsulating overmolded subassemblies, as illustrated in FIGS. 1-10 in which resin plastic over-molded packages are joined with the cover, which may be injection molded with a high performance engineering polymer, such as liquid crystal polymer. Or, they may be air cavities formed by the joining of a sidewall, such as a conductive leadframe injection molded liquid crystal polymer material, to a conductive base material, as illustrated in FIGS. 12, 14, and 16, suitable for receiving and encapsulating chip-and-wire semiconductor packages. Either way, a way to secure the final assembly to a core with a minimum of stress by the controlled application of force to only the top surface of the semiconductor subassembly is provided. While three subassembly receiving sections 140 are illustrated in FIG. 1, it is contemplated that any number may be employed as determined by the desired configuration of the assembly, including the number of assemblies desired, and that the dimensions and configurations of each of the subassembly receiving sections are the same, allowing for scalability and reuse of pre-qualified functional blocks.

Referring now to FIG. 2, protective modular package cover 200 illustrates that the bond lines provided by epoxy or other adhesive layer 210 can be much more extensive, in effect maximizing the moisture path length in the bond by maximizing the bond surface area between the cross members and the encapsulated subassemblies seated on the adhesive layer 210. Also, it can be seen that the skirt elements 160 serve a more important function than being merely decorative or cosmetic by serving as a structural element for establishment of the maximized adhesive layer 210. Maximization of the adhesive layer serves to lengthen the bond line and thus the path of moisture ingress. In this embodiment, the adhesive layer 210 is deposited on the cross members 145 as well as along lateral cross member 150 and makes contact with an interior surface of the skirt elements 160, making the adhesive layer 210 contiguous the skirt elements as shown.

Figure 3:
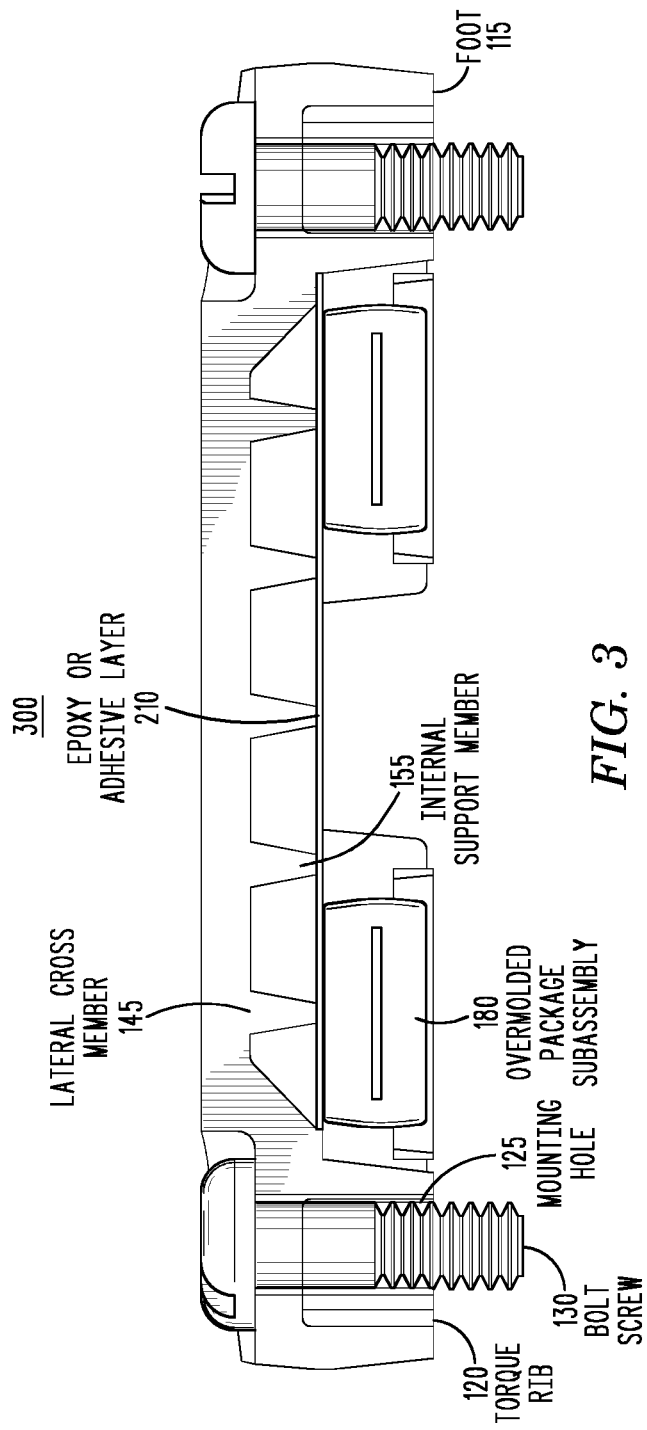
FIG. 3 is a cross sectional view of a protective modular package assembly, in accordance with various representative embodiments.

In FIG. 3, the cross-sectional view of protective modular package cover 300 illustrates the enhanced epoxy or adhesive layer 210. It also illustrates other features of the protective modular package cover such as a detailed view of torque element 120, mounting hole 125, fastening element 130, lateral cross members 145, internal support member 155, and foot surface 115. In this particular embodiment, subassembly 180 is illustrated as an over-molded resin package subassembly.

Activation of one or more of the torque elements of the protective modular package cover transfers a downward clamping force that is generated at the first or second fastening elements to a top surface of one or more subassemblies disposed in the one or more subassembly receiving sections. This transfer occurs via the one or more cross members of each of the one or more subassembly receiving sections. More particularly, activation of the first or second torque element transfers the downward clamping force to a central portion of the top of the protective modular package cover and generates a distributed downward clamping force that is distributed by the cross member of each of the one or more subassembly receiving sections from the central portion of the top of the protective modular package cover to the top surface of the one or more subassemblies disposed in the one or more subassembly receiving sections.

Figure 4:
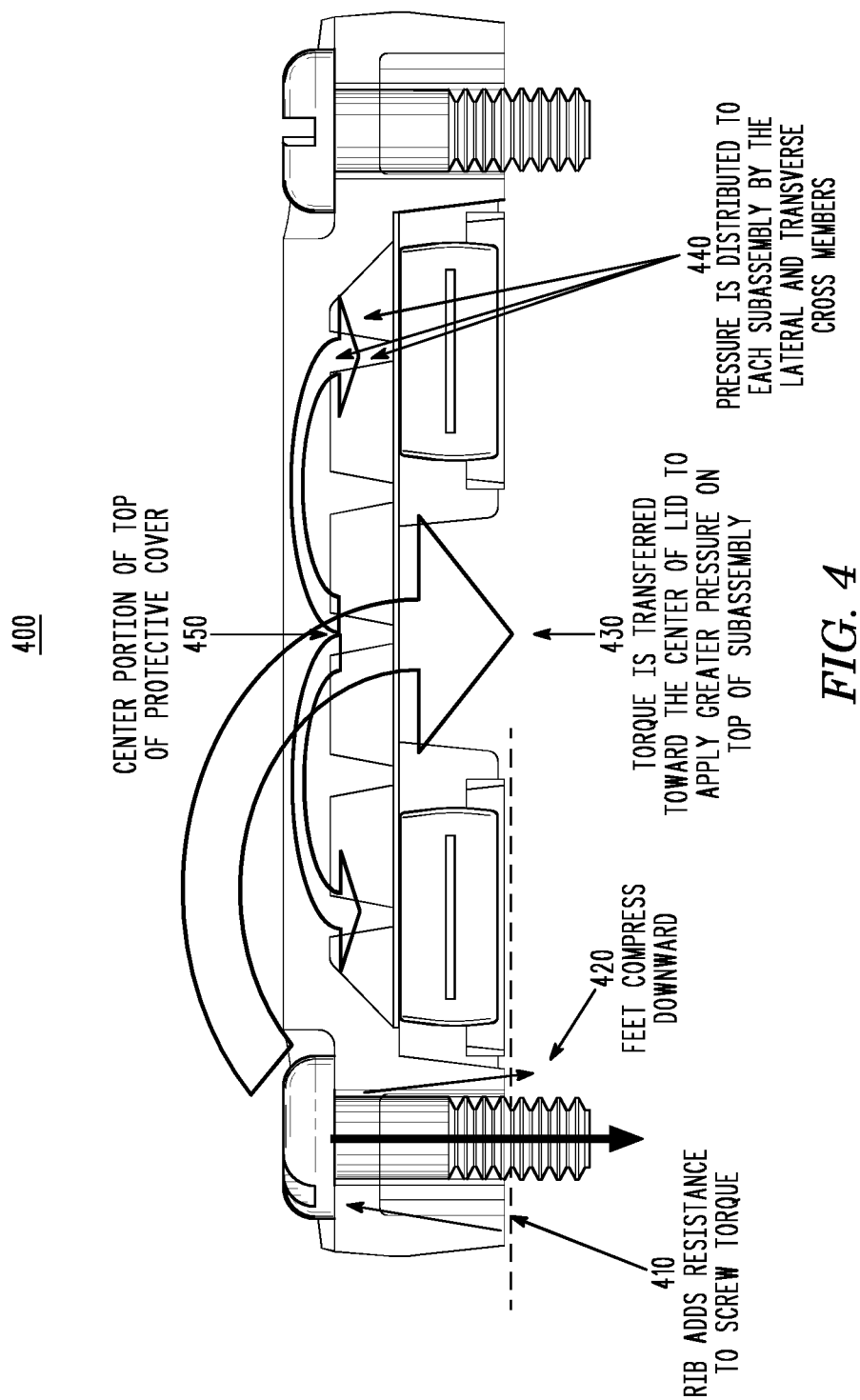
FIG. 4 is a cross sectional view of a protective modular package assembly, in accordance with various representative embodiments.

Referring now to protective modular package cover 400 of FIG. 4, insertion of and then activation of a fastener element 130, such as the bolt or screw, in its mounting hole 125 serves to activate the torque rib torque element 120 and result in generation of downward clamping force. The rib adds resistance 410 to the screw torque and the foot surface 115 compresses downward 420. The downward clamping force is transferred 430 toward the center 450 of the lid to apply greater pressure on top of the subassembly. This transferred downward clamping force is distributed 440 each subassembly by the cross members, such as lateral and transverse cross members 145 and 150 of the one or more subassembly receiving sections. In this manner, activation of a torque element of a fastening section transfers a downward clamping force generated at a fastening element to a top surface of one or more subassemblies disposed in the one or more subassembly receiving sections via the cross member of each of the one or more subassembly receiving sections. Sufficient activation of the one or more torque elements 120 of the fastening sections 110 operates to mount the protective modular package cover to the core, which may be a heat sink, a heat spreading core, a heat sinking core, or a base plate.

In accordance with embodiments described herein, a protective modular package assembly has one or more subassemblies, which may be chip-and-wire air-cavity semiconductor packages, chip-and-wire dielectric gel-filled cavities, or resin over-molded semiconductor subassemblies as previously stated; a protective modular package cover as described above; and an adhesive layer for affixing the one or more subassemblies to respective subassembly receiving sections of the one or more subassembly receiving sections. The protective modular package cover has first and second fastening sections located at opposing first and second ends of the protective modular package cover with one or more torque elements disposed on the first and second ends and is configured to fasten the protective modular package cover to a core. The protective modular package cover further has one or more subassembly receiving sections disposed between the first and second fastening sections, with each subassembly receiving section of the one or more subassembly receiving sections operable to receive a subassembly and having a cross member formed along the underside of the protective modular package cover.

Activation of the one or more torque elements of the fastening sections of the protective modular package cover transfers a downward clamping force generated at the fastening elements to a top surface of one or more subassemblies disposed in the one or more subassembly receiving sections via the cross member of each of the one or more subassembly receiving sections. Also, as previously described, activation of the one or more torque elements transfers the downward clamping force to a central portion of the top of the protective modular package cover and generates a distributed downward clamping force that is distributed by the cross member of each of the one or more subassembly receiving sections from the central portion of the top of the protective modular package cover to the top surface of the one or more subassemblies disposed in the one or more subassembly receiving sections. Sufficient activation of the one or more torque elements mounts the protective modular package cover to a core.

Figure 5A:
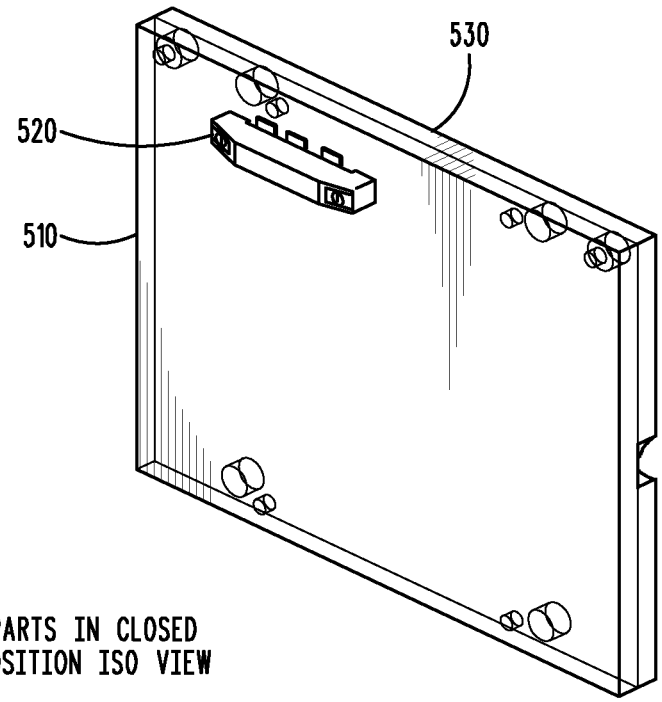
Figure 5B:
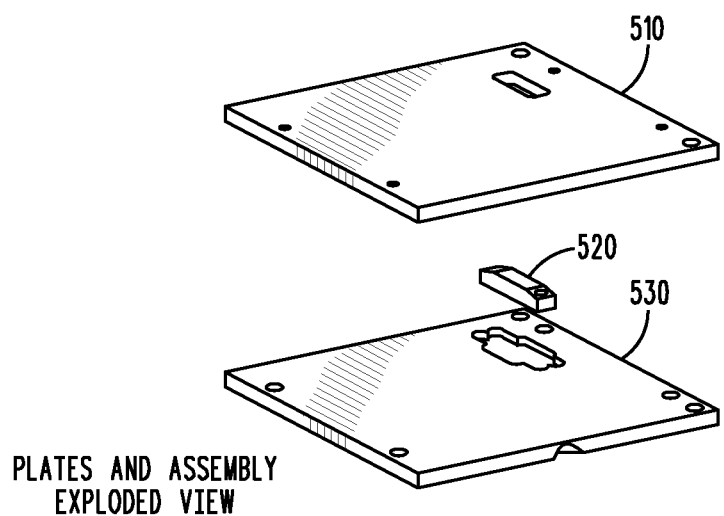
Figure 5C:
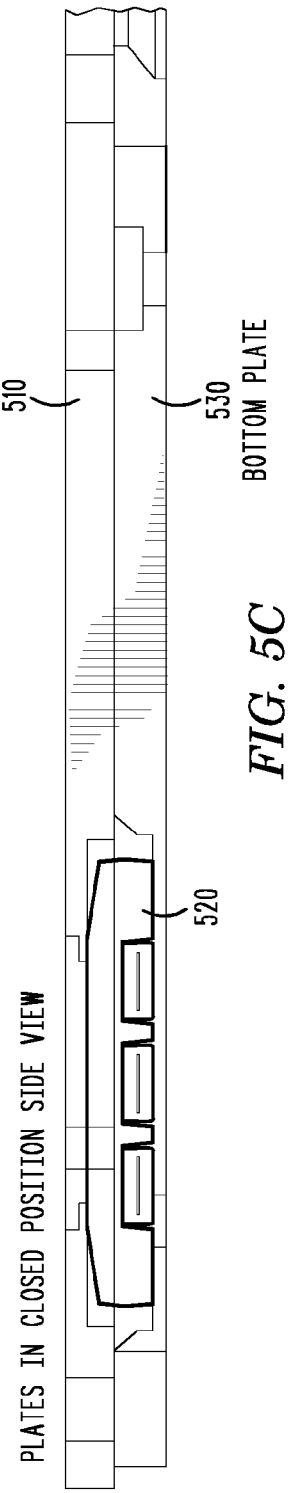
Figure 5D:
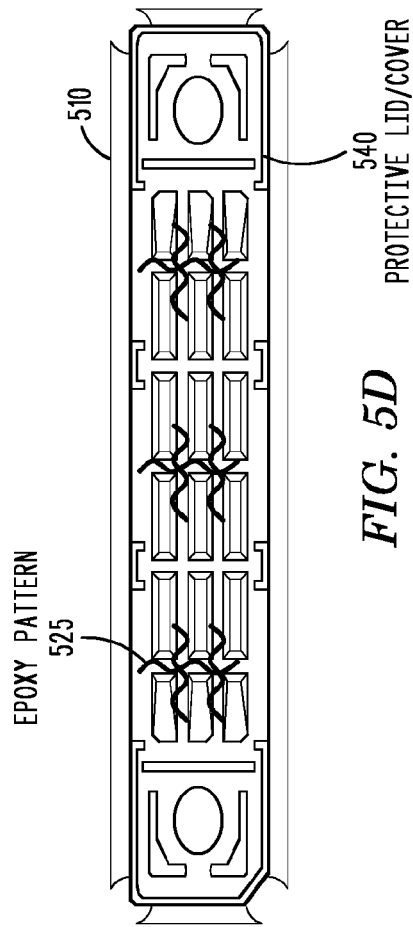

FIGS. 5A-5F illustrate a plate set design in which a protective modular package assembly is shown. FIG. 5A illustrates an isometric view of top plate 510 and bottom plate 530 in closed position about protective modular package assembly 520. In FIG. 5B, the top and bottom plates 510, 530 and assembly 520 are shown in an exploded view. The side view of FIG. 5C illustrates plates 510, 530 in closed position. The top view of top plate 510 in FIG. 5D further illustrates that top plate 510 holds the package protective cover 540. Adhesive pattern 525 is illustrated deposited on the cross members of three subassembly receiving sections; again, as discussed previously, while three subassembly receiving sections are shown in this particular embodiment, it is contemplated that any number of subassembly receiving sections disposed between first and second fastening sections may be used. In FIG. 5E, an isometric view of top plate 510 again illustrates that top plate 510 holds protective cover 540 as shown. FIG. 5F illustrates bottom plate 530, which holds the rest of the protective modular package assembly, including the subassemblies 550 received by the subassembly receiving sections of the lid 540. The precise alignment of the subassemblies in the three subassembly receiving section pockets can be seen. The positional accuracy afforded is advantageous, accommodating tight mechanical tolerances.

As previously mentioned, the modular nature of the protective modular package assembly and the protective modular package cover thereof provide for any number of subassemblies to be accommodated without requiring a redesign of the lid and assembly. FIG. 6 illustrates an embodiment with one subassembly; FIG. 7 illustrates an embodiment with two subassemblies; and FIG. 8 illustrates an embodiment with three subassemblies.

Figure 6A:
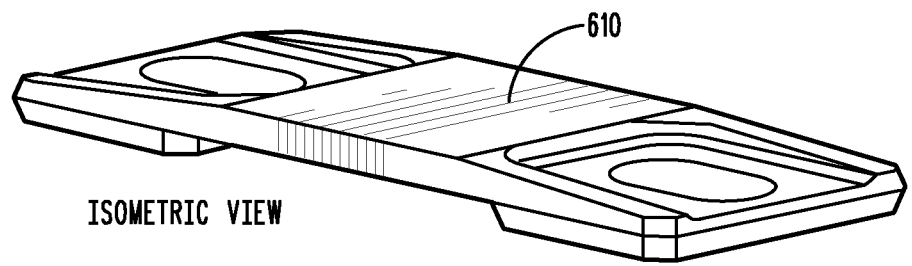
Figure 6C:
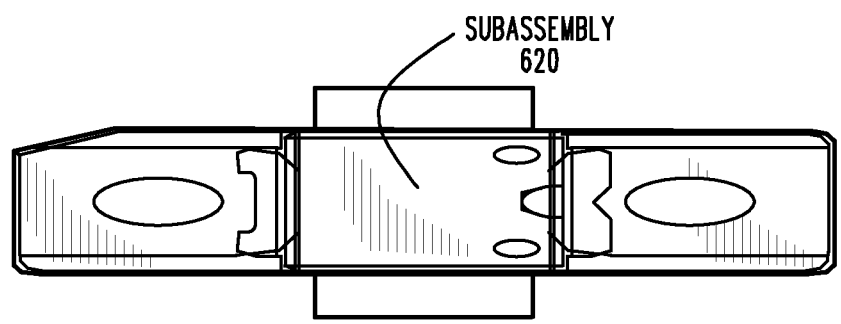
Figure 6D:
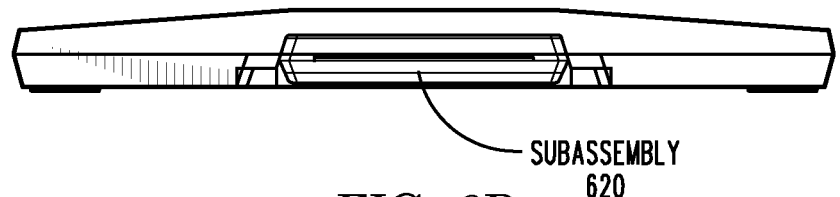
Figure 6B:
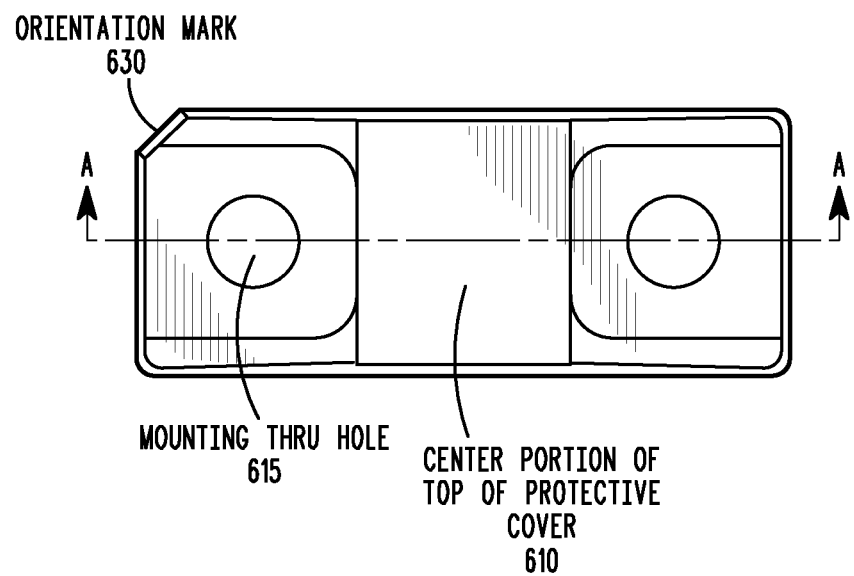

Referring now to FIGS. 6A-6G, in FIG. 6A an isometric view of the protective modular package assembly with the top of cover 610 shown. In FIG. 6B, the central portion of the top of protective cover 610 is shown, as well as mounting hole 615 and orientation mark 630. FIG. 6C illustrates a top view of the assembly in which a single subassembly 620 is shown. FIG. 6D is a side view of the assembly. In FIG. 6E, the leads 625 of the subassembly 620 are shown, as well as bolt/screw fastener 635. FIG. 6F provides a side view of the assembly in which fastener 635 and over-molded subassembly 620 are shown. In FIG. 6G, a bottom, x-ray view through subassemblies illustrates foot sections 640 with a total of four torque rib torque elements 645, transverse cross member 650, lateral cross members 655, subassembly 620 and fastener 635.

Figure 7A:
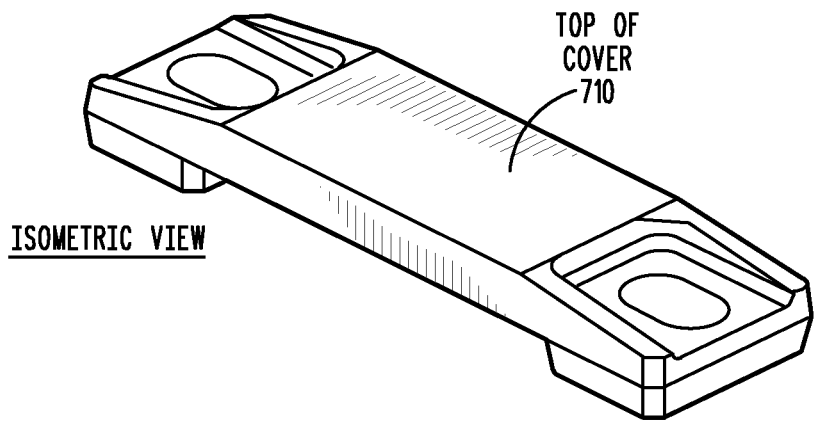
Figure 7B:
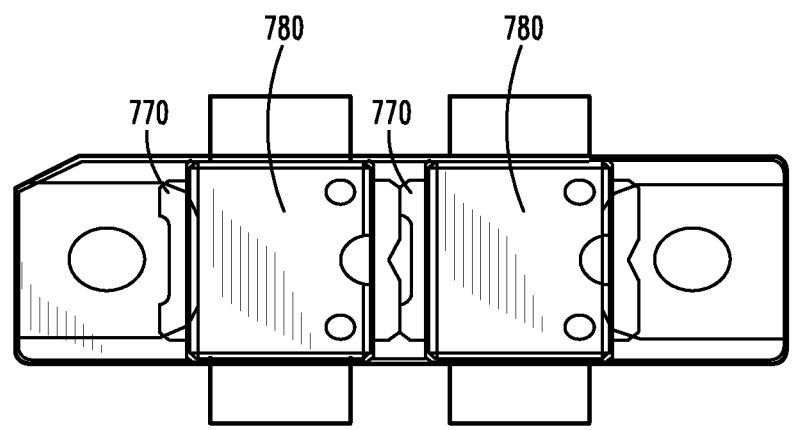
Figure 7C:
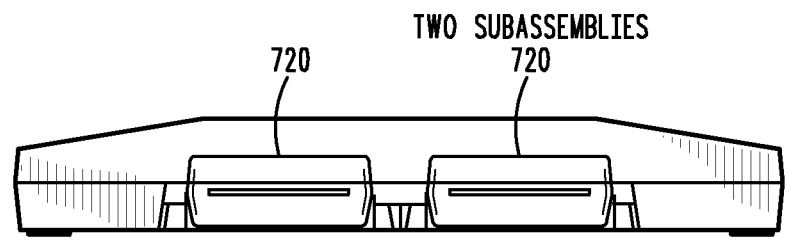

Referring now to FIGS. 7A-7F, a protective modular package assembly in which two subassemblies are encapsulated is shown. In FIG. 7A, an isometric view of the protective modular package assembly with the top of cover 710 shown. FIG. 7B illustrates a top view of the assembly in which two subassemblies 720 are shown. Due to all clamping force being distributed on the top surface of the lid 780, no pressure is applied on top of the copper slug 770 of the subassemblies. FIG. 7C is a side view of the assembly.

In FIG. 7D, the leads 725 of each of the two subassemblies 720 are shown, as well as bolt/screw fastener 735. FIG. 7E provides a side view of the assembly in which fastener 735 and over-molded subassemblies 720 are shown. In FIG. 7F, a bottom, x-ray view through subassemblies illustrates foot sections 740 with a total of four torque rib torque elements 745, transverse cross members 750, lateral cross members 755, internal support cross member 760, subassemblies 720, leads 725, and fastener 735.

Referring now to FIGS. 8A-7G, a protective modular package assembly in which three subassemblies are encapsulated is shown. In FIG. 8A, an isometric view of the protective modular package assembly with the top of cover 810 shown. FIG. 8B illustrates a top view of the assembly in which three subassemblies 820 are shown. Due to all clamping force being distributed on the top surface of the lid 880, no pressure is applied on top of the copper slug 870 of the subassemblies. FIG. 8C is a side view of the assembly. The overall height of the assembly 880 may be maximized to increase the thickness of the assembly to enhance the assembly strength. In FIG. 8D, a view of the bottom of the lid cover illustrates precision-locating pockets 815 configured to receive three subassemblies, such as over-molded subassemblies.

In FIG. 8E, an isometric view of the modular package assembly shows leads 825 and a central portion 810 of the lid, as well as bolt/screw fastener 835. FIG. 8F provides a side view of the assembly in which fastener 835 and over-molded subassemblies 820 are shown. In FIG. 8G, a bottom, x-ray view through subassemblies illustrates foot sections 840 with a total of four torque rib torque elements 845, transverse cross members 850, lateral cross members 855, internal support cross member 860, subassemblies 820, leads 825, fastener 835, and optional orientation mark 830.

Figure 9:
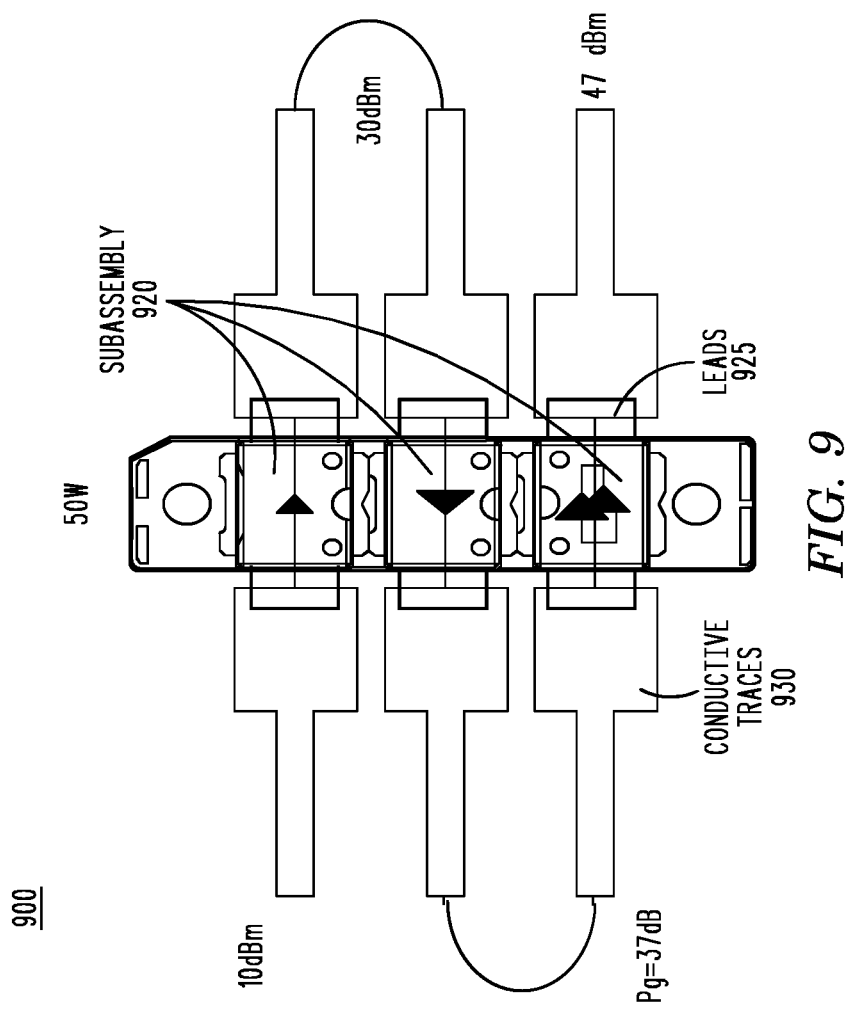
FIG. 9 shows a top view of a modular package assembly having three subassemblies, in accordance with various representative embodiments.

In FIG. 9, a top view 900 of a modular package assembly having three subassemblies 920 with conductive leads 925 that electrically couple to conductor traces 930, such as on a printed circuit board, for example. Due to the modular nature of the lid and entire assembly, any number of semiconductor subassemblies 920 can be accommodated without a major redesign of the package.

It is contemplated that a variety of types of subassemblies can be accommodated, including a range of high power radio frequency (RF), microwave, and optical semiconductors. Thus, a package assembly of FIG. 6 may have an average power of 50 W and a peak of 90 W, while the assembly of FIG. 7 houses two subassemblies and may have an average power of 95 W and peak power of 170 W and the assembly of FIG. 8, with three subassemblies, may have an average power of 140 W and peak power of 255 W. In FIG. 9, an RF amplifier having three independent stages of power gain is depicted schematically. It can be seen than an initial input signal with a power level of 10 dBm is supplied by an external circuit supplied to the first subassembly, whereupon it is amplified by 20 dB to a power level of 30 dBm. Subsequent amplification by the second and third amplifier stages results in power gains of 10 dB and 7 dB respectively, resulting in an average output power of 50 W (47 dBm) with a total amplification for the three stages being 37 dB.

Figures 10A, 10B:
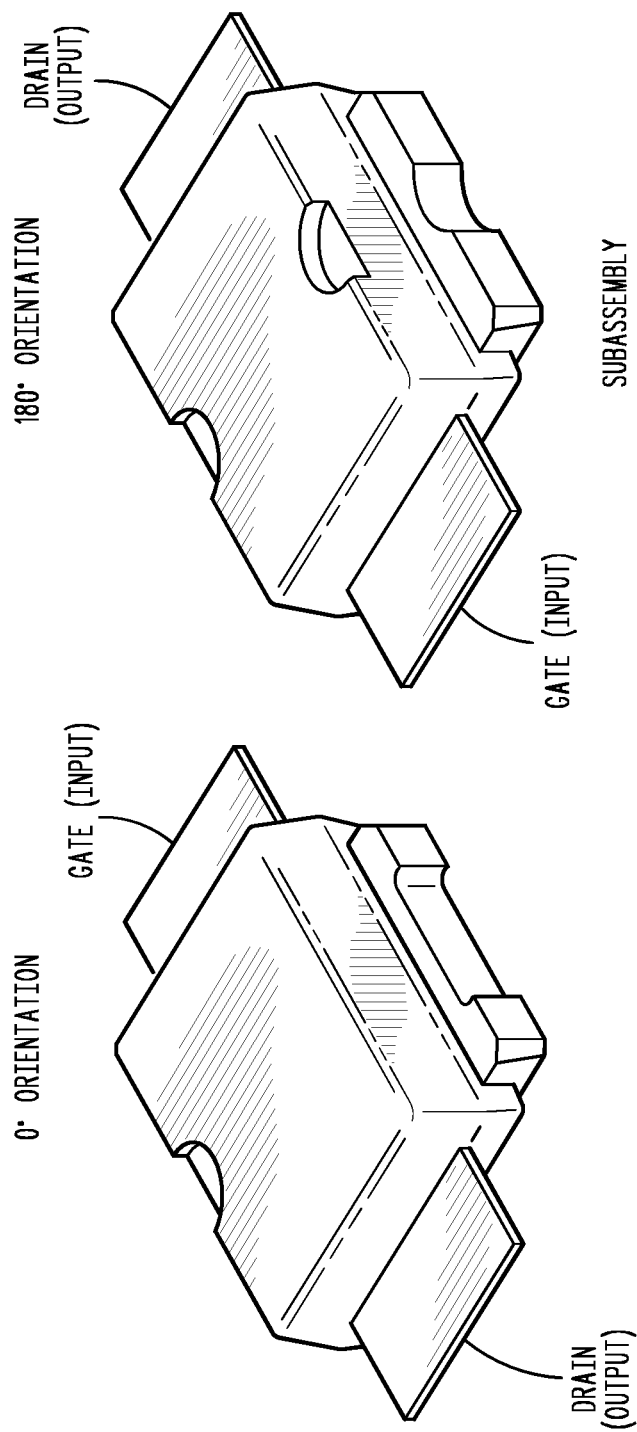
FIG. 10 illustrates an exemplary RF straight lead subassembly, in accordance with various representative embodiments.

FIGS. 10A and 10B illustrate 0 and 180 orientation views, respectively, of a representative RF straight lead subassembly. The modular design approach is not sensitive to lead configuration and device rotation, being able to accommodate a wide variety of package types, including "straight lead," "gull wing," and "10 lead," for example.

In addition to over-molded semiconductor subassemblies, shown in the above figures, it is contemplated that chip-and-wire air-cavity semiconductor subassemblies may be accommodated within one or more subassembly receiving sections as well.

FIG. 11 shows a prior art completed assembly of a dedicated, non-modular, non-customizable leaded assembly 1100, in which one or more semiconductor devices are encapsulated by way of an air-cavity. The constituent parts of non-isolated ceramic package assembly 1100 include non-isolated metal flange or base 1110, a ringframe/sidewall 1120 with leads 1125, a ceramic lid 1130, and an air cavity 1140 formed by the joining of sidewall 1120 to conductive base 1110 as shown. This design is not modular and cannot be easily changed to accommodate different subassemblies and overall package configurations once set. Once designed, it is fixed. The flange base material can be expected to be quite expensive due to its complex shape.

FIGS. 12A and 12B, in contrast to FIG. 11, illustrate a modular package assembly 1200 in which one or more semiconductor devices are encapsulated by way of an air-cavity, in accordance with various embodiments described herein. In FIG. 12A, a top view of the complete assembly 1200 is comprised of a non-isolated flange/base 1210 to which a ringframe/sidewall 1220 is joined to form an air cavity subassembly 1240, a subassembly receiving section configured to receive the subassembly, and serving as a cover, yielding a non-isolated package subassembly.

The leaded sidewall may consist of a conductive leadframe that is injection molded with a high performance engineering polymer, such as liquid crystal polymer (LCP) material, providing mechanical support and electrical isolation for individual leads. The sidewall 1120 accommodates multiple leads and electrically isolates leads from base layer 1210. When the sidewall is joined to the base 1210, it serves as an additional layer of protection to the encapsulated semiconductor subassembly therein, by forming an air-cavity in which additional components, such as wirebonds, can be used for added functionality of the final device. The air cavity formed by sidewall 1220 and base 1210 can accommodate any subassembly package desired.

The bolt-down lid 1230 is an exemplary protective modular package cover as described above and facilitates bolt down of the package assembly to a core from the top. This particular assembly encapsulates two subassemblies as illustrated by leads 1225. The cover 1230 seals the air cavity and provides a way to secure the final assembly to a core, such as a heat spreading core, with a minimum of stress to the semiconductor materials, as previously described. This is accomplished by applying pressure to only the top surface of the sidewall layer. A bottom view of assembly 1200 is shown in FIG. 12B.

It can thus be seen that the air cavity formed by a sidewall element of a subassembly joined to a base element of the subassembly is sealed by receipt of the subassembly by a subassembly receiving section of the one or more subassembly receiving sections and securing the protective modular package cover to a modular package assembly comprising the subassembly. The sidewall element can be a leaded sidewall, such as a conductive leadframe injection molded with a high performance engineering polymer, such as liquid crystal polymer material.

FIG. 13 shows a prior art completed assembly of a dedicated, non-modular, non-customizable leaded assembly 1300 in which one chip-and-wire subassembly is encapsulated. Its constituent parts are shown as a non-isolated flange or base 1310, a ringframe/sidewall 1320, a ceramic lid 1330, and an air cavity 1340 formed by the joining of sidewall 1320 to conductive base 1310 as shown. This design is not modular and cannot be easily changed to accommodate different subassemblies and overall package configurations once set.

FIG. 14, in contrast to FIG. 13, illustrates a modular package assembly 1400 in which one chip-and-wire semiconductor subassembly is encapsulated, in accordance with various embodiments described herein. In FIG. 14, a top view of the complete assembly 1400 is comprised of a non-isolated flange/base 1410 to which a ringframe/sidewall 1420 is joined to form air cavity subassembly 1440, a subassembly receiving section configured to receive the subassemblies, yielding a non-isolated package assembly. The bolt-down lid 1430 is an exemplary protective modular package cover as described above.

Referring now to FIG. 15, a prior art assembly of a dedicated, non-modular, non-customizable leaded assembly 1500 is shown. Its constituent parts are shown as a non-isolated flange or base 1510, a ringframe/sidewall 1520, a ceramic lid 1530, and an air cavity 1540 formed by the joining of sidewall 1520 to conductive base 1510 as shown. This design is not modular and cannot be easily changed to accommodate different subassemblies and overall package configurations once set.

In contrast, FIG. 16 illustrates a modular package assembly 1600, in accordance with various embodiments described herein. It is important to note, in contrast to FIG. 15, that no flange is needed, as the bottom of the subassembly provides the needed electrical contact. Also, no sidewall is needed to form an air cavity, as the lid has been designed to provide this feature. The lid may be formed of high performance engineering polymer, such as a liquid crystal polymer (LCP) material, which is adhesively joined directly to the base element, with no need for an interposing sidewall as the sidewall function is provided by the base element. Assembly 1600, then, is comprised of an isolated lead frame/base subassembly 1620, and a bolt-down lid 1630. The air cavity 1640 is formed on the underside of bolt-down lid 1630. A round, insulated base structure accommodates many leads inside the air cavity to a round piece of ceramic. In this embodiment, a torque element is located on the foot section at each end of the package assembly.

Figure 17:
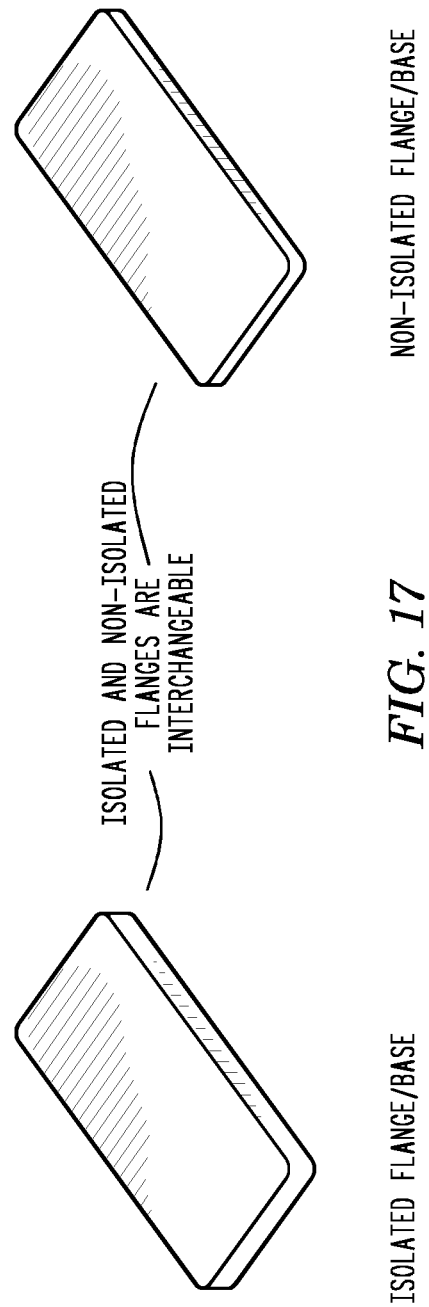
FIGS. 17 and 18 illustrate that bases and sidewalls of the protective modular package assembly are interchangeable, in accordance with various representative embodiments.
Figure 18:
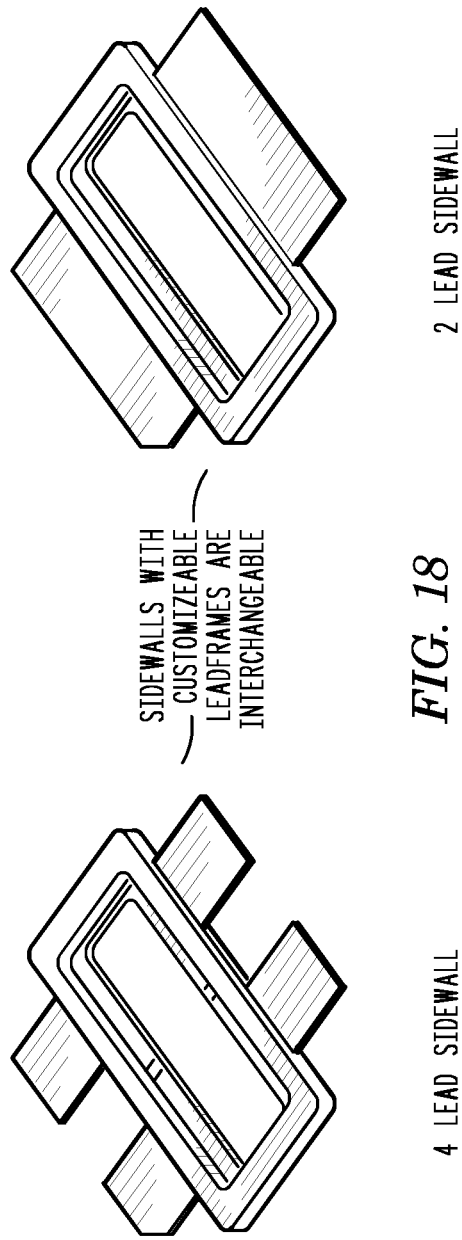

It can be seen from the above description and also with reference to FIGS. 17 and 18, that the modular package assembly described herein accommodates embodiments with both an isolated flange/base and a non-isolated flange/base, as in FIG. 17, and that sidewalls with customizable leadframes are interchangeable so as to accommodate different subassembly configurations, as in FIG. 18.

In contrast to the highly shaped, expensive base material shown in FIGS. 11 and 13, the formed air cavity of FIGS. 12 and 14 provides a simple, relatively inexpensive structure that can accommodate any subassembly package desired. By elimination of the metal flange structure of the prior art, the base can accommodate both isolated and non-isolated infrastructures. The lid cover and sidewalls can be easily interchanged to accommodate many different subassembly package outlines. And, as noted with regard to FIG. 16, in contrast to FIG. 15, no flange is needed.

As used herein in FIGS. 12 and 14, the term base can be isolated or non-isolated and encompasses a variety of terms, including but not limited to, flange, thermal base, thermal plane, High Temperature Co-fired Ceramic (HTCC), Low Temperature Co-fired Ceramic (LTCC), metal or metallic flange, and ceramic flange, and may or may not be electrically insulating, and with or without thermally enhanced layers. The base of a subassembly may be one or more metal layers.

In accordance with various embodiments, a method of manufacturing a protective modular package cover in accordance with a modular design is provided. The protective modular package cover has one or more subassembly receiving sections configured to receive a subassembly of one or more subassemblies and have a cross member formed along the underside of the protective modular package cover. An adhesive layer is selectively applied to the cross member of each subassembly receiving section of the one or more subassembly receiving sections that will receive a subassembly of the one or more subassemblies to form an adhesive layer of the protective modular package cover. The one or more subassemblies in the one or more subassembly receiving sections of the protective modular package cover are seated on the selectively applied adhesive layer to encapsulate them within the protective modular package cover to generate a protected package assembly. Controlled application of a distributed downward clamping force applied to the top surfaces of the one or more subassemblies received by the protective modular package cover is useful for mounting the protected package assembly to a core through activation of one or more fastener elements and the cross members of the subassembly receiving sections. The protected package assembly can be isothermally sealed to create a high reliability joint between the protective modular package cover and the one or more subassemblies encapsulated in the protected package assembly. The isothermal sealing process controls the formation of high reliability joints between layers of the assembly.

Figure 19:
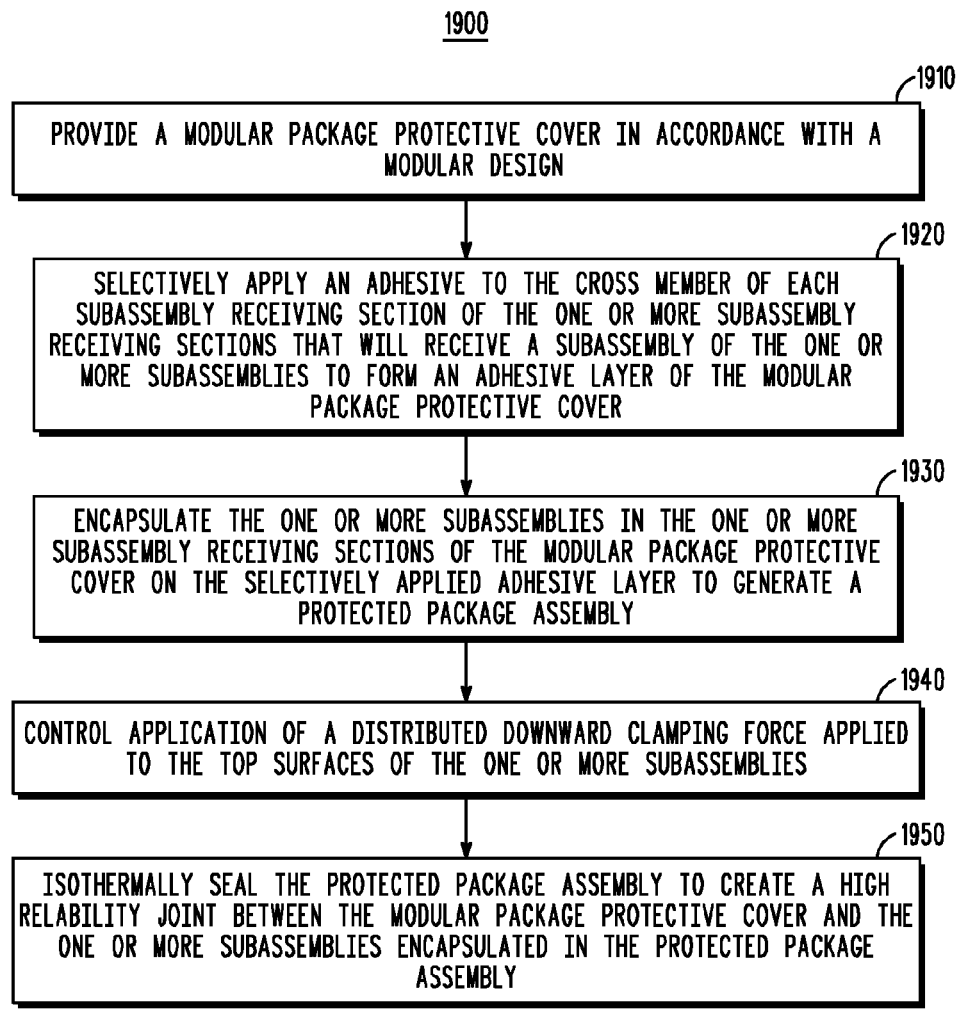
FIG. 19 is a flowchart that illustrates a method of manufacturing a protected package assembly in accordance with various representative embodiments.

Referring now to FIG. 19, a method of manufacturing a protected package assembly in accordance with various embodiments is shown in flow 1900. At Block 1910, a protective modular package cover in accordance with a modular design is provided. The protective modular package cover having one or more subassembly receiving sections configured to receive a subassembly of one or more subassemblies and have a cross member formed along the underside of the protective modular package cover. Next, at Block 1920, an adhesive is selectively applied to the cross member of each subassembly receiving section of the one or more subassembly receiving sections that will receive a subassembly of the one or more subassemblies to form an adhesive layer of the protective modular package cover. At Block 1930, the one or more subassemblies are encapsulated in the one or more subassembly receiving sections of the protective modular package cover on the selectively applied adhesive layer to generate a protected package assembly.

Controlled application of a distributed downward clamping force applied to the top surfaces of the one or more subassemblies received by the protective modular package cover is useful for mounting the protected package assembly to a core through activation of one or more fastener elements and the cross members of the subassembly receiving sections at Block 1940. As previously described, a downward clamping force applied at one or more fastener elements of the protective modular package cover is transferred by one or more torque elements of the one or more fastener elements to a central top portion of the protective modular package cover and distributed as the distributed downward clamping force to the top surfaces of the one or more subassemblies by the cross member of each subassembly receiving section of the one or more subassembly receiving sections. This may further comprise engaging one or more fastener elements at one or more mounting holes of the one or more fastening elements of the protective modular package cover to generate the downward clamping force useful for mounting the protected package assembly to the core, wherein engaging the one or more fastener elements activates one or more torque elements at the one or more mounting holes of the protective modular package cover that transfer the downward clamping force to a central portion of the top of the modular package protected cover where it is distributed as a distributed downward clamping force by the cross member of each subassembly receiving section of the one or more subassembly receiving sections that will receive a subassembly of the one or more subassemblies.

The protected package assembly is isothermally sealed at Block 1950 to create a high reliability joint between the protective modular package cover and the one or more subassemblies encapsulated in the protected package assembly.

The method of FIG. 19 may further include providing the one or more subassemblies to be received by the one or more subassembly receiving sections, wherein each subassembly of the one or more subassemblies is formed by joining a sidewall element of the subassembly to a base element of the subassembly to create an air cavity; and sealing the air cavity of each of subassembly by receiving the one or more subassemblies by the one or more subassembly receiving elements and securing the protective modular package cover to the core. As has been discussed, the sidewall element may be a conductive leadframe injection molded with a high performance engineering polymer, such as a liquid crystal polymer material.

A user/designer may make use of software modeling tools, including two- and three-dimensional CAD tools like Autodesk, to design through user input design data provided to such software tools modular package assemblies of different configurations and dimensions.

Figure 20:
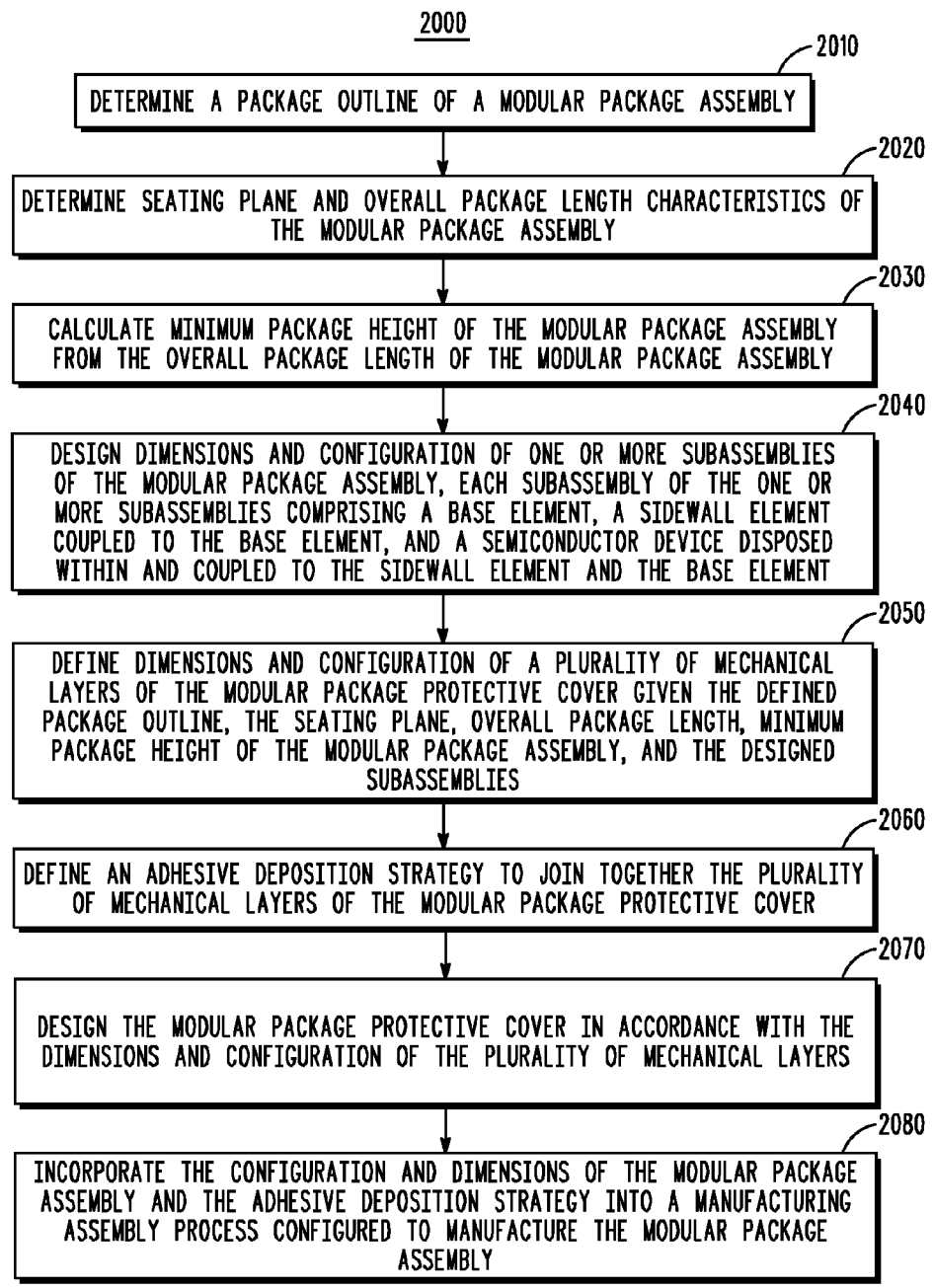
FIG. 20 is a flowchart that illustrates a method of modular package assembly design, in accordance with various representative embodiments.

With regard to the modular design referred to at Block 1910 of FIG. 19, flow 2000 of FIG. 20 discusses this design. At Block 2010, a package outline of a modular package assembly is determined by receiving package outline user input design data at a design tool. The seating plane and overall package length (L) characteristics of the modular package assembly is determined at Block 2020 by receiving seating plane and package length design data at a design tool, and the minimum package height (H) of the modular package assembly is calculated from the overall package length of the modular package assembly contained in the received seating plane and package length user input design data, at Block 2030. A guideline for this calculation can be $H \geq 0.2$ L, for example. This equation can be modified according to the final formulation of molded materials and epoxy adhesives, if desired.

At Block 2040, dimensions and configurations of one or more subassemblies of the modular package assembly are design using subassembly user input design data provided to the design tool. As previously shown, each subassembly of the one or more subassemblies comprises a base element, a sidewall element coupled to the base element, and a semiconductor device disposed within and coupled to the sidewall element and the base element.

Designing the one or more subassemblies may include designing the base element of the one or more subassemblies having an electrical conductivity characteristic and a thermal conductivity characteristic; determining the dimensions of the base element taking into account the electrical conductivity characteristic and the thermal conductivity characteristic of the designed base element; and designing the sidewall element that is coupled to the base element taking into account the electrical conductivity characteristic of the base element, the sidewall element comprising a leadframe element that is electrically coupled to the semiconductor device.

The base, which may be a thermal base, a flange, thermal plane, HTCC, or LTCC, for example, is designed at Block 2040 to support the semiconductor subassemblies to be encapsulated in the assembly. The base is configured to support one or more subassemblies received by one or more subassembly receiving sections of a subassembly support element of a mechanical layer of the plurality of mechanical layers of the protective modular package cover.

The electrical conductivity characteristic of the base element is either non-isolated or isolated, as indicated in FIG. 17. The thermal conductivity characteristic may be a thermal conductivity rating of the base element. The base layer may be one or more layers. The dimensions of the base element comprise the width, length and thickness of the base element, which may be determined by a thermal simulation analysis performed on the base element that takes into account the electrical conductivity characteristic and the thermal conductivity characteristic of the designed base element.

If needed, at Block 2040 one or more injection molded sidewalls for the one or more subassembly receiving sections of the subassembly support element of the protective modular package cover are designed, the one or more injection molded sidewalls configured to receive one or more subassemblies. As previously discussed in connection with FIG. 16, for example, a sidewall is not required to form an air cavity for cavitation of a chip-and-wire subassembly, as the base performs this function. As previously indicated, the sidewall element may be an injection molded sidewall. Moreover, the sidewall element may be a ringframe layer of the one or more subassemblies as shown in several of the drawings.

At Block 2050, the dimensions and configuration of a plurality of mechanical layers of the protective modular package cover given the defined package outline, the seating plane, overall package length, the minimum package height of the modular package assembly, and the designed subassemblies are defined. This may comprise partitioning the desired assembly into three volumes corresponding to the mechanical layers, which may include a fastening element, a subassembly support element having one or more subassembly receiving sections of defined configuration and dimension with each subassembly receiving section having a cross member, and an electrical connections element of the protective modular package cover. The fastening element includes the lid with fastening or bolting features in place of a flange and include the cover (lid). The subassembly support element provides semiconductor device support and may be an air cavity configured to encapsulate a chip-and-wire assembly, in the case of an air cavity subassembly receiving section, or a precision-locating pocket that encapsulated an over-molded subassembly. The electrical connections element consists of wirebond regions or openings through which leads may pass. In the case of a sidewall formed, for example, the electrical connections may be injection molded into an insulating polymer sidewall with layer thickness of approximately 0.3H.

At Block 2060, an adhesive deposition strategy to join together the plurality of mechanical layers of the protective modular package cover is designed. The adhesive deposition strategy is chosen to permanently join together the various mechanical layers of the assembly along bond lines. The bond line features are accordingly incorporated into the mold design. The bond lines may be adjusted as needed to maximize moisture path length and to maximize surface area at the joints between the mechanical layers.

At Block 2070, the protective modular package cover is designed in accordance with the dimensions and configuration of the plurality of mechanical layers as set forth above.

At Block 2080, the configuration and dimensions of the modular package assembly and the adhesive deposition strategy are incorporated into a manufacturing assembly process configured to manufacture the modular package assembly. This may include incorporating the joining steps, including bonding, into an manufacturing assembly line to prepare for manufacturing fixture design changes or for the design of new fixtures if needed to accommodate joining together the mechanical layers of the desired assembly.

Once the modular portions of a modular package assembly have been designed, as shown in FIG. 20, a user may again make use of software modeling tools, including two- and three-dimensional CAD tools like Autodesk, can design through user input design data provided to such software tools modular package assemblies of different configurations and dimensions, all making use of previously designed modules, such as the fastening sections and the subassembly receiving sections of the assembly.

Figure 21:
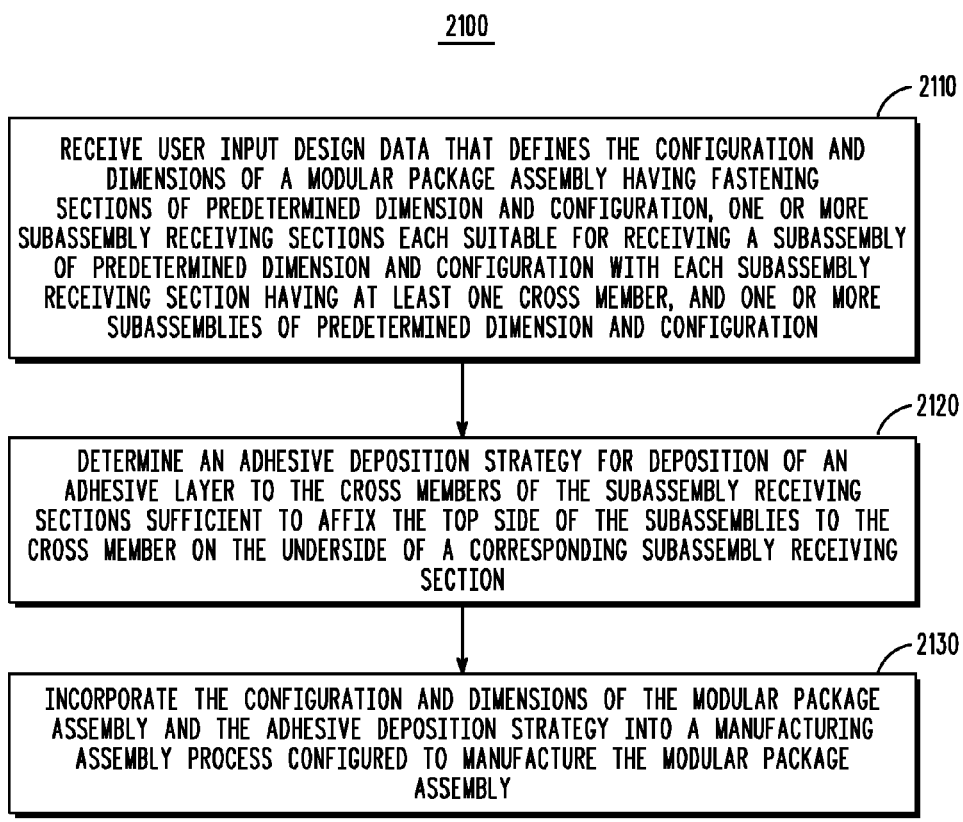
FIG. 21 is a flowchart that illustrates use of user input design data to define configuration and dimension of a modular package assembly design, in accordance with various representative embodiments.

Referring now to flow 2100 of FIG. 21, user input design data that defines the configuration and dimensions of a modular package assembly having fastening sections of predetermined dimension and configuration, one or more subassembly receiving sections each suitable for receiving a subassembly of predetermined dimension and configuration with each subassembly receiving section having at least one cross member, and one or more subassemblies of predetermined dimension and configuration is received at a design tool at Block 2110.

The configuration of the modular package assembly includes a protective modular package cover of user defined dimension and configuration, reflected in the user input design data provided to the design tool. The protective modular package cover has first and second fastening sections of predetermined dimension and configuration, one or more subassembly receiving sections of predetermined dimension and configuration disposed between said first and second fastening sections with each subassembly receiving section of the one or more subassembly receiving sections having a cross member of predetermined dimension and configuration formed along the underside of the protective modular package cover and configured to receive a subassembly, and one or more subassemblies of predetermined dimension and configuration to be received by the one or more subassembly receiving sections. The configuration and dimensions of the modular package assembly are determined by the user defined dimensions of the protective modular package cover, the predetermined dimension and configuration of the one or more subassembly receiving sections, and the predetermined dimension and configuration of the one or more subassemblies. The predetermined dimension and configuration of the one or more subassembly receiving sections accommodate the predetermined dimension and configuration of the one or more subassemblies.

At Block 2120, an adhesive deposition strategy for deposition of an adhesive layer to the cross members of the one or more subassembly receiving sections sufficient to affix the top side of the one or more subassemblies to the cross member on the underside of a corresponding subassembly receiving section of the one or more subassembly receiving sections is determined. The adhesive deposition strategy is a strategy for deposition of an epoxy polymer layer to the cross members of the one or more subassembly receiving sections. At Block 2130, the configuration and dimensions of the modular package assembly and the adhesive deposition strategy are incorporated into a manufacturing assembly process configured to manufacture the modular package assembly.

Figure 22:
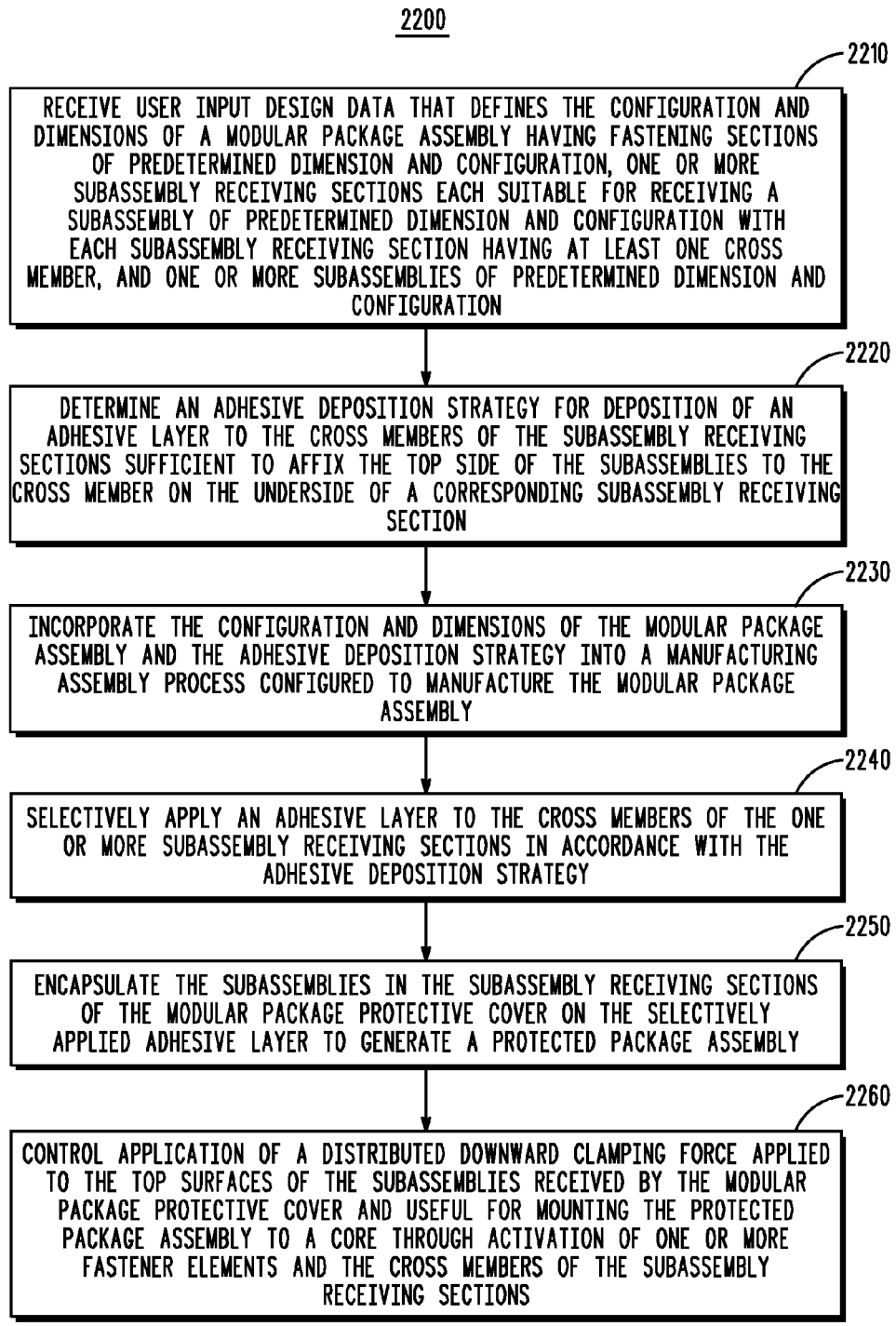
FIG. 22 is a flowchart that illustrates the design and manufacture of a desired modular assembly, in accordance with various representative embodiments.

Referring to FIG. 22, flow 2200 recites a method for design and manufacture of a desired modular assembly. As below, at Block 2210, input design data to an input interface of a design tool defines the configuration and dimensions of a modular package assembly. User input design data that defines the configuration and dimensions of a modular package assembly having fastening sections of predetermined dimension and configuration, one or more subassembly receiving sections each suitable for receiving a subassembly of predetermined dimension and configuration with each subassembly receiving section having at least one cross member, and one or more subassemblies of predetermined dimension and configuration is received. The predetermined dimension and configuration of the one or more subassembly receiving sections accommodate the predetermined dimension and configuration of the one or more subassemblies. At Block 2220, an adhesive deposition strategy for deposition of an adhesive layer to the cross members of the one or more subassembly receiving sections sufficient to affix the top side of the one or more subassemblies to the cross member on the underside of a corresponding subassembly receiving section of the one or more subassembly receiving sections is determined. At Block 2230, the configuration and dimensions of the modular package assembly and the adhesive deposition strategy are incorporated into a manufacturing assembly process configured to manufacture the modular package assembly. Next, at Block 2240, the adhesive layer is selectively applied to the cross members of the one or more subassembly receiving sections in accordance with the adhesive deposition strategy.

At Block 2250, the one or more subassemblies are encapsulated in the one or more subassembly receiving sections of the protective modular package cover on the selectively applied adhesive layer to generate a protected package assembly. At Block 2260, controlled application of a distributed downward clamping force applied to the top surfaces of the one or more subassemblies received by the protective modular package cover and useful for mounting the protected package assembly to a core through activation of one or more fastener elements and the cross members of the subassembly receiving sections occurs.

Modification of a given design can occur after the modules of an assembly have been specified and this flexibility is one of the advantages to the approach. This is reflected in FIGS. 23 and 24.

Figure 23:
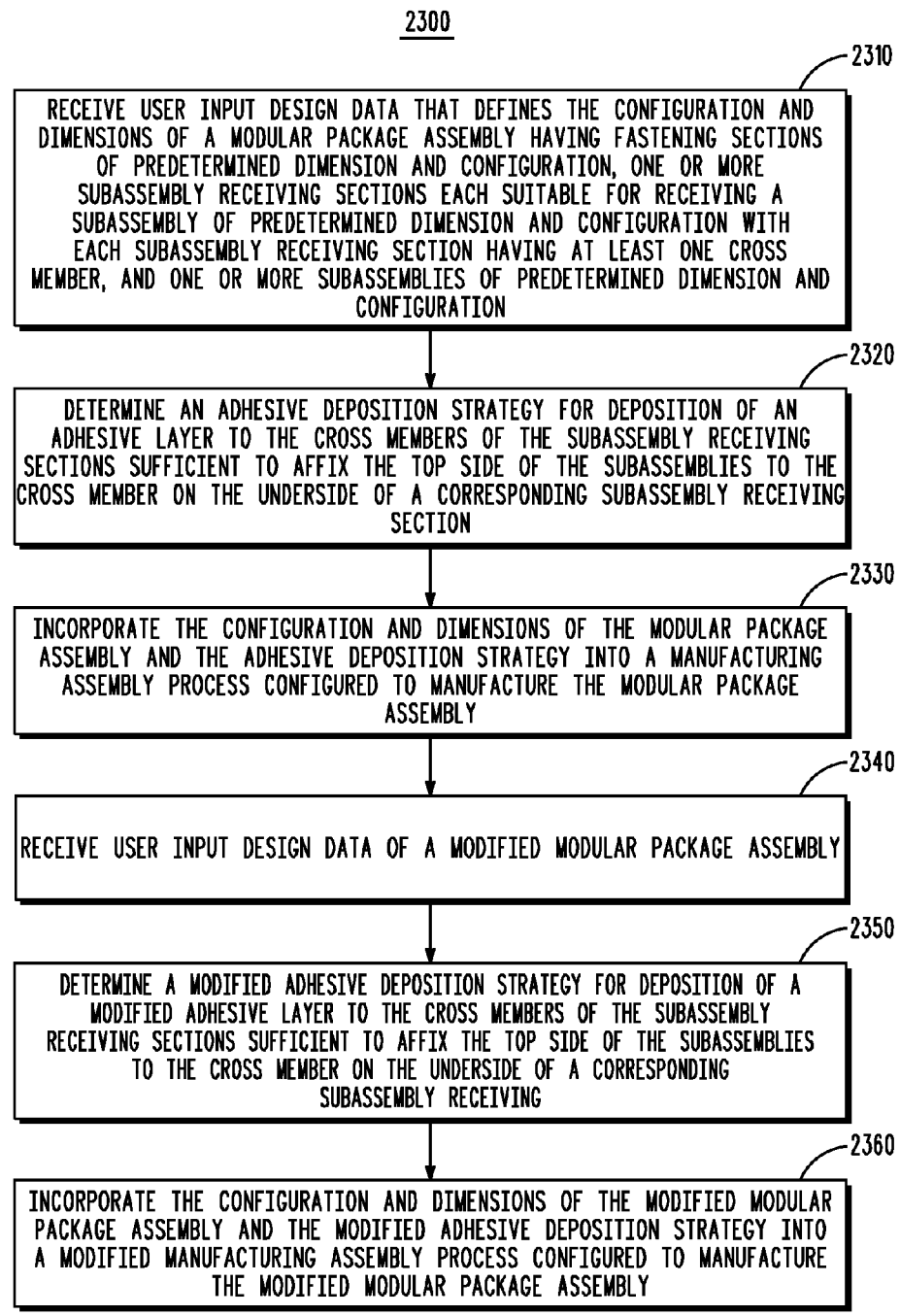
FIG. 23 is a flowchart that provides for the modification of the design of a modular assembly, in accordance with various representative embodiments.

Referring now to flow 2300 of FIG. 23, at Block 2310 user input design data is received at the design tool that defines the configuration and dimensions of a modular package assembly having fastening sections of predetermined dimension and configuration, one or more subassembly receiving sections each suitable for receiving a subassembly of predetermined dimension and configuration with each subassembly receiving section having at least one cross member, and one or more subassemblies of predetermined dimension and configuration. The predetermined dimension and configuration of the one or more subassembly receiving sections accommodate the predetermined dimension and configuration of the one or more subassemblies. At Block 2320, an adhesive deposition strategy for deposition of an adhesive layer to the cross members of the one or more subassembly receiving sections sufficient to affix the top side of the one or more subassemblies to the cross member on the underside of a corresponding subassembly receiving section of the one or more subassembly receiving sections is determined. At Block 2330, the configuration and dimensions of the modular package assembly and the adhesive deposition strategy into a manufacturing assembly process configured to manufacture the modular package assembly are incorporated. At Block 2340, design input data of a modified modular package assembly is received. The configuration and dimensions of the modified modular package assembly are different from the configuration and dimensions of the modular package assembly but the predetermined dimensions of first and second fastening sections and of one or more subassembly receiving sections of the modified modular package assembly remain unchanged from the modular package assembly. At Block 2350, a modified adhesive deposition strategy for deposition of a modified adhesive layer to the cross members of the one or more subassembly receiving sections sufficient to affix the top side of the one or more subassemblies to the cross member on the underside of a corresponding subassembly receiving section of the one or more subassembly receiving sections for the modified modular package assembly is determined. The configuration and dimensions of the modified modular package assembly and the modified adhesive deposition strategy are incorporated into a modified manufacturing assembly process configured to manufacture the modified modular package assembly at Block 2360.

Figure 24A:
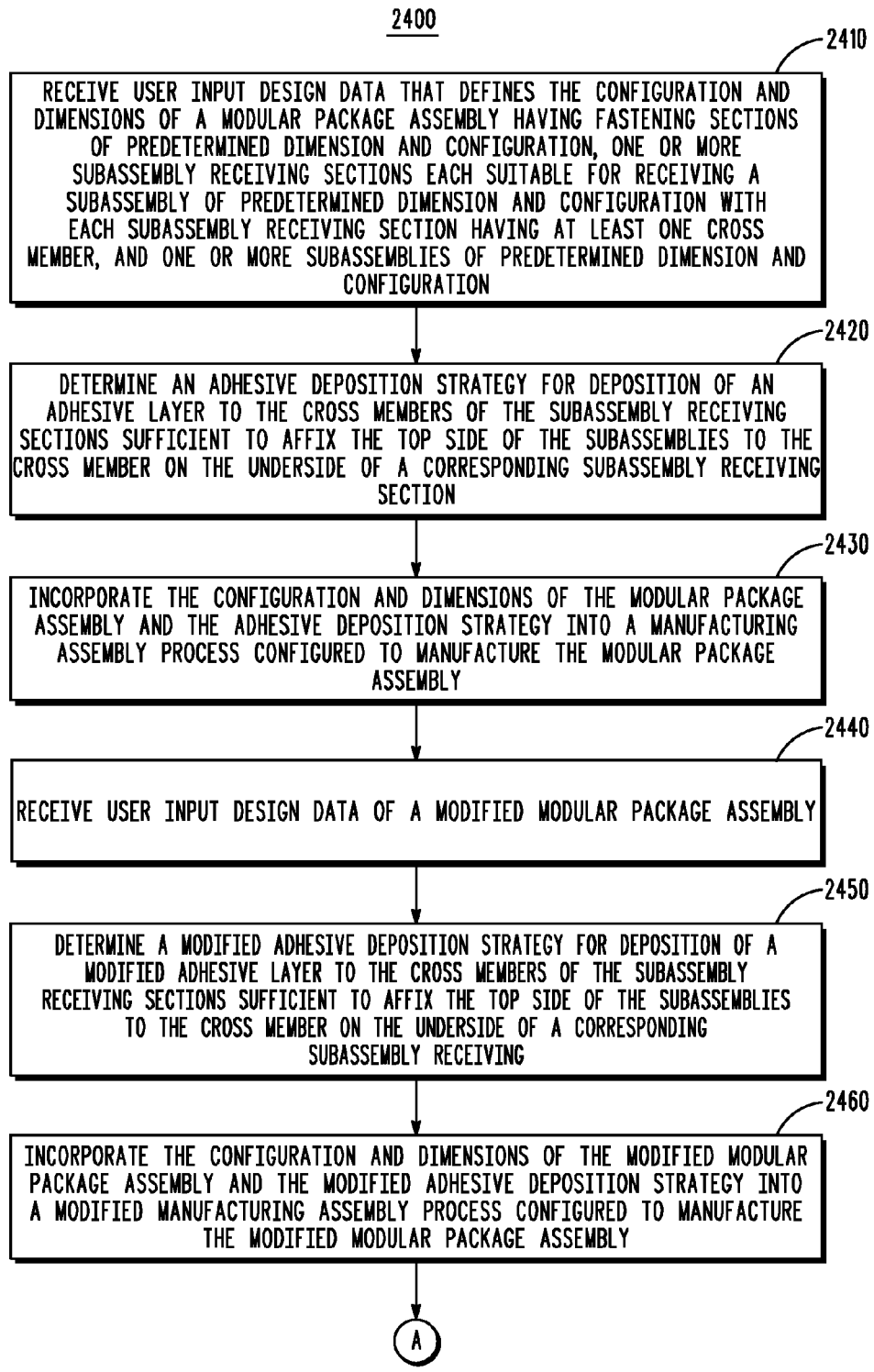
FIG. 24 is a flowchart that provides for the modification of the design and manufacture of a modular assembly, in accordance with various representative embodiments.
Figure 24B:
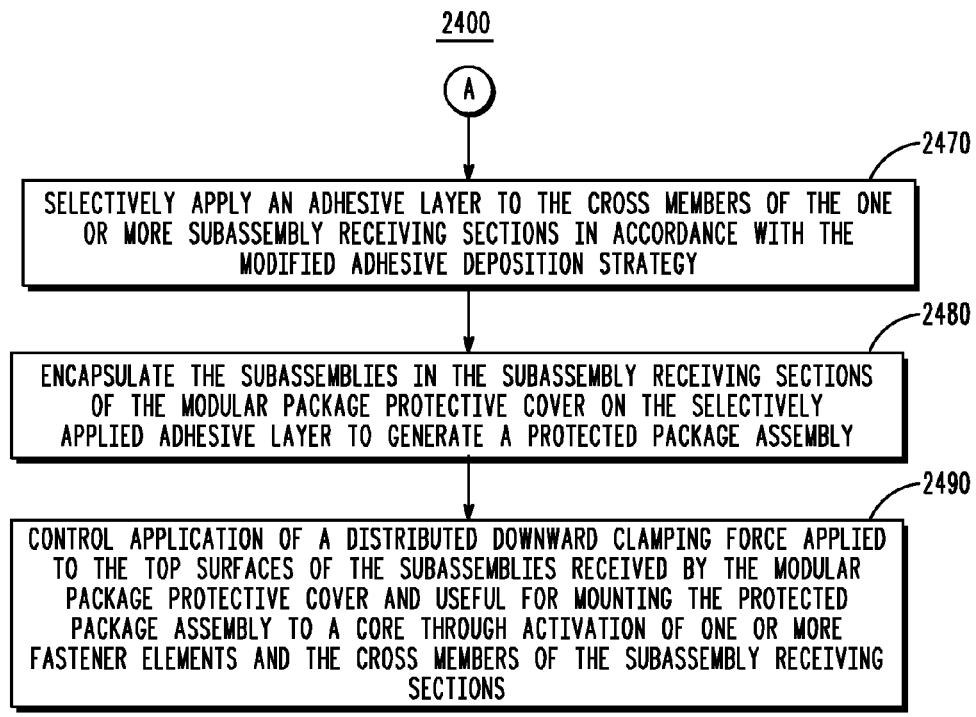

Flow 2400 of FIG. 24 provides for the modified design of the modular assembly and subsequent manufacturing thereof. At Block 2410, user input design data is received at the user interface of a design tool that defines the configuration and dimensions of a modular package assembly having fastening sections of predetermined dimension and configuration, one or more subassembly receiving sections each suitable for receiving a subassembly of predetermined dimension and configuration with each subassembly receiving section having at least one cross member, and one or more subassemblies of predetermined dimension and configuration. The predetermined dimension and configuration of the one or more subassembly receiving sections accommodate the predetermined dimension and configuration of the one or more subassemblies. At Block 2420, an adhesive deposition strategy for deposition of an adhesive layer to the cross members of the one or more subassembly receiving sections sufficient to affix the top side of the one or more subassemblies to the cross member on the underside of a corresponding subassembly receiving section of the one or more subassembly receiving sections is determined. At Block 2430, the configuration and dimensions of the modular package assembly and the adhesive deposition strategy are incorporated into a manufacturing assembly process configured to manufacture the modular package assembly. At Block 2440, user input design data of a modified modular package assembly is received at the user interface of a design tool. The configuration and dimensions of the modified modular package assembly are different from the configuration and dimensions of the modular package assembly but the predetermined dimensions of first and second fastening sections and of one or more subassembly receiving sections of the modified modular package assembly remain unchanged from the modular package assembly. At Block 2450, a modified adhesive deposition strategy for deposition of a modified adhesive layer to the cross members of the one or more subassembly receiving sections sufficient to affix the top side of the one or more subassemblies to the cross member on the underside of a corresponding subassembly receiving section of the one or more subassembly receiving sections for the modified modular package assembly is determined. The configuration and dimensions of the modified modular package assembly and the modified adhesive deposition strategy is incorporated into a modified manufacturing assembly process configured to manufacture the modified modular package assembly at Block 2460. An adhesive layer is selectively applied to the cross members of the one or more subassembly receiving sections in accordance with the modified adhesive deposition strategy at Block 2470. At Block 2480, one or more subassemblies are encapsulated in the one or more subassembly receiving sections of the protective modular package cover on the selectively applied adhesive layer to generate a protected package assembly. Finally, at Block 2490, controlled application of a distributed downward clamping force is applied to the top surfaces of the one or more subassemblies received by the protective modular package cover and useful for mounting the protected package assembly to a core through activation of one or more fastener elements and the cross members of the subassembly receiving sections.

Figure 25:
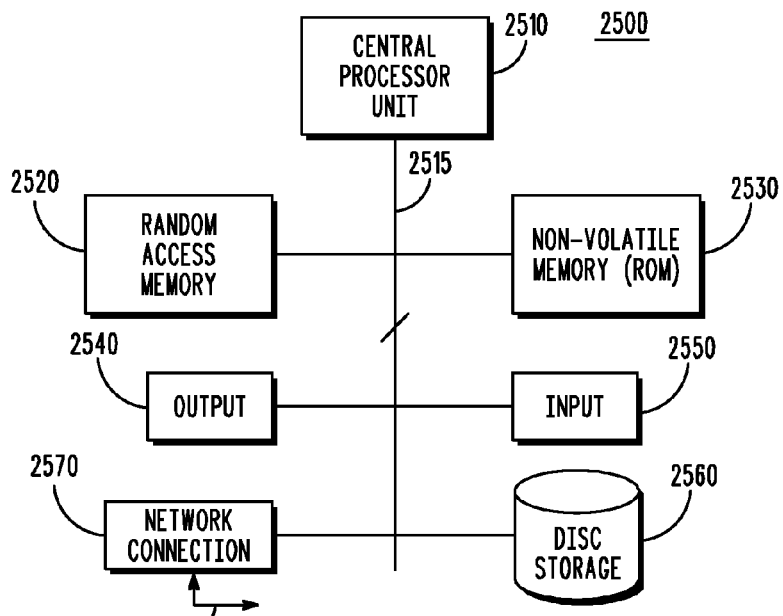
FIG. 25 is a block diagram of a computer system suitable for use in realizing certain blocks of FIGS. 19-24 in a manner consistent with certain representative embodiments.

The processes and methodologies previously described and as will be described below can be carried out on a programmed general purpose computer system, such as the exemplary computer system 2500 depicted in FIG. 25. Examples of such a programmed general purpose computer system may be a software modeling tool, including two- and three-dimensional CAD tools like Autodesk, which can design through user input design data provided to an interface of the tool. Computer System 2500 has a central processor unit (CPU) 2510 with an associated bus 2515 used to connect the CPU 2510 to Random Access Memory (RAM) 2520 and/or Non-Volatile Memory (NVM) 2530 in a known manner. An output mechanism at 2540 may be provided in order to display and/or print output for the computer user. Similarly, input devices such as keyboard and mouse 2550 may be provided for the input of information by the computer user. Computer 2500 may also have disc storage 2560 for storing large amounts of information including, but not limited to, program files and data files. Computer system 2500 may also be coupled to a local area network (LAN) and/or wide area network (WAN) and/or the Internet using a network connection 2570 such as an Ethernet adapter coupling computer system 2500, possibly through a fire wall. The exact arrangement of the components of FIG. 25 will depend upon the function carried out in the particular components shown. Additionally, the network connection 2570 and network interface may depend upon whether the associated components are situated locally or remotely, with data passing to and from the processor system 2500 via line 2580.

In accordance with further exemplary embodiments consistent with a modular, low stress package technology, an improvement that provides a number of advantages, including lower material costs, enhanced thermal resistance characteristics, simplified assembly (no die attach), and enhanced opportunities for improved usage of available semiconductor silicon, is provided. For purposes of material cost reduction and to eliminate certain material constraints, the previously described base and/or flange layer is eliminated and replaced by a semiconductor substrate base element that has, by design, integrated semiconducting members or elements, such as a silicon wafer having a large number of semiconductor structures, microchips, one or more laterally diffused metal oxide field effect transistors, etc. The semiconductor substrate base element may be singulated in accordance with industry techniques to a size that corresponds to the modular outlines of the modular package assembly previously discussed. A base surface of the semiconductor substrate base element, which is the base of a semiconductor subassembly formed by joining the semiconductor substrate base element, can be isolating or non-isolating depending on the design intent or needs of a particular application, thereby eliminating the need for the previously described and separate base element. In this manner, a potentially costly flange/base material is completely eliminated.

Moreover, deletion of the flange/base eliminates the need for rigorous material studies and corresponding limitations due to thermal interactions of components that make up the semiconductor subassembly. Now that the semiconductor subassembly is comprised of a modular sidewall element having modular dimensions (in both size and shape) that accommodates placement of the semiconductor subassembly in a modular layout, and a semiconductor substrate base element coupled to the modular sidewall element, with the semiconductor substrate base element having at least one semiconductor element with a layout sized to be accommodated by modular dimensions of the modular sidewall element and the semiconductor substrate base element configured to form a base of the semiconductor subassembly, the semiconductor subassembly is in effect the semiconductor chip itself. In addition, sizing the semiconductor subassembly to fit the modular packages described herein provides for additional functionality to be incorporated directly onto the semiconductor substrate base element itself, as will be shown. Thus product value is enhanced without substantially increasing cost. For example, temperature tracking elements or passive components such as resistors, capacitors, and inductors may be integrated directly onto the semiconductor substrate base element using standard photolithography and fabrication techniques.

The semiconductor substrate base element can consist of a host wafer such as silicon (Si), silicon carbide (SiC), Sapphire, or any such substrate that is known in the microelectronic community. For example, a number of power semiconductor junctions fabricated within an epitaxial layer of a silicon substrate forms a laterally diffused metal oxide field effect transistor (LDMOSFET) having extremely high power density and being capable of amplifying radio frequency (RF) signals with high efficiency. It is noted that the improvements are applicable to a broad range of power applications, including, for example, macro, micro, nano, pico, and femto cell applications. Such applications may include private mobile radio (PMR) products and pulsed applications. Sample power applications may be 40 W, 70 W, 75 W, 80 W, and 150 W, for example.

Referring now to FIG. 26, it can be seen that as previously described, discrete semiconductor chips 2620 attached to (sat on) the base element 2610 of a subassembly and were not integral with the base. This contrasts with FIG. 27 in which a modular package assembly makes use of a semiconductor substrate base element 2710, with a base surface (on the underside) 2720 that eliminates the need for the previously described, separate base element 1210. The semiconductor substrate base element 2710 therefore has a base surface that provides an electrical conductivity characteristic that may be either non-isolated or isolated.

Whereas a protective package cover has been previously described and can be used in one's modular package design, it is not required. The semiconductor subassembly formed by joining ringframe/sidewall 1220 to semiconductor substrate base element 2710 may itself be mounted directly to a core, such as a heat sink, heat sinking core, heat spreading core, a thermal base, or base plate as previously described. The base surface 2720, which may be isolated or non-isolated, allows this semiconductor subassembly to be coupled to the core. The modular sidewall element 1220 has modular dimensions that accommodate placement of the semiconductor subassembly in a modular layout. Semiconductor substrate base element 2710, coupled to the modular sidewall element in the semiconductor subassembly, has at least one semiconductor element with a layout sized to be accommodated by modular dimensions of the modular sidewall element.

As previously described, the modular sidewall element may be an injection molded sidewall, a ringframe layer of the semiconductor subassembly, or a leaded sidewall.

Figure 28:
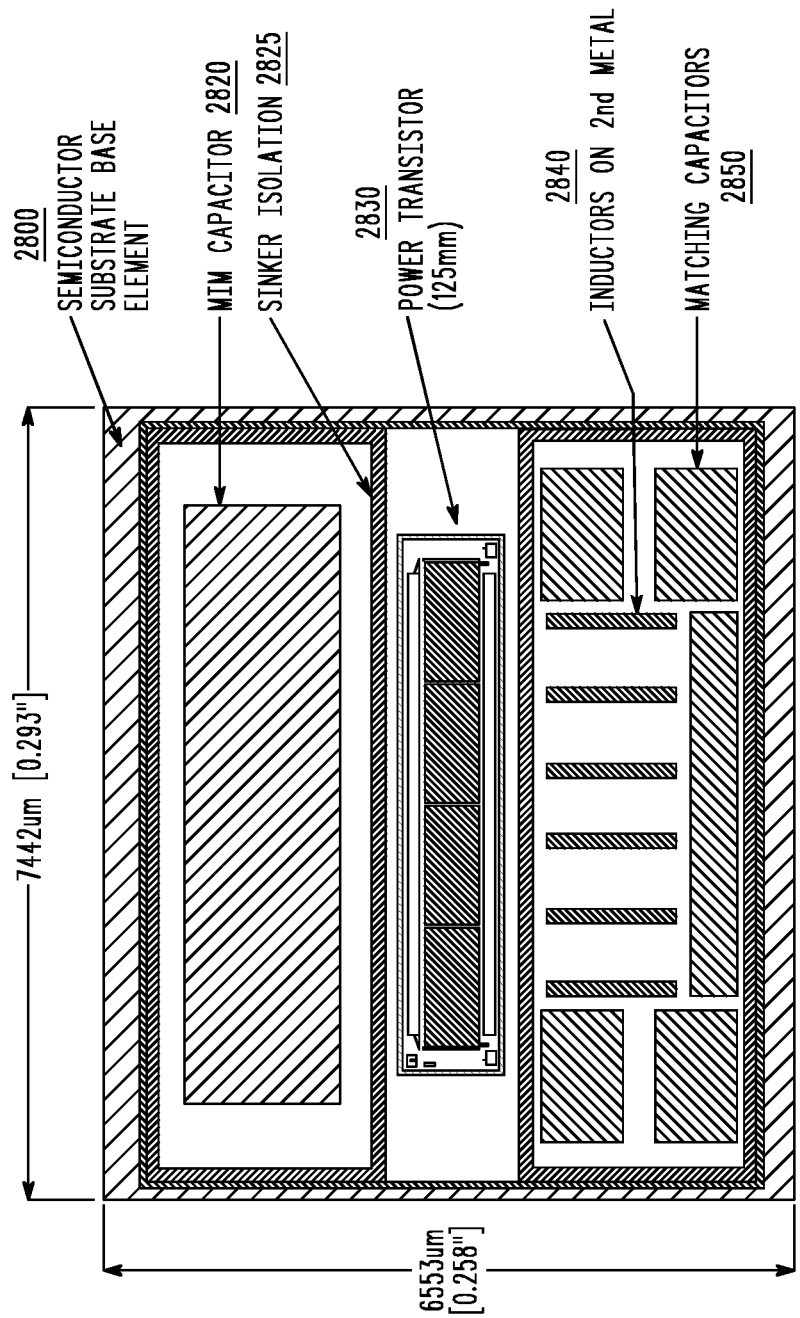
FIG. 28 illustrates a layout of an integrated power transistor circuit that does not make optimal use of semiconductor silicon available.

Referring now to FIG. 28, an integrated power transistor circuit is designed to fit into an existing non-modular package having a size limited to 7100 um×5850 um. The semiconductor substrate base element 2800 has MIM Capacitor 2820, power transistor (125 mm) 2830, inductors on a second metal layer 2840 with matching capacitors 2850. Also shown is sinker isolation region 2825.

Figure 29:
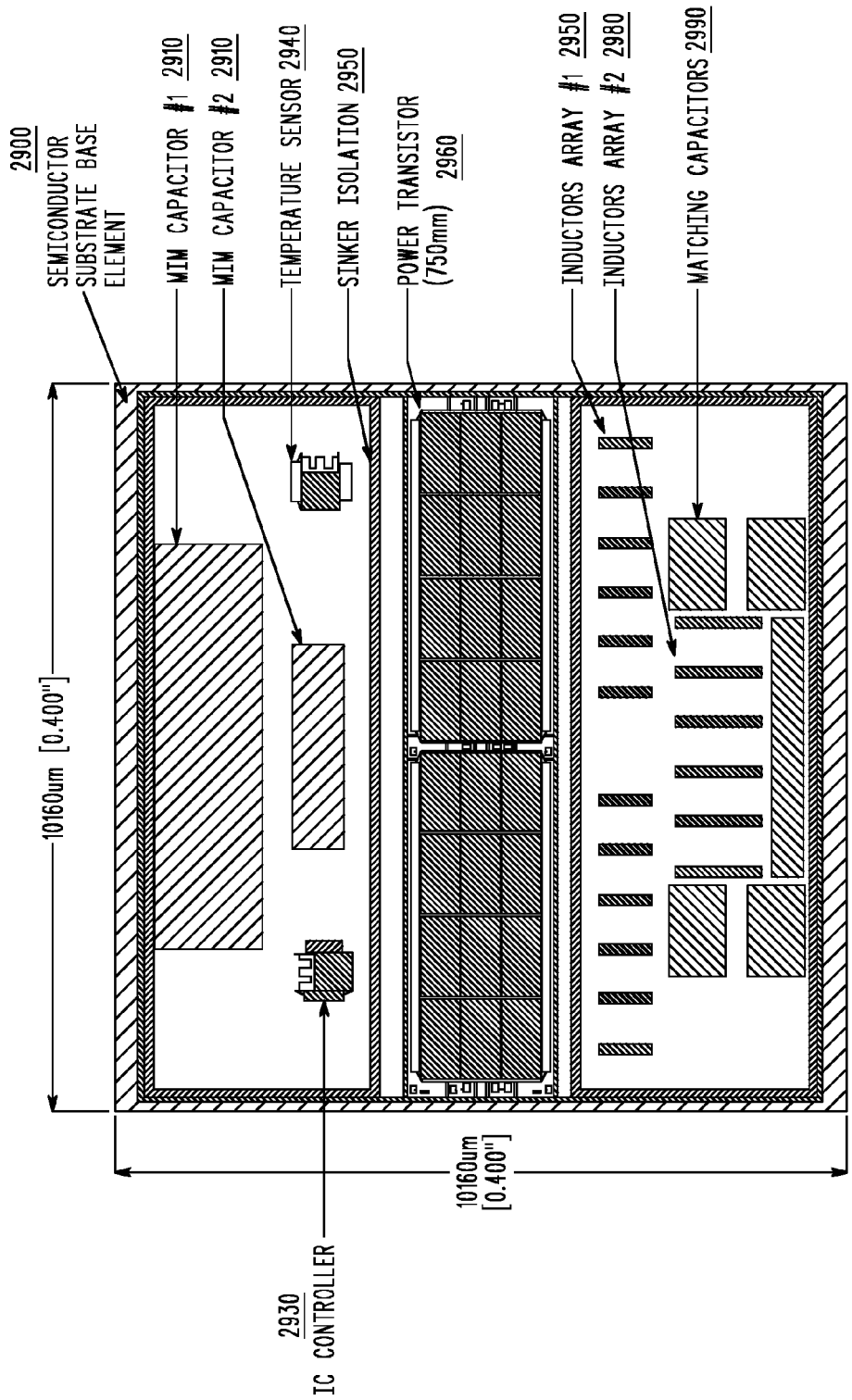
FIG. 29 illustrates a layout of an integrated power transistor circuit that makes improved use of available semiconductor silicon, in accordance with various embodiments described herein.

Contrast this integrated power transistor circuit with that of semiconductor substrate base element 2900 of FIG. 29, which has a layout to accept the modular sidewall 1220 and leadframe element 1225, for example. The larger layout size of 10 mm^2 in this example can accommodate additional features, such as additional passive or active devices. This is clearly shown in the side of power transistor section 2960, which is now 750 mm, as opposed to the 125 mm size in FIG. 28. Also shown in the addition of more capacitor elements, MIM Capacitor #1 2910, MIM Capacitor #2 2920, IC controller 2930, temperature sensor 2940. Additionally, there are two inductor arrays now, inductor array #1 2970 and inductor array #2 2980, as well as matching capacitors 2990. Also shown is sinker isolation region 2820. In this example, both additional passive elements (capacitors and inductors) and active elements (IC controller, temperature sensor, larger power transistor) are provided in the increased silicon real estate available with the larger modular layout.

Figure 30:
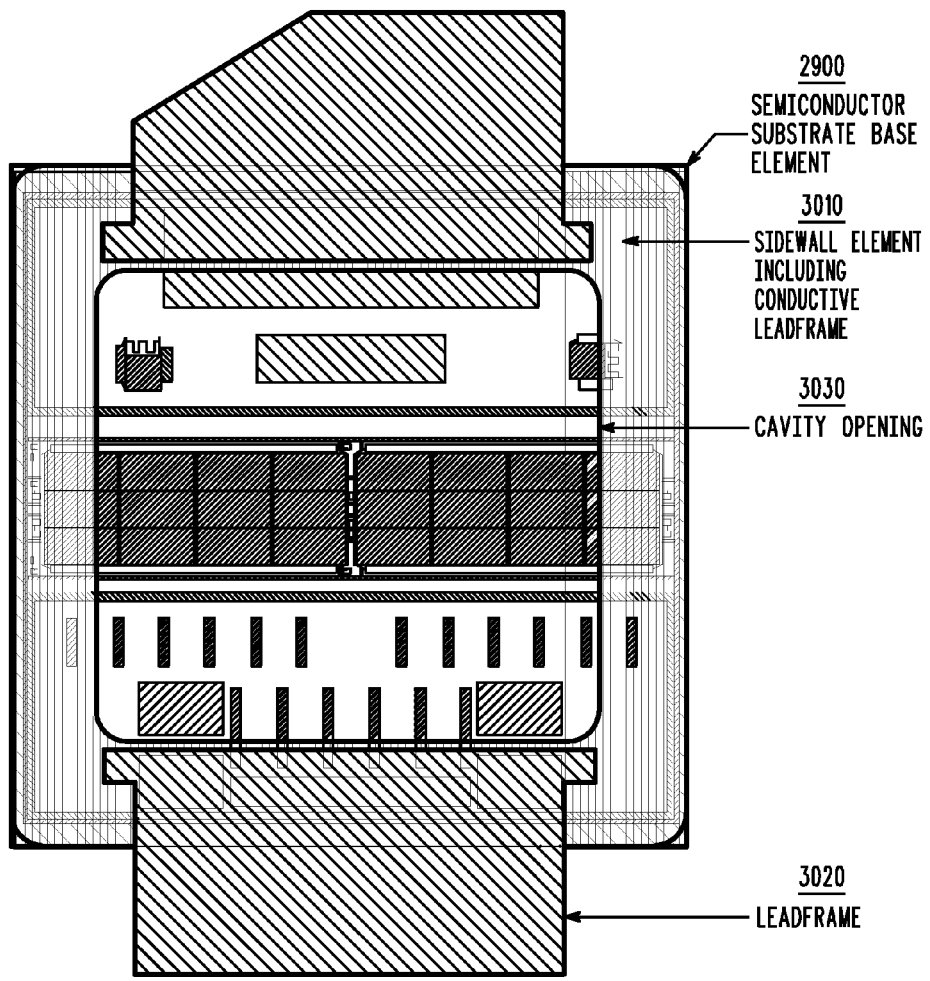
FIG. 30 illustrates a layout of a semiconductor subassembly including an integrated power transistor circuit and a modular sidewall element, in accordance with various embodiments described herein.

FIG. 30 illustrates semiconductor subassembly 3000 formed by joining together semiconductor substrate base element 2900 with sidewall element 3010, including conductive leadframe 3020. Sidewall element 3010 is attached to the semiconductor substrate base element 2900 forming a semiconductor subassembly. The semiconductor subassembly could be captured by a boltdown cover, a lid, filled with gel, or left open so that internal changes may be made to the internal circuitry of the at least one semiconductor element of semiconductor substrate base element 2900. Not using a protective modular package cover or lid (such as a boltdown cover or non-boltdown cover), means that the cavity opening 3030 formed in the sidewall element leaves the semiconductor element(s) accessible; again, the opening may be filled with gel or not. If a protective modular package cover is used, gel may be used to fill the cavity prior to placing the lid or cover on the semiconductor subassembly.

Where the modular sidewall element is joined to the semiconductor substrate base element creates an air cavity that is sealed by receipt of the subassembly by a subassembly receiving section of the protective modular package cover and securing the protective modular package cover to a modular package assembly. The modular sidewall element may be a leaded sidewall or an injection molded sidewall. The modular sidewall element may be a ringframe layer of the semiconductor subassembly.

Referring now to FIGS. 31A-31C, the use of strategic singulation in order to achieve best use of available semiconductor substrate modular layout space is illustrated. In FIG. 31A, the semiconductor substrate base element 3100 is comprised of two transistors 3110 and 3120 as shown. In FIG. 31B, these two transistors of the semiconductor substrate base element are accommodated in the sidewall element 3130, which has cavity opening 3145 and leadframe 3140, to form a semiconductor subassembly as shown. The wafer 3150 simulation illustrated in FIG. 31C is a simulation of quantity of dual chips expected per wafer; in an example implementation, the number of chips is 361.

Contrast FIGS. 31A-31C with FIGS. 32A-32C, in which strategic singulation results in a much improved number of chips per wafer. In FIG. 32A, at wafer level, the semiconductor is diced as indicated by cut line 3210 to render a single transistor chip 3220 in FIG. 32B. This transistor is joined with modular sidewall element 3230 having cavity opening 3245 and leadframe 3240 to form a semiconductor subassembly in FIG. 32C. In FIG. 32D, it can be seen that the simulation of quantity of single chips per wafer is 747 in this example.

The semiconductor substrate may itself be mounted directed to a core, as shown by semiconductor assembly 3500, an open cavity package, in FIG. 35. Again, the semiconductor substrate base element with embedded transistor or other semiconductor element(s) 3510 is joined to modular sidewall 3520 and leadframe 3540. Cavity 3530 in modular sidewall 3520 permits access to the semiconductor element(s) of semiconductor substrate base element 3510.

Conversely, the semiconductor subassembly may be protected by a protective modular package cover, previously described. In FIG. 33, a protective modular package cover 3300 is shown affixed to the semiconductor subassembly providing protection to the cavity and thus forming a non-boltdown package 3330 that protects the semiconductor substrate base element 3340. Package leadframe 3320 is also shown. In FIG. 34, a modular package assembly illustrates a boltdown package 3400 that has a semiconductor substrate base element 3430 protected by boltdown lid 3410, bolted down by bolts 3420, thus forming a boltdown package. Package leadframe 3450 is also shown.

The bottom base surface of each of the respective semiconductor substrate base elements 3340, 3430, and 3560 of FIGS. 33, 34, and 35, respectively, may ultimately be jointed to a core or an adhesive layer.

It can be seen that the protective modular package cover previously described and shown in connection with FIGS. 1-10, for example, can be used to house and protective the semiconductor subassembly. Thus, the protective modular package cover that covers the semiconductor subassembly may have first and second fastening sections located at opposing first and second ends of the protective modular package cover, having one or more torque elements disposed on one or more of the first and second ends, and configured to fasten the protective modular package cover to the core; and one or more subassembly receiving sections disposed between the first and second fastening sections and each subassembly receiving section of the one or more subassembly receiving sections adapted to receive one or more semiconductor subassemblies, wherein each subassembly receiving section of the one or more subassembly receiving sections comprises a cross member formed along the underside of the protective modular package cover. Further, the one or more subassembly receiving sections may have one or more precision locating pockets of the protective modular package cover configured to receive one or more overmolded semiconductor subassemblies. An adhesive layer configured to affix the one or more semiconductor subassemblies to respective subassembly receiving sections of the one or more subassembly receiving sections may be present, with the torque elements of the first and second fastening sections are configured to transfer a downward clamping force generated at the first or second fastening elements to a top surface of one or more semiconductor subassemblies disposed in the one or more subassembly receiving sections via the cross member of each of the one or more subassembly receiving sections.

As previously described, activation of the one or more torque elements transfers the downward clamping force to a central portion of the top of the protective modular package cover and generates a distributed downward clamping force that is distributed by the cross member of each of the one or more subassembly receiving sections from the central portion of the top of the protective modular package cover to the top surface of the one or more subassemblies disposed in the one or more subassembly receiving sections. Sufficient activation of the one or more torque elements mounts the protective modular package cover to the heat sink. The distributed downward clamping force may be generated by activation of the one or more torque elements by insertion of a fastener in a mounting hole of the first or second fastening sections and engagement of the one or more torque elements by the fastener.

With regard to the subassembly receiving section(s), the cross member may further include a lateral cross member and a transverse cross member formed along the underside of the protective modular package cover, a lateral cross member, which may be formed by two or more lateral cross members. Also, with regard to the subassembly receiving section(s), two or more subassembly receiving sections of the protective modular package cover may be separated by one or more internal support members. Further, the subassembly receiving sections may be formed within an underside of the protective modular package cover.

The subassembly receiving sections of the protective modular package cover may be separated by first and second skirt elements formed along first and second sides of the protective modular package cover, where an adhesive layer is formed contiguous the first and second skirt elements. A first fastening section may include a first foot located on a bottom surface of the first fastening section at the first end of the protective modular package cover and configured to make contact with the heat sink, a first torque element disposed on the first foot adjacent the outer edge of the first end of the protective modular package cover, a first mounting hole that extends through the first fastening section from a top surface of the first fastening section to the bottom surface of the first fastening section, is coupled to the first torque element, and is configured to receive a first fastener therein. A second fastening section may be likewise configured.

The semiconductor substrate base element has both an electrical conductivity characteristic and a thermal conductivity characteristic. As previously discussed, the base surface 2720 of the semiconductor substrate base element may be either non-isolated or isolated. The thermal conductivity characteristic is a thermal conductivity rating Rth of the semiconductor substrate base element. Obviously, eliminating a separate base element has a positive impact on the Rth rating of a semiconductor subassembly and/or a modular package assembly that incorporates a semiconductor subassembly. Moreover, due to extreme flatness and low roughness, the interface between the base surface of the semiconductor substrate base element and the heat sink (core) will be a very high performance, low thermal resistance contact. Thus, in addition to gaining more semiconductor real estate by utilizing modular, predefined semiconductor substrate base dimensions that marry with the dimensions of a modular sidewall, a lower Rth is experienced as well. In testing, Rth values of 0.45 K/W or even 0.35 K/W have been achieved using the semiconductor substrate base approach.

The thermal conductivity of semiconductor substrates can be influenced in several ways. The substrate may be bonded to a host wafer of well known materials whose thermal conductivity is known. Or, an epitaxial layer may be formed on the substrate. Examples of these approaches are silicon-on-sapphire and gallium nitride (GaN) on silicon carbide (SiC) and GaN on silicon (Si). The epitaxial layers can also consist of materials with various thermal conductivities. A third approach is to introduce various types and levels of impurities (dopants) into the semiconductor substrate. As an example, it is known that purifying silicon by removing isotopes such as Si29 and Si30 substantially increases the thermal conductivity of substrate. Also, by introducing dopants into a silicon substrate or silicon epitaxial layer, such as in the exemplifying embodiments of a laterally diffused metal oxide field effect transistor (LDMOS FET), the thermal conductivity of the substrate is lowered. A fourth approach to control the thermal characteristics of the substrate may be mechanical in nature, such as determining the substrate thickness and by design of the locations of any active devices formed in the substrate by known semiconductor process techniques. Thus, there are several approaches available to control the thermal conductivity of the semiconductor substrate.

Likewise, and in similar ways to how the thermal conductivity of the semiconductor substrate can be affected, the electrical conductivity of the semiconductor substrate can also be controlled. During the design phase a balance between electrical and thermal properties of the substrate must be considered such that the final performance objectives of the final component are achieved.

Figure 36:
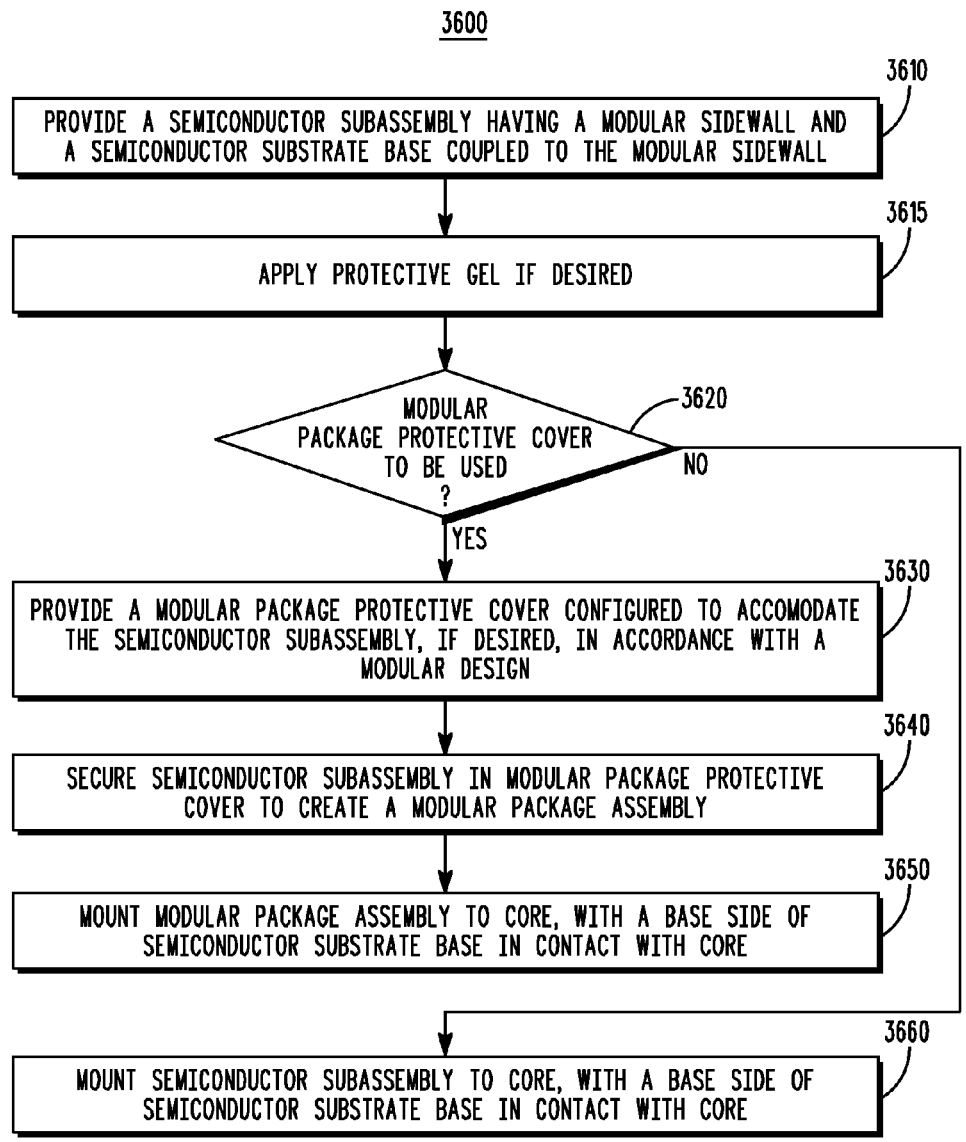
FIG. 36 is a flowchart that illustrates a method of manufacturing a protected package assembly using semiconductor substrate base element(s), in accordance with various representative embodiments.

With respect to a method of manufacture using the semiconductor substrate base element, reference is made to flow 3600 of FIG. 36. At Block 3610, a semiconductor subassembly in accordance with a modular design is provided; the semiconductor subassembly has the semiconductor substrate base element and sidewall element. The semiconductor subassembly has a modular sidewall element of modular dimensions that accommodates placement of the semiconductor subassembly in a modular layout and a semiconductor substrate base element coupled to the modular sidewall element that has at least one semiconductor element with a layout sized to be accommodated by modular dimensions of the modular sidewall element. At Block 3615, protective gel may be applied to protect the semiconductor elements(s) of the semiconductor substrate base element if so desired. A protective gel may be applied later in the process, such as in connection with using a package protective cover or lid, if desired.

At Decision Block 3620, the inquiry is whether a modular package protective cover is to be used. If no, then the semiconductor subassembly may be mounted to the core, with a base side of the semiconductor substrate base element in contact with the core, at Block 3660. If a protective cover or lid is to be used, then the flow continues to Block 3630, where a modular package protective cover configured to accommodate the semiconductor subassembly, if desired, is provided in accordance with a modular design. At Block 3640, the semiconductor subassembly is secured in the modular package protective cover to create a modular package assembly. Next, the formed modular package assembly is mounted to the core, in practice, by a user, with a base side of semiconductor substrate base in contact with core at Block 3650.

Figure 37:
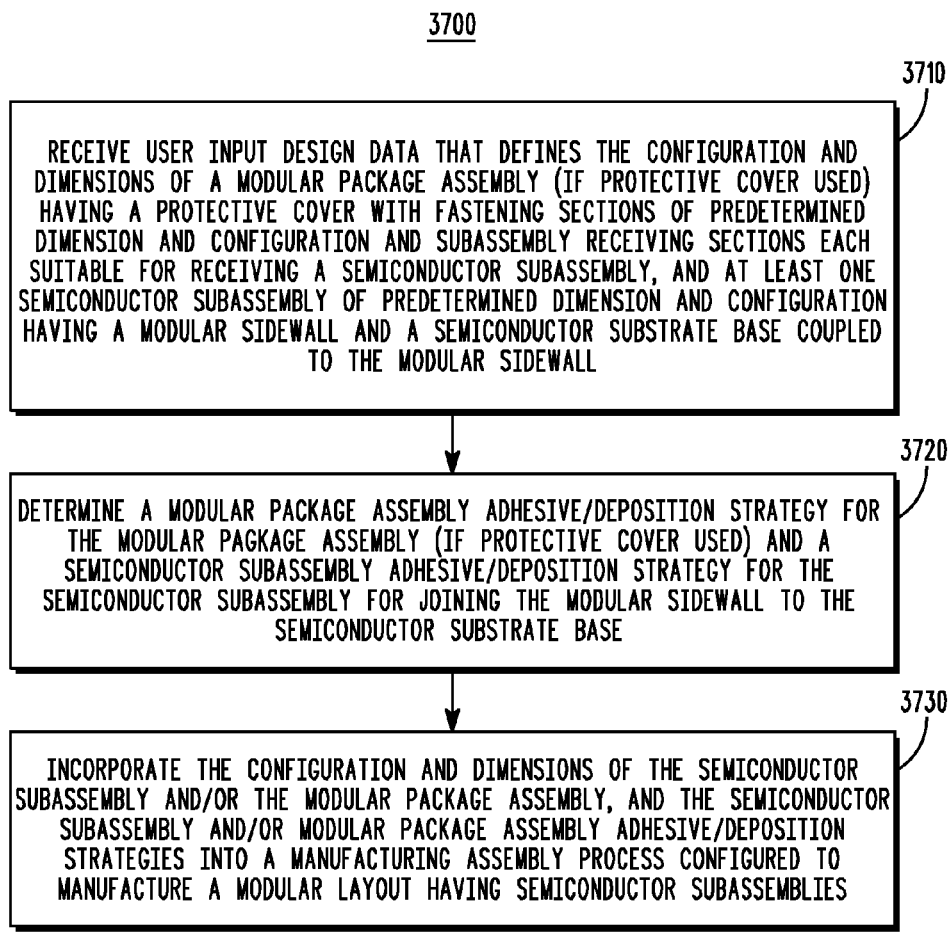
FIGS. 37-40 are flowcharts that illustrates design and manufacture of a protected package assembly having semiconductor substrate base element(s), in accordance with various representative embodiments.

With respect to a method of design using the semiconductor substrate base element, reference is made to flow 3700 of FIG. 37. At Block 3710, user input design data that defines the configuration and dimensions of: a modular package assembly (if protective cover used) having a protective cover with fastening sections of predetermined dimension and configuration and subassembly receiving sections each suitable for receiving a semiconductor subassembly, and at least one semiconductor subassembly of predetermined dimension and configuration having a modular sidewall and a semiconductor substrate base coupled to the modular sidewall is received. Next, at Block 3720, a modular package assembly adhesive/deposition strategy for the modular package assembly (if protective cover used) and a semiconductor subassembly adhesive/deposition strategy for the semiconductor subassembly for joining the modular sidewall to the semiconductor substrate base is determined. Next, at Block 3730, the configuration and dimensions of the semiconductor subassembly and/or the modular package assembly, and the semiconductor subassembly and/or modular package assembly adhesive/deposition strategies are incorporated into a manufacturing assembly process configured to manufacture a modular layout having semiconductor subassemblies.

Figure 38:
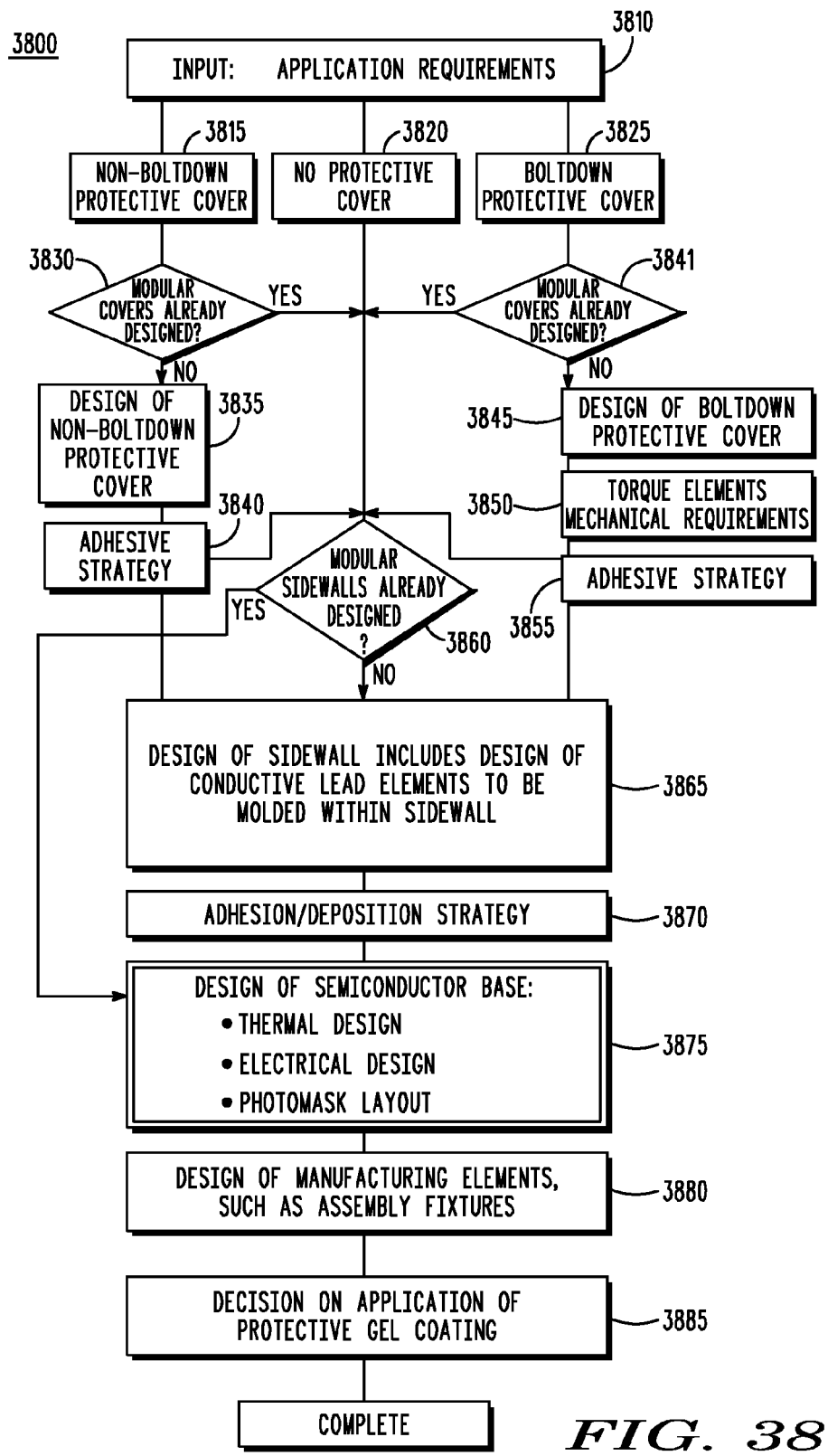

An implementation of the design using a semiconductor subassembly with a semiconductor substrate base element, which may or may not employ a protective modular package cover, is illustrated in flow 3800 of FIG. 38. A user inputs application or design requirements at Block 3810, including whether a non-boltdown protective cover, a boltdown protective cover, or no cover/lid is to be used. If a cover is to be used, then the design process next inquires as to whether the desired modular cover has been designed, at Decision Block 3830 (for the non-boltdown protective cover branch at 3815) and Decision Block 3841 (for the boltdown protective cover branch at 3825). For a non-boltdown protective cover, a design is received at Block 3835 and the adhesive strategy defined at Block 3840. For a protective cover, a design is received at Block 3845, torque element mechanical requirements are received at Block 3850, and the adhesive strategy defined at Block 38550.

Next, the flow considers whether the modular sidewalls are designed, at Decision Block 3860. If no, then the design of the modular sidewall element includes design of conductive lead elements to be molded within the sidewall, at Block 3865. An adhesion/deposition strategy is defined at Block 3870. The semiconductor substrate base element is designed at Block 3875, with user defined specifications with regard to thermal design, electrical design and photomask layout received. At Block 3880, manufacturing elements, such as assembly fixtures, are designed. At Block 3885, a decision about whether protective gel is to be applied is taken.

A user/designer may make use of software modeling tools, including two- and three-dimensional CAD tools like Autodesk, to design through user input design data provided to such software tools modular package assemblies of different configurations and dimensions.

Figure 39:
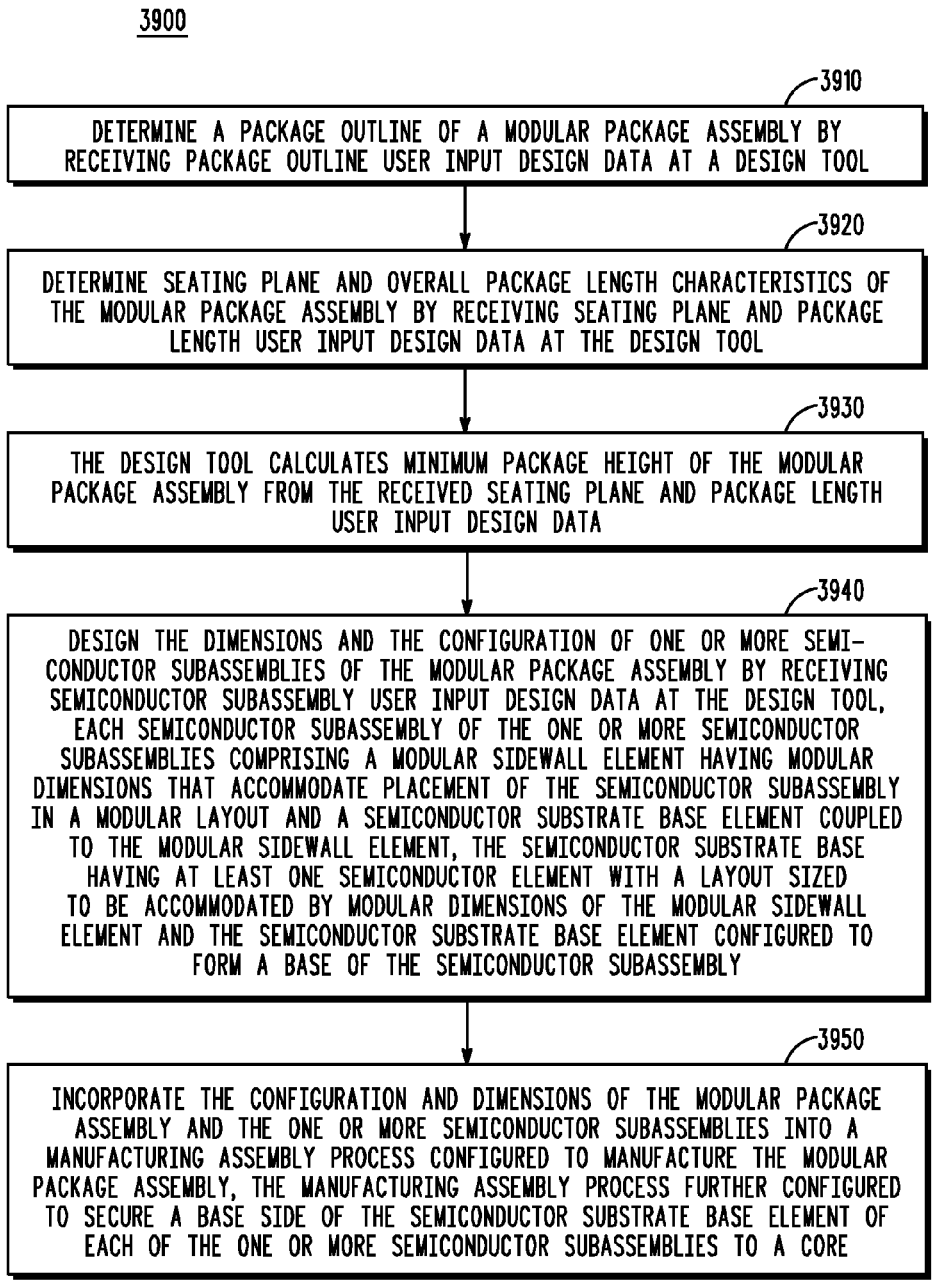

Further with regard to modular design, reference is made to flow 3900 FIG. 39 in which a modular design using semiconductor subassemblies, though not necessarily any protective cover or lid, is shown. At Block 3910, a package outline of a modular package assembly is determined by receiving package outline user input design data at a design tool. The seating plane and overall package length (L) characteristics of the modular package assembly is determined at Block 3920 by receiving seating plane and package length design data at a design tool, and the minimum package height (H) of the modular package assembly is calculated from the overall package length of the modular package assembly contained in the received seating plane and package length user input design data, at Block 3930. A guideline for this calculation can be H≥0.2 L, for example. This equation can be modified according to the final formulation of molded materials and epoxy adhesives, if desired.

At Block 3940, dimensions and configurations of one or more semiconductor subassemblies of the modular package assembly are designed using subassembly user input design data provided to the design tool. As previously shown, each semiconductor subassembly of one or more semiconductor subassemblies comprises a semiconductor substrate base and a modular sidewall element coupled to the semiconductor substrate base element. The semiconductor substrate base element has one or more semiconductor elements with a layout sized to be accommodated by modular dimensions of the modular sidewall element and the semiconductor substrate base element configured to form a base of the semiconductor assembly.

Designing the one or more subassemblies may include designing the semiconductor substrate base element of the one or more subassemblies having an electrical conductivity characteristic and a thermal conductivity characteristic; determining the dimensions of the semiconductor substrate base element taking into account the electrical conductivity characteristic and the thermal conductivity characteristic of the designed semiconductor substrate base element; and designing the sidewall element that is coupled to the semiconductor substrate base element taking into account electrical conductivity characteristic of the base element, the sidewall element comprising a leadframe element that is electrically coupled to the semiconductor devices or elements of the semiconductor substrate base element.

The electrical conductivity characteristic of the semiconductor substrate base element is either non-isolated or isolated. The thermal conductivity characteristic may be a thermal conductivity rating of the semiconductor substrate base element.

If needed, at Block 3940 one or more injection molded sidewalls are designed, the one or more injection molded sidewalls configured to receive one or more semiconductor subassemblies. As previously indicated, the modular sidewall element may be an injection molded sidewall. Moreover, the modular sidewall element may be a ringframe layer of the one or more semiconductor subassemblies as shown in several of the drawings.

At Block 3950, the configuration and dimensions of the modular package assembly and the one or more semiconductor subassemblies are incorporated into a manufacturing assembly process configured to manufacture the modular package assembly. This may include incorporating the joining steps, including bonding, into an manufacturing assembly line to prepare for manufacturing fixture design changes or for the design of new fixtures if needed to accommodate joining together the mechanical layers of the desired assembly. Additionally, the manufacturing assembly process will be configured to secure the base side of semiconductor subassemblies to a core.

Once the modular portions of a modular package assembly have been designed, as shown in FIG. 39, a user may again make use of software modeling tools, including two- and three-dimensional CAD tools like Autodesk, can design through user input design data provided to such software tools modular package assemblies of different configurations and dimensions, all making use of previously designed modules, such as the fastening sections and the subassembly receiving sections of the assembly, if desired.

Figure 40A:
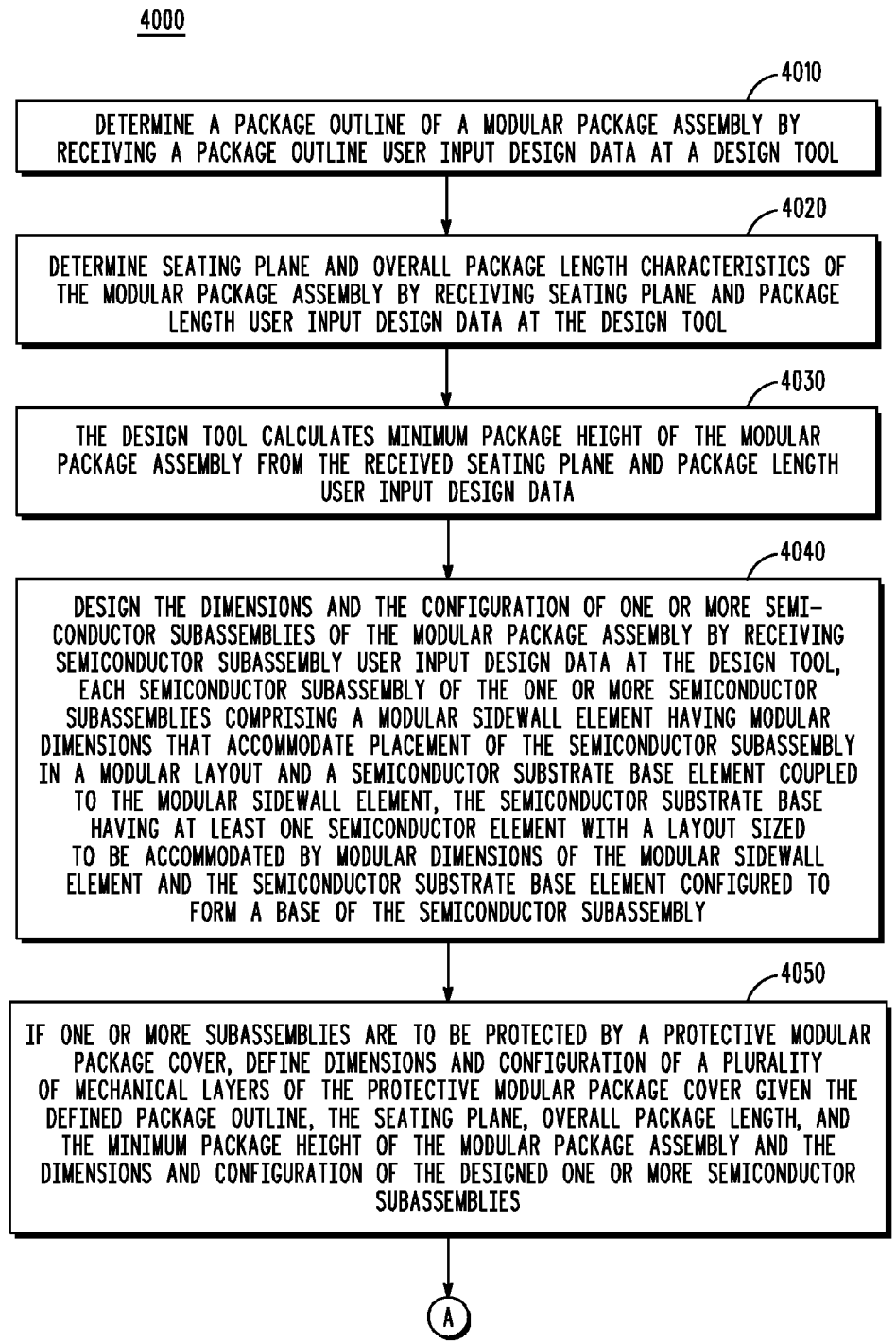
Figure 40B:
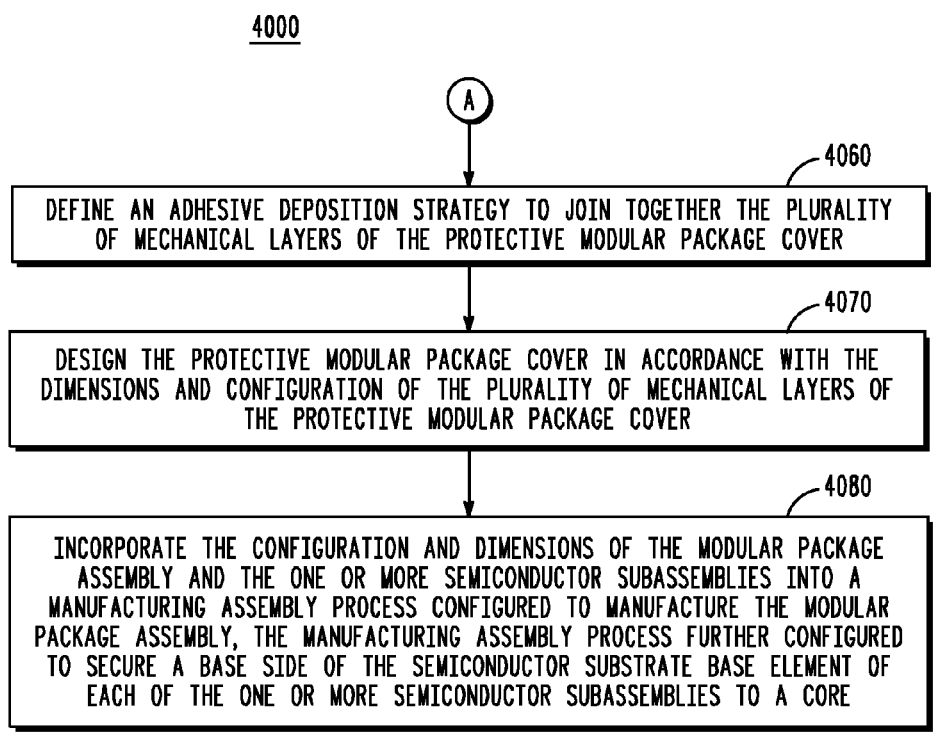

Referring now to flow 4000 of FIG. 40, a modular design process in which semiconductor subassemblie(s) housed in a protective modular package cover are to be used, is shown. At Block 4010, a package outline of a modular package assembly is determined by receiving package outline user input design data at a design tool. The seating plane and overall package length (L) characteristics of the modular package assembly is determined at Block 4020 by receiving seating plane and package length design data at a design tool, and the minimum package height (H) of the modular package assembly is calculated from the overall package length of the modular package assembly contained in the received seating plane and package length user input design data, at Block 4030. A guideline for this calculation can be H≥0.2 L, for example. This equation can be modified according to the final formulation of molded materials and epoxy adhesives, if desired.

At Block 4040, dimensions and configurations of one or more semiconductor subassemblies of the modular package assembly are designed using subassembly user input design data provided to the design tool. As previously shown, each semiconductor subassembly of one or more semiconductor subassemblies comprises a semiconductor substrate base and a modular sidewall element coupled to the semiconductor substrate base element. The semiconductor substrate base element has one or more semiconductor elements with a layout sized to be accommodated by modular dimensions of the modular sidewall element and the semiconductor substrate base element configured to form a base of the semiconductor assembly.

Designing the one or more subassemblies may include designing the semiconductor substrate base element of the one or more subassemblies having an electrical conductivity characteristic and a thermal conductivity characteristic; determining the dimensions of the semiconductor substrate base element taking into account the electrical conductivity characteristic and the thermal conductivity characteristic of the designed semiconductor substrate base element; and designing the sidewall element that is coupled to the semiconductor substrate base element taking into account the electrical conductivity characteristic of the base element, the sidewall element comprising a leadframe element that is electrically coupled to the semiconductor devices or elements of the semiconductor substrate base element.

The electrical conductivity characteristic of the semiconductor substrate base element is either non-isolated or isolated. The thermal conductivity characteristic may be a thermal conductivity rating of the semiconductor substrate base element.

If needed, at Block 4040 one or more injection molded sidewalls are designed, the one or more injection molded sidewalls configured to receive one or more semiconductor subassemblies. As previously indicated, the modular sidewall element may be an injection molded sidewall. Moreover, the modular sidewall element may be a ringframe layer of the one or more semiconductor subassemblies as shown in several of the drawings.

Next at Block 4050, if one or more subassemblies are to be protected by a protective modular package cover, dimensions and configuration of a plurality of mechanical layers of the protective modular package cover given the defined package outline, the seating plane, overall package length, the minimum package height of the modular package assembly, and the designed semiconductor subassemblies are defined. This may comprise partitioning the desired assembly into multiple volumes corresponding to the mechanical layers; in the previous example, by way of example and not limitation, this may include three volumes: a fastening element, a subassembly support element having one or more subassembly receiving sections of defined configuration and dimension with each subassembly receiving section having a cross member, and an electrical connections element of the protective modular package cover. The fastening element includes the lid with fastening or bolting features in place of a flange and include the cover (lid). The subassembly support element provides semiconductor device support and may be an air cavity configured to encapsulate a chip-and-wire assembly, in the case of an air cavity subassembly receiving section, or a precision-locating pocket that encapsulated an over-molded subassembly. The electrical connections element consists of wirebond regions or openings through which leads may pass. In the case of a sidewall formed, for example, the electrical connections may be injection molded into an insulating polymer sidewall with layer thickness of approximately 0.3H.

Next, at Block 4060, an adhesive deposition strategy to join together the plurality of mechanical layers of the protective modular package cover is designed. The adhesive deposition strategy is chosen to permanently join together the various mechanical layers of the assembly along bond lines. The bond line features are accordingly incorporated into the mold design. The bond lines may be adjusted as needed to maximize moisture path length and to maximize surface area at the joints between the mechanical layers.

At Block 4070, the protective modular package cover is designed in accordance with the dimensions and configuration of the plurality of mechanical layers as set forth above.

At Block 4080, the configuration and dimensions of the modular package assembly and the one or more semiconductor subassemblies into a manufacturing assembly process configured to manufacture the modular package assembly. The manufacturing assembly process will take into account securing the base side of any semiconductor subassembly used to a core. The adhesive deposition strategy may further be incorporated into a manufacturing assembly process configured to manufacture the modular package assembly. This may include incorporating the joining steps, including bonding, into an manufacturing assembly line to prepare for manufacturing fixture design changes or for the design of new fixtures if needed to accommodate joining together the mechanical layers of the desired assembly.

Once the modular portions of a modular package assembly have been designed, as shown in FIGS. 39 and 40, a user may again make use of software modeling tools, including two- and three-dimensional CAD tools like Autodesk, can design through user input design data provided to such software tools modular package assemblies of different configurations and dimensions, all making use of previously designed modules, such as the fastening sections and the subassembly receiving sections of the assembly.

Software and/or firmware embodiments may be implemented using a programmed processor executing programming instructions that in certain instances are broadly described above in flow chart form that can be stored on any suitable electronic or computer readable storage medium, such as, for instance, disc storage, Read Only Memory (ROM) devices, Random Access Memory (RAM) devices, network memory devices, optical storage elements, magnetic storage elements, magneto-optical storage elements, flash memory, core memory and/or the equivalent volatile and non-volatile storage technologies, and/or can be transmitted over any suitable electronic communication medium. However, those skilled in the art will appreciate, upon consideration of the present teaching, that the processes described above can be implemented in any number of variations and in many suitable programming languages without departing from embodiments described herein. For example, the order of certain operations carried out can often be varied, additional operations can be added or operations can be deleted without departing from certain embodiments disclosed herein. Error trapping can be added and/or enhanced and variations can be made in user interface and information presentation without departing from certain embodiments described herein. Such variations are contemplated and considered equivalent.

The representative embodiments, which have been described in detail herein, have been presented by way of example and not by way of limitation. It will be understood by those skilled in the art that various changes may be made in the form and details of the described embodiments resulting in equivalent embodiments that remain within the scope of the appended claims.

What is claimed is:

1. A semiconductor subassembly, comprising:
 a modular sidewall element having modular dimensions that accommodates placement of the semiconductor subassembly in a modular layout; and
 a semiconductor substrate base element coupled to the modular sidewall element, the semiconductor substrate base element having at least one semiconductor element with a layout sized to be accommodated by modular dimensions of the modular sidewall element and the semiconductor substrate base element configured to form a base of the semiconductor subassembly.

2. The semiconductor subassembly of claim 1, wherein the modular dimensions of the modular sidewall element accommodates placement of the semiconductor subassembly in a modular package assembly.

3. The semiconductor subassembly of claim 1, wherein the at least one semiconductor element comprises one or more laterally diffused metal oxide field effect transistors.

4. The semiconductor subassembly of claim 1, wherein the semiconductor substrate base element has an electrical conductivity characteristic and a thermal conductivity characteristic.

5. The semiconductor subassembly of claim 4, wherein the electrical conductivity characteristic of a base surface of the semiconductor substrate base element is either non-isolated or isolated.

6. The semiconductor subassembly of claim 4, wherein the thermal conductivity characteristic is a thermal conductivity rating of the semiconductor substrate base element.

7. The semiconductor subassembly of claim 1, wherein the semiconductor subassembly is configured to be attached to a core by a boltdown lid coupled to the semiconductor subassembly.

8. The semiconductor subassembly of claim 1, wherein the semiconductor subassembly is configured to be attached to a core by coupling a base surface of the semiconductor substrate base element to the core.

9. The semiconductor subassembly of claim 8, wherein the semiconductor subassembly further comprises a gel that fills a cavity above the semiconductor substrate base element formed by the coupling of the semiconductor substrate base element to the modular sidewall element.

10. The semiconductor subassembly of claim 1, wherein the semiconductor subassembly is configured to be attached to a core by a protective modular package cover, the protective modular package cover comprising:
    first and second fastening sections located at opposing first and second ends of the protective modular package cover, having one or more torque elements disposed on one or more of the first and second ends, and configured to fasten the protective modular package cover to the core; and
    one or more subassembly receiving sections disposed between the first and second fastening sections and each subassembly receiving section of the one or more subassembly receiving sections adapted to receive one or more semiconductor subassemblies, wherein each subassembly receiving section of the one or more subassembly receiving sections comprises a cross member formed along the underside of the protective modular package cover.

11. The semiconductor subassembly of claim 10, wherein the one or more subassembly receiving sections comprise one or more precision locating pockets of the protective modular package cover configured to receive one or more overmolded semiconductor subassemblies.

12. The semiconductor subassembly of claim 10, further comprising:
    an adhesive layer configured to affix the one or more semiconductor subassemblies to respective subassembly receiving sections of the one or more subassembly receiving sections,
    wherein the one or more torque elements of the first and second fastening sections are configured to transfer a downward clamping force generated at the first or second fastening elements to a top surface of one or more semiconductor subassemblies disposed in the one or more subassembly receiving sections via the cross member of each of the one or more subassembly receiving sections.

13. The semiconductor subassembly of claim 12, wherein activation of the one or more torque elements transfers the downward clamping force to a central portion of the top of the protective modular package cover and generates a distributed downward clamping force that is distributed by the cross member of each of the one or more subassembly receiving sections from the central portion of the top of the protective modular package cover to the top surface of the one or more subassemblies disposed in the one or more subassembly receiving sections.

14. The semiconductor subassembly of claim 12, wherein sufficient activation of the one or more torque elements mounts the protective modular package cover to the heat sink.

15. The semiconductor subassembly of claim 12, wherein the distributed downward clamping force is generated by activation of the one or more torque elements by insertion of a fastener in a mounting hole of the first or second fastening sections and engagement of the one or more torque elements by the fastener.

16. The semiconductor subassembly of claim 12, wherein the cross member of each subassembly receiving section further comprises a lateral cross member and a transverse cross member formed along the underside of the protective modular package cover.

17. The semiconductor subassembly of claim 12, wherein the cross member comprises a lateral cross member.

18. The semiconductor subassembly of claim 17, wherein the lateral cross member is formed by two or more lateral cross members.

19. The semiconductor subassembly of claim 12, wherein two or more subassembly receiving sections of the protective modular package cover are separated by one or more internal support members.

20. The semiconductor subassembly of claim 12, wherein the one or more subassembly receiving sections are formed within an underside of the protective modular package cover.

21. The semiconductor subassembly of claim 12, wherein each subassembly receiving sections of the protective modular package cover is separated by first and second skirt elements formed along first and second sides of the protective modular package cover.

22. The semiconductor subassembly of claim 21, wherein the adhesive layer is formed contiguous the first and second skirt elements.

23. The semiconductor subassembly of claim 12, wherein the first fastening section comprises:
    a first foot located on a bottom surface of the first fastening section at the first end of the protective modular package cover and configured to make contact with the heat sink;
    a first torque element disposed on the first foot adjacent the outer edge of the first end of the protective modular package cover; and
    a first mounting hole that extends through the first fastening section from a top surface of the first fastening section to the bottom surface of the first fastening section, is coupled to the first torque element, and is configured to receive a first fastener therein; and
    the second fastening section comprises:
    a second foot located on a bottom surface of the second fastening section at the second end of the protective modular package cover and configured to make contact with the heat sink;

a second torque element disposed on the second foot adjacent the outer edge of the second end of the protective modular package cover; and a second mounting hole that extends through the second fastening section from a top surface of the second fastening section to the bottom surface of the second fastening section, is coupled to the second torque element, and is configured to receive a second fastener therein.

24. The semiconductor subassembly of claim 12, wherein the sidewall element joined to the semiconductor substrate base element creates an air cavity that is sealed by receipt of the subassembly by a subassembly receiving section of the protective modular package cover and securing the protective modular package cover to a modular package assembly.

25. The semiconductor subassembly of claim 24, wherein the sidewall element is a leaded sidewall.

26. The semiconductor subassembly of claim 1, wherein the at least one semiconductor element comprises a silicon wafer having a plurality of semiconductor structures.

27. The semiconductor subassembly of claim 1, wherein the modular sidewall element is an injection molded sidewall.

28. The semiconductor subassembly of claim 1, wherein the modular sidewall element is a ringframe layer of the semiconductor subassembly.

29. The semiconductor subassembly of claim 1, wherein the semiconductor subassembly is configured to be attached to a core, the core comprising a heat sink, heat sinking core, heat spreading core, a thermal base, or base plate.

* * * * *